(12) United States Patent
Yamaguchi et al.

(10) Patent No.: US 7,303,950 B2
(45) Date of Patent: Dec. 4, 2007

(54) SEMICONDUCTOR DEVICE, METHOD OF MANUFACTURING SAME AND METHOD OF DESIGNING SAME

(75) Inventors: Yasuo Yamaguchi, Tokyo (JP); Shigeto Maegawa, Tokyo (JP); Takashi Ipposhi, Tokyo (JP); Toshiaki Iwamatsu, Tokyo (JP); Shigenobu Maeda, Tokyo (JP); Yuuichi Hirano, Tokyo (JP); Takuji Matsumoto, Tokyo (JP); Shoichi Miyamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 400 days.

(21) Appl. No.: 11/034,938

(22) Filed: Jan. 14, 2005

(65) Prior Publication Data

US 2005/0156242 A1    Jul. 21, 2005

Related U.S. Application Data

(63) Continuation of application No. 09/466,934, filed on Dec. 20, 1999, now Pat. No. 6,953,979.

(30) Foreign Application Priority Data

Dec. 24, 1998  (JP)  ............................. P10-367265
Jun. 23, 1999  (JP)  ............................. P11-177091

(51) Int. Cl.
*H01L 21/8238* (2006.01)
(52) U.S. Cl. .................. 438/199; 438/257; 438/258; 257/347; 257/315; 257/288; 257/350
(58) Field of Classification Search ............ 257/315, 257/288, 350, 347; 438/199, 257, 258
See application file for complete search history.

(56) References Cited

U.S. PATENT DOCUMENTS 5,125,007 A   6/1992   Yamaguchi et al.

(Continued)

FOREIGN PATENT DOCUMENTS

EP           0 709 893 A2   5/1996

(Continued)

OTHER PUBLICATIONS

W. Chen, et al., Symposium on VLSI Technology Digest of Technical Papers, pp. 92-93, "Suppression of the SOI Floating-Body Effects by Linked-Body Device Structure," 1996.

(Continued)

*Primary Examiner*—Michael Lebentritt
*Assistant Examiner*—Abdulfattah Mustapha
(74) *Attorney, Agent, or Firm*—Oblon, Spivak, McClelland, Maier & Neustadt, P.C.

(57) ABSTRACT

A partial oxide film (31) with well regions formed therebeneath isolates transistor formation regions in an SOI layer (3) from each other. A p-type well region (11) is formed beneath part of the partial oxide film (31) which isolates NMOS transistors from each other, and an n-type well region (12) is formed beneath part of the partial oxide film (31) which isolates PMOS transistors from each other. The p-type well region (11) and the n-type well region (12) are formed in side-by-side relation beneath part of the partial oxide film (31) which provides isolation between the NMOS and PMOS transistors. A body region is in contact with the well region (11) adjacent thereto. An interconnect layer formed on an interlayer insulation film (4) is electrically connected to the body region through a body contact provided in the interlayer insulation film (4). A semiconductor device having an SOI structure reduces a floating-substrate effect.

8 Claims, 59 Drawing Sheets

U.S. PATENT DOCUMENTS

| | | | |
|---|---|---|---|
| 5,355,012 A | 10/1994 | Yamaguchi et al. | |
| 5,463,238 A | 10/1995 | Takahashi et al. | |
| 5,621,239 A * | 4/1997 | Horie et al. | 257/499 |
| 5,652,454 A | 7/1997 | Iwamatsu et al. | |
| 5,767,549 A | 6/1998 | Chen et al. | |
| 5,808,346 A | 9/1998 | Ueda | |
| 5,877,049 A * | 3/1999 | Liu et al. | 438/224 |
| 5,889,293 A | 3/1999 | Rutten et al. | |
| 5,985,733 A | 11/1999 | Koh et al. | |
| 6,100,570 A * | 8/2000 | Saito | 257/446 |

FOREIGN PATENT DOCUMENTS

| | | |
|---|---|---|
| EP | 0 725 407 A1 | 8/1996 |
| EP | 0962988 A2 | 8/1999 |
| GB | 1 339 095 | 11/1973 |
| JP | 57-102067 | 6/1982 |
| JP | 58-124243 | 7/1983 |
| JP | 11-340465 | 12/1999 |
| KR | 1995-0007575 | 7/1995 |
| KR | 1998-005383 | 3/1998 |
| KR | 1998-081093 | 11/1998 |
| KR | 1998-083989 | 12/1998 |
| KR | 10-0233286 | 12/1999 |

OTHER PUBLICATIONS

T. Hashmoto, et al., pp. 209-212, IEDM, "A 0.2-μm Bipolar-CMOS Technology on Bonded SOI with Copper Metallization for Ultra High-Speed Processors," 1998.

K. Mistry, et al., p. 583, IEDM, "A 2.0V, 0.35 μm Partially Depleted SOI-CMOS Technology,"1997.

J.A. Mandelman, et al., pp. 164-165, Proceedings 1997 IEEE International SOI Conference, "SOI MOSFET Mismatch Due to Floating-Body Effects," Oct. 1997.

H. Lee, et al., pp. 63-64, Proceedings 1998 IEEE International SOI Conference, "A New SOI Structure for Mixed Mode IC'S and its Body-Related Characteristics," Oct. 1998.

R.L. Woodruff et al., "A Differential-Height-MESA Buried Tie SOI Process" (1991) pp. 148-149.

* cited by examiner

SEMICONDUCTOR DEVICE, METHOD OF MANUFACTURING SAME AND METHOD OF DESIGNING SAME

CROSS-REFERENCE TO RELATED APPLICATIONS

This application is a continuation of application Ser. No. 09/466,934, filed on Dec. 20, 1999, now U.S. Pat. No. 6,953,979, the contents of which are incorporated herein by reference.

BACKGROUND OF THE INVENTION

1. Field of the Invention

The present invention relates to a semiconductor device having an SOI structure.

2. Description of the Background Art

Referring to FIG. 102, a background art semiconductor device having an SOI structure comprised of a silicon substrate 1, a buried oxide film 2 and an SOI (Silicon On Insulator) layer 3 has been constructed such that a full oxide film 32 completely isolates transistor formation regions in the SOI layer 3 from each other. For example, a single NMOS transistor formed in an NMOS transistor formation region has been completely isolated from other transistors by the full oxide film 32. In the semiconductor device shown in FIG. 102, an interlayer insulation film 4 covers the SOI layer 3.

As shown in FIG. 102, the single NMOS transistor completely isolated from other transistors by the full oxide film 32 comprises a drain region 5, a source region 6 and a channel formation region 7 which are formed in the SOI layer 3, a gate oxide film 8 formed on the channel formation region 7, and a gate electrode 9 formed on the gate oxide film 8. An interconnect layer 22 formed on the interlayer insulation film 4 is electrically connected through a contact 21 formed in the interlayer insulation film 4 to the drain region 5 or the source region 6.

Thus, the background art semiconductor device having the SOI structure in which devices (transistors) are completely isolated from each other in the SOI layer is constructed to provide complete isolation between PMOS and NMOS transistors to prevent latchup in principle.

Therefore, the manufacture of a semiconductor device having the SOI structure and including CMOS transistors has been advantageous in that a minimum isolation width determined by the micromachining technique may be used to reduce the area of a chip. Such a semiconductor device having the SOI structure, however, presents various drawbacks resulting from a so-called floating-substrate effect, such as a kink effect caused by carriers (holes for an NMOS transistor) generated by impact ionization and stored in the channel formation region, the degradation in operation breakdown voltage, and the frequency-dependence of delay time due to the unstabilized electric potential of the channel formation region.

SUMMARY OF THE INVENTION

A first aspect of the present invention is intended for a semiconductor device having an SOI structure including a semiconductor substrate, a buried insulation layer and an SOI layer. According to the present invention, the semiconductor device comprises: a plurality of device formation regions in which predetermined devices are to be formed respectively, the plurality of device formation regions being provided in the SOI layer; at least one isolation region provided in the SOI layer for insulatively isolating the plurality of device formation regions from each other; and a body region provided in the SOI layer and capable of externally fixing electric potential, wherein at least part of the at least one isolation region includes a partial isolation region having a partial insulation region formed in an upper part thereof and a semiconductor region formed in a lower part thereof, the semiconductor region serving as part of the SOI layer and being formed in contact with at least one of the plurality of device formation regions and the body region.

Preferably, according to a second aspect of the present invention, in the semiconductor device of the first aspect, the plurality of device formation regions include a plurality of first device formation regions for a first device, and a plurality of second device formation regions for a second device; the at least one isolation region further includes a complete isolation region having a complete insulation region extending through the SOI layer; and the partial isolation region includes first and second partial isolation regions. The plurality of first device formation regions are isolated from each other by the first partial isolation region, the plurality of second device formation regions are isolated from each other by the second partial isolation region, and the plurality of first device formation regions and the plurality of second device formation regions are isolated from each other by the complete isolation region.

Preferably, according to a third aspect of the present invention, in the semiconductor device of the first aspect, the plurality of device formation regions include a plurality of device formation regions for a first circuit and a plurality of device formation regions for a second circuit. The plurality of device formation regions for the first circuit are isolated from each other by a complete isolation region extending through the SOI layer, and the plurality of device formation regions for the second circuit are isolated from each other by the partial isolation region.

Preferably, according to a fourth aspect of the present invention, in the semiconductor device of the third aspect, the SOI layer includes first and second partial SOI layers, the first partial SOI layer being less in thickness than the second partial SOI layer. The plurality of device formation regions for the first circuit are formed in the first partial SOI layer, and the plurality of device formation regions for the second circuit are formed in the second partial SOI layer.

Preferably, according to a fifth aspect of the present invention, in the semiconductor device of the first aspect, the plurality of device formation regions include a device formation region for a predetermined circuit, and a device formation region for a circuit other than the predetermined circuit. The device formation region for the predetermined circuit and the device formation region for the circuit other than the predetermined circuit are isolated from each other by a complete isolation region extending through the SOI layer.

Preferably, according to a sixth aspect of the present invention, in the semiconductor device of the first aspect, a device formed in a device formation region isolated by the partial isolation region among the plurality of device formation regions has an active region formed at a depth from a surface of the SOI layer shallower than the depth at which the partial isolation region is formed.

Preferably, according to a seventh aspect of the present invention, in the semiconductor device of the first aspect, the semiconductor region includes a polysilicon region.

Preferably, according to an eighth aspect of the present invention, in the semiconductor device of the first aspect, the partial insulation region includes a low dielectric constant film having a dielectric constant lower than that of the buried insulation layer.

Preferably, according to a ninth aspect of the present invention, in the semiconductor device of the first aspect, the partial insulation region includes a partial insulation film provided at least at a side surface, and a low dielectric constant film provided in other regions and having a dielectric constant lower than that of the partial insulation film.

Preferably, according to a tenth aspect of the present invention, in the semiconductor device of the first aspect, the at least one isolation region includes a plurality of isolation regions, and at least one of the plurality of isolation regions has a predetermined width and extends substantially perpendicularly to a surface of the semiconductor substrate.

An eleventh aspect of the present invention is intended for a semiconductor device having an SOI structure including a semiconductor substrate, a buried insulation layer and an SOI layer. According to the present invention, the semiconductor device comprises: a plurality of device formation regions in which predetermined devices are to be formed respectively, the plurality of device formation regions being provided in the SOI layer; at least one isolation region provided in the SOI layer for insulatively isolating the plurality of device formation regions from each other; and a body region capable of externally fixing electric potential, wherein the body region is formed in contact with one of top and bottom surfaces of at least one of the plurality of device formation regions.

Preferably, according to a twelfth aspect of the present invention, in the semiconductor device of the eleventh aspect, the body region is formed in an upper portion of the buried insulation layer and in contact with the bottom surface of the at least one of the plurality of device formation regions.

Preferably, according to a thirteenth aspect of the present invention, in the semiconductor device of the eleventh aspect, the body region extends through the buried insulation layer and is in contact with the bottom surface of the at least one of the plurality of device formation regions.

Preferably, according to a fourteenth aspect of the present invention, in the semiconductor device of the eleventh aspect, the body region is formed on the at least one of the plurality of device formation regions and in contact with the top surface of the at least one of the plurality of device formation regions.

Preferably, according to a fifteenth aspect of the present invention, in the semiconductor device of the first aspect, at least part of the at least one isolation region further comprises a combined isolation region including the partial isolation region and a complete insulation region extending through the SOI layer, the partial isolation region and the complete insulation region being continuous with each other.

Preferably, according to a sixteenth aspect of the present invention, in the semiconductor device of the fifteenth aspect, the partial isolation region has a flat and even top surface.

Preferably, according to a seventeenth aspect of the present invention, in the semiconductor device of the fifteenth aspect, the semiconductor region of the combined isolation region has a thickness which is not greater than one-half the thickness of the SOI layer.

Preferably, according to an eighteenth aspect of the present invention, in the semiconductor device of the fifteenth aspect, the complete insulation region of the combined isolation region has a width which is not greater than one-half the width of the combined isolation region.

Preferably, according to a nineteenth aspect of the present invention, in the semiconductor device of the first aspect, the at least one isolation region further includes a complete isolation region having a complete insulation region extending through the SOI layer. The plurality of device formation regions include an input/output NMOS transistor formation region and an input/output PMOS transistor formation region which are disposed adjacent to each other. The complete isolation region is formed at least in the vicinity of a boundary between the input/output NMOS transistor formation region and the input/output PMOS transistor formation region.

Preferably, according to a twentieth aspect of the present invention, in the semiconductor device of the nineteenth aspect, the plurality of device formation regions further include an internal circuit formation region disposed adjacent to one of the input/output NMOS transistor formation region and the input/output PMOS transistor formation region. The complete isolation region is further formed in the vicinity of a boundary between the internal circuit formation region and one of the input/output NMOS transistor formation region and the input/output PMOS transistor formation region which is disposed adjacent to the internal circuit formation region.

Preferably, according to a twenty-first aspect of the present invention, in the semiconductor device of the first aspect, the at least one isolation region further includes a complete isolation region having a complete insulation region extending through the SOI layer. The plurality of device formation regions include an NMOS transistor formation region and a PMOS transistor formation region which are disposed adjacent to each other. The complete isolation region is formed in a complete isolation region formation location situated within the PMOS transistor formation region in the vicinity of a boundary between the NMOS transistor formation region and the PMOS transistor formation region. The partial isolation region surrounds the NMOS transistor formation region and the PMOS transistor formation region except in the complete isolation region formation location.

Preferably, according to a twenty-second aspect of the present invention, in the semiconductor device of the first aspect, the at least one isolation region further includes a complete isolation region having a complete insulation region extending through the SOI layer. The plurality of device formation regions include a MOS transistor formation region. The partial isolation region is formed in a partial isolation region formation location situated at least in the vicinity of a first end of a gate electrode of the MOS transistor formation region. The complete insulation region surrounds the MOS transistor formation region except in the partial isolation region formation location.

Preferably, according to a twenty-third aspect of the present invention, in the semiconductor device of the first aspect, the plurality of device formation regions include a transistor formation region of a first conductivity type. The partial isolation region includes a peripheral partial isolation region surrounding the transistor formation region. The body region includes a peripheral body region of a second conductivity type surrounding the peripheral partial isolation region.

Preferably, according to a twenty-fourth aspect of the present invention, in the semiconductor device of the first aspect, the plurality of device formation regions include a MOS transistor formation region. The body region includes an adjacent-to-source body region disposed adjacent to a source region of the MOS transistor formation region. The semiconductor device further comprises an electric potential setting region commonly connected to the source region and the adjacent-to-source body region.

Preferably, according to a twenty-fifth aspect of the present invention, in the semiconductor device of the first aspect, the semiconductor region of the partial isolation region includes first and second partial semiconductor regions. The impurity concentration of the first partial semiconductor region is higher than that of the second partial semiconductor region.

Preferably, according to a twenty-sixth aspect of the present invention, in the semiconductor device of the twenty-fifth aspect, the first partial semiconductor region includes a peripheral region disposed adjacent to one of the plurality of device formation regions which is to be isolated, and the second partial semiconductor region includes a central region corresponding to part of the semiconductor region which is other than the peripheral region.

Preferably, according to a twenty-seventh aspect of the present invention, in the semiconductor device of the twenty-fifth aspect, the plurality of device formation regions include a MOS transistor formation region. The partial isolation region surrounds the MOS transistor formation region. The first partial semiconductor region includes a region adjacent to a gate electrode of the MOS transistor formation region, and the second partial semiconductor region includes a region adjacent to a drain/source of the MOS transistor formation region.

Preferably, according to a twenty-eighth aspect of the present invention, in the semiconductor device of the first aspect, the plurality of device formation regions include a MOS transistor formation region of a first conductivity type, and the semiconductor region of the partial isolation region includes a region of a second conductivity type. A peak of the impurity concentration of the semiconductor region of the partial isolation region is deeper from a surface of the SOI layer than a peak of the impurity concentration of a drain/source region formed in contact with the semiconductor region in the MOS transistor formation region.

Preferably, according to a twenty-ninth aspect of the present invention, in the semiconductor device of the first aspect, the plurality of device formation regions include a MOS transistor formation region. A peak of the impurity concentration of a channel formation region of the MOS transistor formation region is deeper from a surface of the SOI layer than a peak of the impurity concentration of the semiconductor region of the partial isolation region.

Preferably, according to a thirtieth aspect of the present invention, in the semiconductor device of the fifteenth aspect, the semiconductor region of the combined isolation region includes a first partial semiconductor region disposed adjacent to the complete insulation region, and a second partial semiconductor region which is the remainder of the semiconductor region. The impurity concentration of the first partial semiconductor region is higher than that of the second partial semiconductor region.

Preferably, according to a thirty-first aspect of the present invention, in the semiconductor device of the first aspect, the partial isolation region has a surface corner part and a bottom corner part, the bottom corner part having a radius of curvature greater than that of the surface corner part.

Preferably, according to a thirty-second aspect of the present invention, in the semiconductor device of the fifteenth aspect, the partial insulation region of the combined isolation region has a bottom corner part and a stepped part defined between the complete insulation region and the partial insulation region, the stepped part having a radius of curvature less than that of the bottom corner part.

Preferably, according to a thirty-third aspect of the present invention, in the semiconductor device of the first aspect, the at least one isolation region further includes a complete isolation region having a complete insulation region extending through the SOI layer. The semiconductor device further comprises an inductance element formed in an inductance formation region lying in an upper part of the SOI layer, wherein the complete isolation region is formed under the inductance formation region.

Preferably, according to a thirty-fourth aspect of the present invention, in the semiconductor device of the first aspect, the plurality of device formation regions include a MOS transistor formation region, and the body region includes a gate-connected body region electrically connected to a gate electrode of a MOS transistor formed in the MOS transistor formation region. The partial isolation region surrounds the MOS transistor formation region.

Preferably, according to a thirty-fifth aspect of the present invention, in the semiconductor device of the sixth aspect, the semiconductor region includes a region of a first conductivity type, and the active region of the device includes a region of a second conductivity type. The depth of the active region of the device is set so that a depletion layer extending from the active region does not reach the buried insulation layer in a built-in state.

Preferably, according to a thirty-sixth aspect of the present invention, in the semiconductor device of the first aspect, the plurality of device formation regions include a field transistor formation region. A field transistor formed in the field transistor formation region comprises: first and second active regions formed independently of each other; and a gate part formed between the first and second active regions and including a field transistor partial insulation region formed in an upper part thereof and a field transistor semiconductor region formed in a lower part thereof and serving as part of the SOI layer.

A thirty-seventh aspect of the present invention is intended for a semiconductor device having an SOI structure including a semiconductor substrate, a buried insulation layer and an SOI layer. According to the present invention, the semiconductor device comprises: a device formation region in which a predetermined device is to be formed, the device formation region being provided in the SOI layer; and a peripheral isolation region provided in the SOI layer and surrounding the device formation region, the peripheral isolation region including a partial isolation region having a partial insulation region formed in an upper part thereof and a semiconductor region formed in a lower part thereof and serving as part of the SOI layer, wherein the semiconductor region is formed in contact with the device formation region and is floating.

A thirty-eighth aspect of the present invention is intended for a method of manufacturing a semiconductor device. According to the present invention, the method comprises the steps of: (a) providing an SOI substrate having an SOI structure including a semiconductor substrate, a buried insulation layer, and an SOI layer; (b) selectively removing the SOI layer from above a top surface thereof so as not to penetrate the SOI layer, to form a plurality of trenches, whereby regions of the SOI layers which lie between the plurality of trenches serve as a plurality of device formation regions; (c) filling each of the plurality of trenches with an insulation film, the insulation film in at least one of the plurality of trenches and part of the SOI layer which underlies the at least one of the plurality of trenches constituting a partial isolation region; and (d) forming a predetermined device in each of the plurality of device formation regions.

Preferably, according to a thirty-ninth aspect of the present invention, in the method of the thirty-eighth aspect, the plurality of trenches include a first trench and a second trench, and the at least one of the plurality of trenches includes the first trench. The method further comprises the step of (e) further removing the SOI layer from a bottom portion of the second trench to cause the second trench to extend through the SOI layer, the step (e) being performed after the step (b) and before the step (c). The step (c) causes the insulation film in the first trench and part of the SOI layer which underlies the first trench to constitute the partial isolation region, and causes the insulation film in the second trench extending through the SOI layer to constitute a complete isolation region.

Preferably, according to a fortieth aspect of the present invention, in the method of the thirty-ninth aspect, the second trench is greater in width than the first trench, and the step (b) comprises the steps of: (b-1) forming sidewall elements on side surfaces of the first and second trenches, respectively, so as to cover a bottom surface of the first trench and to expose the center of a bottom surface of the second trench; and (b-2) penetrating the SOI layer under the center of the second trench using the sidewall elements as a mask.

Preferably, according to a forty-first aspect of the present invention, the method of the thirty-ninth aspect further comprises the step of (f) introducing an impurity into parts of the SOI layer which underlie the plurality of trenches to form high-concentration regions, the step (f) being performed after the step (b) and before the step (e).

A forty-second aspect of the present invention is intended for a method of manufacturing a semiconductor device. According to the present invention, the method comprises the steps of: (a) providing an SOI substrate having an SOI structure including a semiconductor substrate, a buried insulation layer, and a silicon layer; (b) selectively removing the silicon layer to form a through portion extending through the silicon layer; (c) filling the through portion extending through the silicon layer with a first insulation film so that the first insulation film is raised from a top surface of the silicon layer, and selectively forming a second insulation film on the silicon layer; (d) forming an epitaxially grown layer by upward epitaxial growth from part of the top surface of the silicon layer which is not covered with the second insulation film, the silicon layer and the epitaxially grown layer constituting an SOI layer, the second insulation film and part of the silicon layer which underlies the second insulation film constituting a partial isolation region, the first insulation film constituting a complete isolation region; and (e) forming a predetermined device in each of a plurality of device formation regions which are isolated from each other by one of the partial isolation region and the complete isolation region.

A forty-third aspect of the present invention is intended for a method of manufacturing a semiconductor device. According to the present invention, the method comprises the steps of: (a) providing an SOI substrate having an SOI structure including a semiconductor substrate, a buried insulation layer, and an SOI layer; (b) selectively removing the SOI layer to form a plurality of trenches extending through the SOI layer and including a first trench and a second trench, whereby regions of the SOI layer which lie between the plurality of trenches serve as a plurality of device formation regions; (c) selectively depositing a polysilicon layer on bottom and side surfaces of the first trench; (d) filling the first and second trenches with an insulation film; (e) partially oxidizing the polysilicon layer in the first trench in a direction oriented from an opening of the first trench toward the bottom thereof, the insulation film in the first trench and the polysilicon layer left unoxidized in the first trench constituting a partial isolation region, the insulation film in the second trench constituting a complete isolation region; and (f) forming a predetermined device in each of the plurality of device formation regions.

A forty-fourth aspect of the present invention is intended for a method of manufacturing a semiconductor device. According to the present invention, the method comprises the steps of: (a) providing an SOI substrate having an SOI structure including a semiconductor substrate, a buried insulation layer, and an SOI layer; (b) selectively removing the SOI layer to form a plurality of device formation regions; (c) isotropically etching the buried insulation layer while masking the plurality of device formation regions so that a bottom surface of end portions of at least one of the plurality of device formation regions is exposed and an upper part of the buried insulation layer is removed, thereby to form a hole; (d) filling the hole with a polysilicon layer to form a body region including the polysilicon layer and electrically connected to the bottom surface of the end portions of the at least one of the plurality of device formation regions; (e) insulatively isolating the plurality of device formation regions from each other in the SOI layer; and (f) permitting the body region to externally fix electric potential and forming a predetermined device in each of the plurality of device formation regions.

Preferably, according to a forty-fifth aspect of the present invention, in the method of the forty-fourth aspect, the step (d) comprises the steps of: (d-1) forming an epitaxially grown layer in the hole by epitaxial growth from the bottom surface of the end portions of the at least one of the plurality of device formation regions; and (d-2) filling the hole with the polysilicon layer so that the polysilicon layer is in contact with the epitaxially grown layer to form the body region comprised of the epitaxially grown layer and the polysilicon layer.

Preferably, according to a forty-sixth aspect of the present invention, in the method of the thirty-eighth aspect, the step (d) comprises the step of (d-1) implanting an impurity of a predetermined conductivity type so as to provide a peak of an impurity concentration distribution at an upper part of the SOI layer and to cause channeling, to form an active region of the predetermined device.

According to a forty-seventh aspect of the present invention, a method of manufacturing a semiconductor device comprises the steps of: (a) providing an SOI substrate having an SOI structure including a semiconductor substrate, a buried insulation layer, and an SOI layer; (b) selectively forming at least one first trench extending through the SOI layer from a top surface thereof; (c) selectively forming a plurality of second trenches which do not extend through the SOI layer from the top surface thereof, whereby regions of the SOI layer which lie between the plurality of second trenches serve as a plurality of device formation regions, the plurality of second trenches including a combined trench and a non-through trench, the combined trench containing the at least one first trench and being greater in width than the at least one first trench thereby to include a through part in which the at least one first trench is formed and a non-through part which is the remainder of the combined trench, the non-through trench including only a non-through part without containing the at least one first trench; (d) filling each of the combined trench and the non-through trench with an insulation film, the insulation film in the non-through part of the combined trench and part of the SOI layer which underlies the non-through part of the combined trench constituting a partial isolation part, the insulation film in the through part constituting a complete isolation part, the partial isolation part and the complete isolation part making up a combined isolation region, the insulation film in the non-through trench and part of the SOI layer which underlies the non-through trench making up a partial isolation region; and (e) forming a predetermined device in each of the plurality of device formation regions.

A forty-eighth aspect of the present invention is intended for a method of designing a semiconductor device including a semiconductor substrate, a buried insulation layer, and an SOI layer in which a CMOS device is to be formed. According to the present invention, the method comprises the steps of: (a) obtaining past data concerning a CMOS device including a first MOS transistor of a first conductivity type formed in a well region and a second MOS transistor of a second conductivity type formed outside the well region; (b) defining a first MOS transistor formation region of the first conductivity type and a second MOS transistor formation region of the second conductivity type, based on the past data; and (c) defining a complete isolation region including a complete insulation region extending through the SOI layer in the vicinity of an outer periphery of the well region defined by the past data.

As described hereinabove, in the semiconductor device according to the first aspect of the present invention, at least part of the at least one isolation region includes the partial isolation region having the partial insulation region provided in the upper part thereof and the semiconductor region formed in the lower part thereof and serving as part of the SOI layer, the semiconductor region being formed in contact with at least one of the plurality of device formation regions and the body region. Thus, the partial insulation region insulates the plurality of device formation regions from each other, and the semiconductor region and the body region fix the electric potential of the at least one device formation region.

As a result, the semiconductor device having the SOI structure in which the at least one device formation region is reduced in floating-substrate effect is achieved.

In the semiconductor device according to the second aspect of the present invention, the plurality of first device formation regions are isolated from each other by the first partial isolation region, and the plurality of second device formation regions are isolated from each other by the second partial isolation region. The complete isolation region extending through the SOI layer provides isolation between the plurality of first device formation regions and the plurality of second device formation regions. This allows the complete insulation of the device formation regions for different types of devices from each other, and reduces the floating-substrate effect of the device formation regions for the same type of devices.

In the semiconductor device according to the third aspect of the present invention, the plurality of device formation regions for the first circuit are isolated from each other by the complete isolation region extending through the SOI layer, and the plurality of device formation regions for the second circuit are isolated from each other by the partial isolation region.

Thus, a circuit for which the influence of the floating-substrate effect is significantly considered may be handled as the second circuit, and a circuit for which the influence of the floating-substrate effect need not be significantly considered may be handled as the first circuit. This provides suitable insulation based on the properties of the circuits to be formed.

In the semiconductor device according to the fourth aspect of the present invention, the first partial SOI layer is less in thickness than the second partial SOI layer. The plurality of device formation regions for the first circuit are formed in the first partial SOI layer, and the plurality of device formation regions for the second circuit are formed in the second partial SOI layer.

Thus, using the difference in thickness between the first and second partial SOI layers, a trench for complete isolation which extends through the first partial SOI layer and a trench for partial isolation which does not extend through the second partial SOI layer may be formed simultaneously in the first and second partial SOI layers, respectively. This simplifies the manufacturing steps.

In the semiconductor device according to the fifth aspect of the present invention, the complete isolation region extending through the SOI layer provides isolation between the device formation region for the predetermined circuit and the device formation region for the circuit other than the predetermined circuit. Therefore, the circuit other than the predetermined circuit may completely exclude the influence of the predetermined circuit.

In the semiconductor device according to the sixth aspect of the present invention, the device formed in the device formation region isolated by the partial isolation region has the active region formed at a depth from the surface of the SOI layer shallower than the depth at which the partial isolation region is formed. This minimizes the deterioration of the isolation characteristics of the partial isolation region.

In the semiconductor device according to the seventh aspect of the present invention, the semiconductor region includes the polysilicon region. Therefore, the semiconductor region is formed with high precision.

In the semiconductor device according to the eighth aspect of the present invention, the partial insulation region includes the low dielectric constant film. This minimizes the trouble based on the capacitance of the partial insulation region.

In the semiconductor device according to the ninth aspect of the present invention, the partial insulation region includes the partial insulation film provided at least at the side surface, and the low dielectric constant film provided in the other regions. The partial insulation film may effectively suppress the influence of the device disposed in lateral relation with the partial insulation region. At the same time, the trouble based on the capacitance of the partial insulation region is suppressed.

The semiconductor device according to the tenth aspect of the present invention comprises the plurality of isolation regions at least one of which has the predetermined width and extends substantially perpendicularly to the surface of the semiconductor substrate. This provides device isolation without impairing the degree of integration.

The semiconductor device according to the eleventh aspect of the present invention comprises the body region formed in contact with the top or bottom surface of at least one of the plurality of device formation regions. Therefore, the body region may fix the electric potential of the at least one device formation region.

In the semiconductor device according to the twelfth aspect of the present invention, the body region is formed in the upper portion of the buried insulation layer underlying the SOI layer to minimize the adverse effects upon the device isolation characteristics of the isolation region.

In the semiconductor device according to the thirteenth aspect of the present invention, the body region extends through the buried insulation layer. Therefore, the electric potential of the at least one device formation region may be fixed through the body region positioned closer to the semiconductor substrate.

In the semiconductor device according to the fourteenth aspect of the present invention, the body region is provided on the at least one device formation region and in contact with the top surface of the at least one device formation region. Thus, the body region is formed relatively easily.

In the semiconductor device according to the fifteenth aspect of the present invention, at least part of the at least one isolation region further comprises the combined isolation region including the partial isolation region and the complete insulation region extending through the SOI layer, the partial isolation region and the complete insulation region being continuous with each other. At least two of the device formation regions which are isolated from each other by the combined isolation region are completely insulatively isolated from each other by the complete insulation region of the combined isolation region.

The semiconductor device according to the sixteenth aspect of the present invention comprises the partial isolation region having the flat and even top surface, thereby facilitating the patterning for forming the constituents of a predetermined device, e.g. the gate electrode of a MOS transistor.

In the semiconductor device according to the seventeenth aspect of the present invention, the thickness of the semiconductor region of the combined isolation region is not greater than one-half the thickness of the SOI layer. Thus, the combined isolation region provides a sufficiently high degree of isolation characteristic.

In the semiconductor device according to the eighteenth aspect of the present invention, the width of the complete insulation region of the combined isolation region is not greater than one-half the width of the combined isolation region. The semiconductor region of the partial isolation region constituting the combined isolation region has a sufficient area, and the electric potential of a device formation region in contact with the semiconductor region is fixed with stability.

The semiconductor device according to the nineteenth aspect of the present invention comprises the complete isolation region formed at least in the vicinity of the boundary between the input/output NMOS transistor formation region and the input/output PMOS transistor formation region, thereby effectively suppressing latchup.

The semiconductor device according to the twentieth aspect of the present invention comprises the complete isolation region further formed in the vicinity of the boundary between the input/output transistor formation region and the internal circuit formation region. This completely precludes the influence of the input/output transistor formation region susceptible to noises from the internal circuit formation region.

In the semiconductor device according to the twenty-first aspect of the present invention, the complete isolation region is formed in the complete isolation region formation location situated within the PMOS transistor formation region in the vicinity of the boundary between the NMOS transistor formation region and the PMOS transistor formation region. The partial isolation region surrounds the NMOS transistor formation region and the PMOS transistor formation region except in the complete isolation region formation location. Therefore, the electric potential of the substrate of the NMOS transistor is fixed sufficiently, and the complete isolation is provided between the NMOS transistor formation region and the PMOS transistor formation region with high area efficiency.

In the semiconductor device according to the twenty-second aspect of the present invention, the partial isolation region is formed in the partial isolation region formation location situated at least in the vicinity of the first end of the gate electrode of the MOS transistor formation region. The complete insulation region surrounds the MOS transistor formation region except in the partial isolation region formation location. Therefore, the complete isolation region substantially completely isolates the MOS transistor formation region from its surrounding region whereas the electric potential of the channel formation region under the gate electrode of the MOS transistor is effectively fixed.

The semiconductor device according to the twenty-third aspect of the present invention comprises the body region including the peripheral body region of the second conductivity type surrounding the peripheral partial isolation region. Fixing the electric potential of the peripheral body region allows the transistor formation region to be effectively isolated from its surrounding region.

The semiconductor device according to the twenty-fourth aspect of the present invention comprises the adjacent-to-source body region disposed adjacent to the source region of the MOS transistor formation region and connected commonly with the source region by the electric potential setting region. Since the adjacent-to-source body region is formed adjacent to the source region, the degree of integration is accordingly increased.

In the semiconductor device according to the twenty-fifth aspect of the present invention, the semiconductor region of the partial isolation region includes the first and second partial semiconductor regions having different impurity concentrations. This provides the semiconductor region suitable for the isolating characteristic of the partial isolation region and the reduction in the floating-substrate effect.

In the semiconductor device according to the twenty-sixth aspect of the present invention, the first partial semiconductor region having a relatively high impurity concentration includes the peripheral region disposed adjacent to one of the plurality of device formation regions which is to be isolated. This enhances resistance to punch-through due to the isolation of the partial isolation region.

In the semiconductor device according to the twenty-seventh aspect of the present invention, the first partial semiconductor region having a relatively high impurity concentration includes the region adjacent to the gate electrode of the MOS transistor formation region, and the second partial semiconductor region having a relatively low impurity concentration includes the region adjacent to the drain/source of the MOS transistor formation region. This achieves the reduction in PN junction capacitance and the increase in resistance to punch-through.

In the semiconductor device according to the twenty-eighth aspect of the present invention, the peak of the impurity concentration of the semiconductor region of the partial isolation region is deeper from the surface of the SOI layer than the peak of the impurity concentration of the drain/source region of the MOS transistor formation region.

This increases the breakdown voltage of the PN junction of the drain/source region and the semiconductor region.

In the semiconductor device according to the twenty-ninth aspect of the present invention, the peak of the impurity concentration of the channel formation region of the MOS transistor formation region is deeper from the surface of the SOI layer than the peak of the impurity concentration of the semiconductor region of the partial isolation region. Therefore, the threshold voltage of the MOS transistor does not exceed a desired value.

In the semiconductor device according to the thirtieth aspect of the present invention, the impurity concentration of the first partial semiconductor region formed adjacent to the complete insulation region is higher than that of the second partial semiconductor region which is the remainder of the semiconductor region. This suppressed undesirable conditions resulting from stresses applied to the SOI layer.

In the semiconductor device according to the thirty-first aspect of the present invention, the radius of curvature of the bottom corner part of the partial isolation region is greater than that of the surface corner part thereof, whereby the stresses applied to the SOI layer are alleviated while the isolation width is reduced.

In the semiconductor device according to the thirty-second aspect of the present invention, the radius of curvature of the stepped part defined between the complete insulation region and the partial insulation region is less than that of the bottom corner part of the partial insulation region in the combined isolation region. Thus, the stresses applied to the SOI layer are alleviated while the isolation width is reduced.

The semiconductor device according to the thirty-third aspect of the present invention comprises the complete isolation region formed under the inductance formation region, thereby reducing the parasitic capacitance associated with the inductance element.

In the semiconductor device according to the thirty-fourth aspect of the present invention, the body region includes the gate-connected body region electrically connected to the gate electrode of the MOS transistor formed in the MOS transistor formation region, and the partial isolation region surrounds the MOS transistor formation region. This enhances the performance of the DT-MOS transistor which sets the gate electrode and the gate-connected body region at the same potential.

In the semiconductor device according to the thirty-fifth aspect of the present invention, the depth of the active region of the device is controlled so that the depletion layer extending from the active region does not reach the buried insulation layer in a built-in state. This reduces the junction capacitance between the semiconductor region of the partial isolation region and the active region.

In the semiconductor device according to the thirty-sixth aspect of the present invention, the field transistor comprises the gate part formed between the first and second active regions and including the field transistor partial insulation region formed in the upper part thereof and the field transistor semiconductor region formed in the lower part thereof and serving as part of the SOI layer.

Since the gate part is basically similar in construction to the partial isolation region, the gate part and the partial isolation region may be formed at the same time, whereby the field transistor is formed relatively easily.

In the semiconductor device according to the thirty-seventh aspect of the present invention, the peripheral isolation region includes the partial isolation region having the partial insulation region formed in the upper part thereof and the semiconductor region formed in the lower part thereof and serving as part of the SOI layer. The semiconductor region of the partial isolation region is formed in contact with the device formation region and is floating. The partial insulation region isolates the device formation region from its surrounding region, and the semiconductor region disperses the carriers generated in the device formation region by impact ionization and the electric charge generated by cosmic rays. Therefore, the increase in electric potential is suppressed, and resistance to soft errors is enhanced.

In the semiconductor device manufactured by the method according to the thirty-eighth aspect of the present invention, a device formation region included in the plurality of device formation regions and isolated by the insulation film in the at least one of the trenches and the part of the SOI layer which underlies the at least one trench is subjected to isolation with the floating-substrate effect suppressed.

The plurality of device formation regions formed by the method according to the thirty-ninth aspect of the present invention are isolated by the insulation film in the first trench and the part of the SOI layer which underlies the first trench, with the floating-substrate effect suppressed, and are completely isolated by the insulation film in the second trench extending through the SOI layer.

The method according to the fortieth aspect of the present invention utilizes the difference in width between the first and second trenches to penetrate the SOI layer under the center of the second trench using the sidewall elements as a mask, thereby to selectively form the partial isolation region and the complete isolation region without using a photoresist.

In the method according to the forty-first aspect of the present invention, the impurity is introduced into the parts of the SOI layer which underlie the plurality of trenches to form the high-concentration regions. This allows the electric potential of the device formation region in contact with the high-concentration regions to be fixed through the high-concentration regions with good stability.

In the method according to the forty-second aspect of the present invention, the SOI layer comprised of the silicon layer and the epitaxially grown layer has good crystallinity.

In the method according to the forty-third aspect of the present invention, the insulation film in the first trench and the polysilicon layer remaining in the first trench constitute the partial isolation region. Thus, the polysilicon layer electrically connected to a device formation region has a well-controlled thickness.

In the method according to the forty-fourth aspect of the present invention, the hole formed in the buried insulation layer is filled with the polysilicon layer to form the body region electrically connected to the at least one device formation region.

Therefore, the body region is formed in the buried insulation layer underlying the SOI layer to minimize the adverse effect upon the insulation provided by the isolation region.

In the method according to the forty-fifth aspect of the present invention, the body region includes the epitaxially grown layer formed by epitaxial growth from the bottom surface of the end portions of the at least one device formation region, and the polysilicon layer.

Thus, the provision of the epitaxially grown layer allows a sufficient distance between a device formed in the at least one device formation region and the polysilicon layer. Therefore, the semiconductor device manufactured by the method of the forty-fifth aspect provides satisfactory electric characteristics.

In the method according to the forty-sixth aspect of the present invention, the step (d) comprises the step of implanting the impurity of the predetermined conductivity type so as to provide the peak of the impurity concentration distribution at the upper part of the SOI layer and to cause channeling, to form the active region of the predetermined device. This provides the active region of the predetermined device which allows the peak of the impurity concentration to be present at the upper part of the SOI layer and which contains the impurity distributed to the surface of the buried insulation film because of the channeling.

In the method according to the forty-seventh aspect of the present invention, the steps (b) and (c) may be performed to simultaneously form the combined trench for the combined isolation region and the non-through trench for the partial isolation region.

In the step (c) of the method according to the forty-eighth aspect of the present invention, the complete isolation region including the complete insulation region extending through the SOI layer is defined in the vicinity of the outer periphery of the well region of the past data. Therefore, the method makes effective use of the past data to define the complete isolation region which effectively isolates the first and second MOS transistor formation regions from each other.

It is therefore an object of the present invention to provide a semiconductor device having an SOI structure which achieves the reduction in floating-substrate effect.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
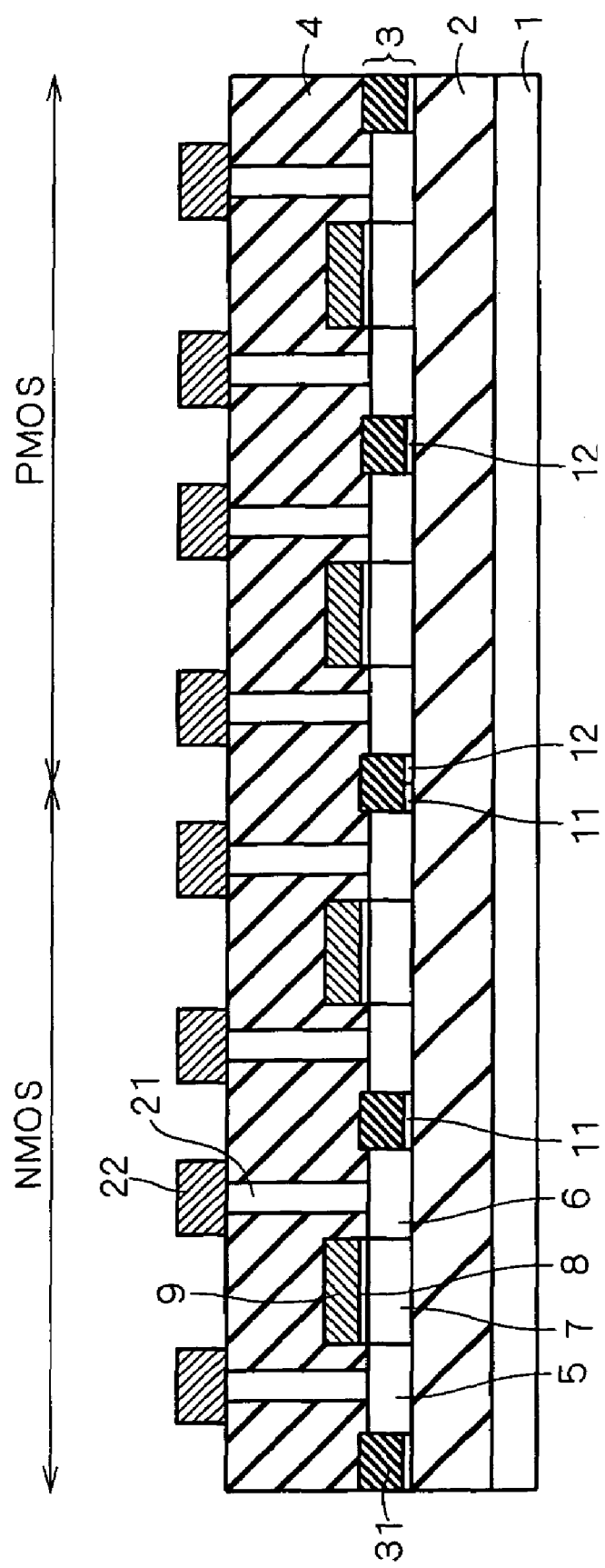
FIG. 1 is a cross-sectional view of a first form of a semiconductor device having an SOI structure according to a first preferred embodiment of the present invention.
Figure 2:
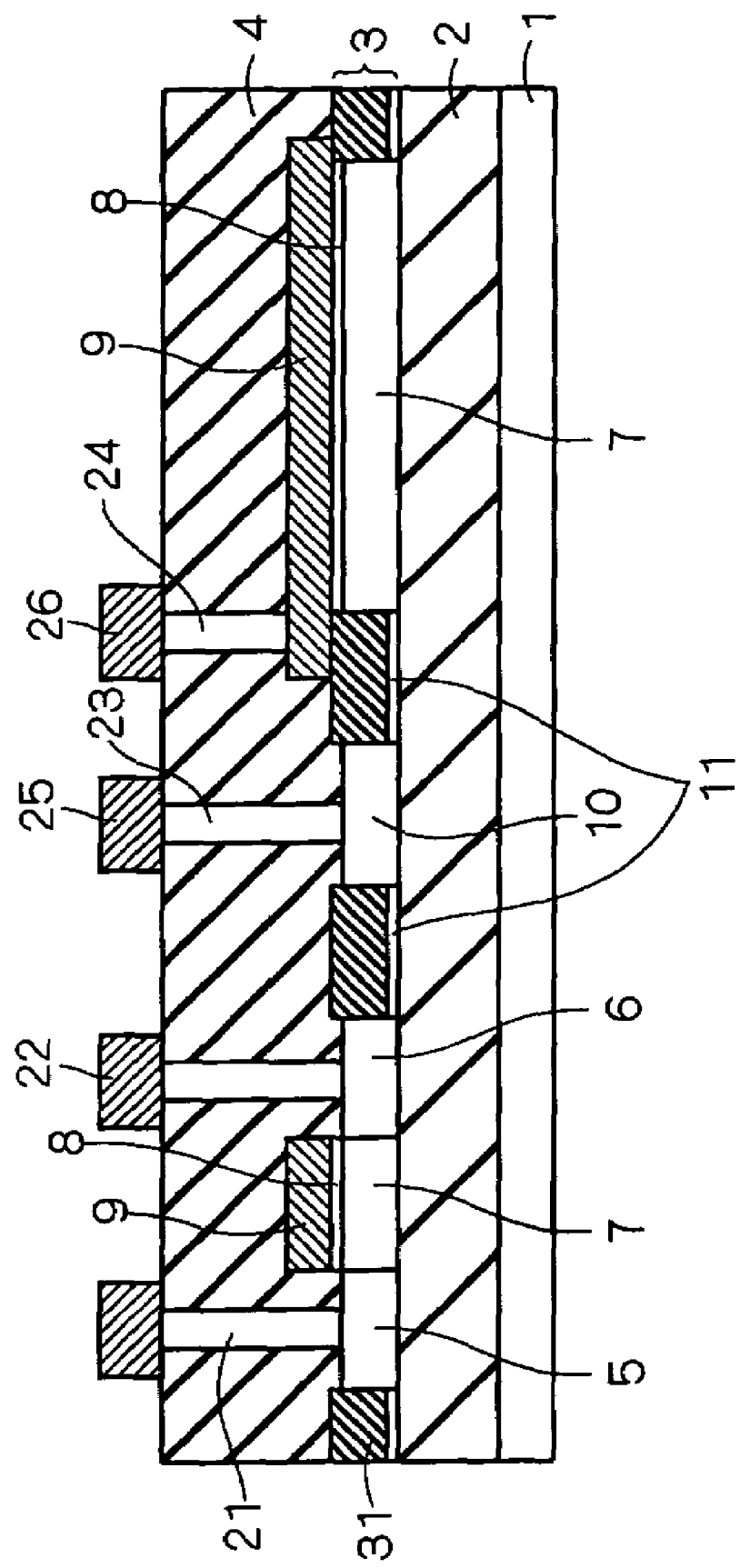
FIG. 2 is a cross-sectional view of the first form of the first preferred embodiment.
Figure 3:
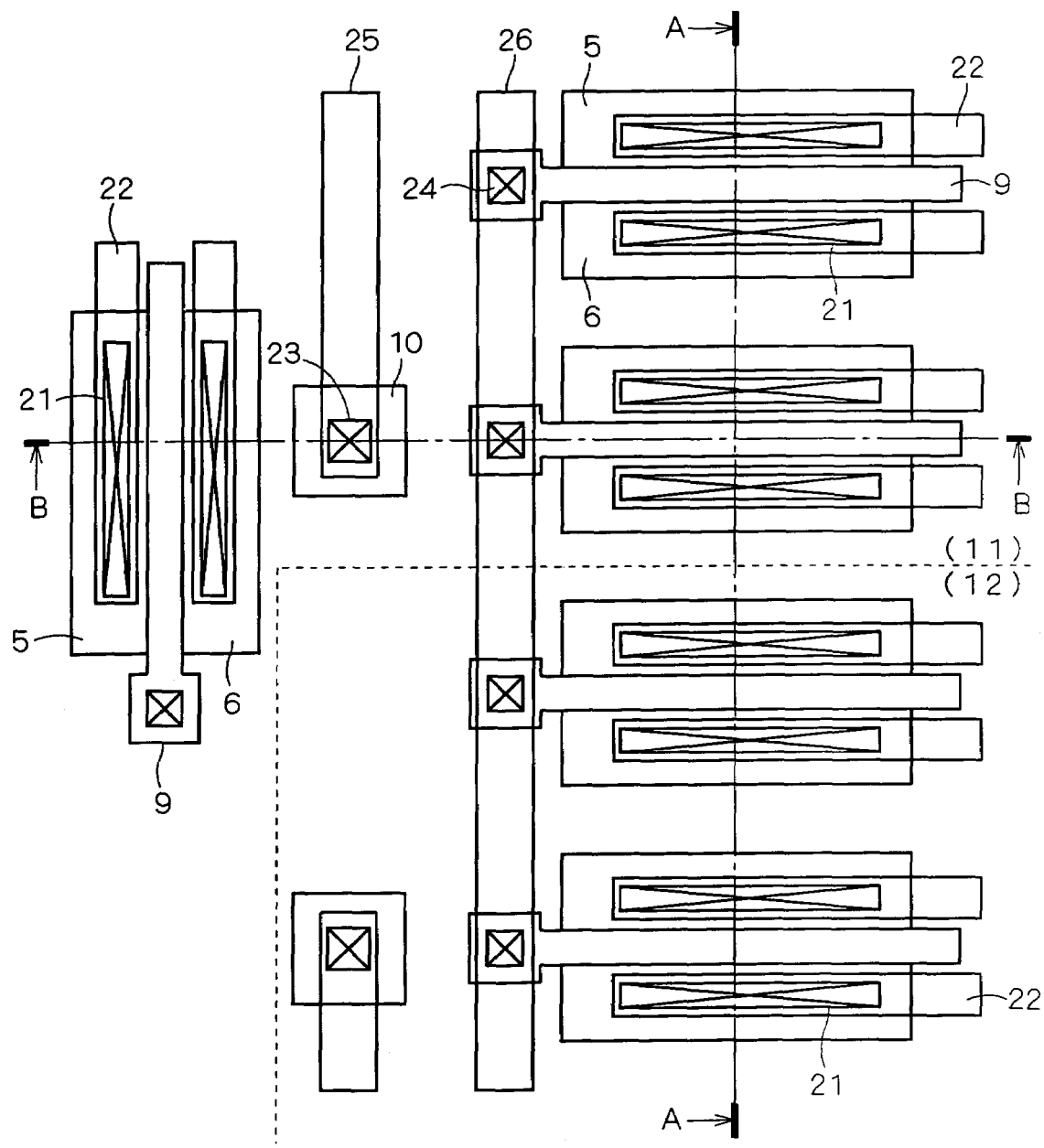
FIG. 3 is a plan view of the first form of the first preferred embodiment.

FIGS. 1 through 3 show the construction of a semiconductor device having an SOI structure according to a first preferred embodiment of the present invention. FIGS. 1 and 2 are cross-sectional views, and FIG. 3 is a plan view. The cross-sections taken along the lines A-A and B-B correspond to FIGS. 1 and 2, respectively.

As shown in FIGS. 1 through 3, the semiconductor device having the SOI structure comprised of a silicon substrate 1, a buried oxide film 2 and an SOI layer 3 is constructed such that a partial oxide film 31 with well regions formed therebeneath isolates transistor formation regions in the SOI layer 3 from each other. A p-type well region 11 is formed beneath part of the partial oxide film 31 which isolates NMOS transistors from each other. An n-type well region 12 is formed beneath part of the partial oxide film 31 which isolates PMOS transistors from each other. The p-type well region 11 (closer to NMOS transistors) and the n-type well region 12 (closer to PMOS transistors) are formed beneath part of the partial oxide film 31 which isolates NMOS and PMOS transistors from each other. The well region 11 is formed to surround the drain and source regions 5 and 6 of a group of NMOS transistors, and the well region 12 is formed to surround the drain and source regions 5 and 6 of a group of PMOS transistors. In the first preferred embodiment, an interlayer insulation film 4 covers the SOI layer 3.

A single MOS transistor isolated from other transistors by the partial oxide film 31 in the first preferred embodiment comprises a drain region 5, a source region 6 and a channel formation region 7 which are formed in the SOI layer 3, a gate oxide film 8 formed on the channel formation region 7, and a gate electrode 9 formed on the gate oxide film 8. An interconnect layer 22 formed to the interlayer insulation film 4 is electrically connected through a contact formed in the interlayer insulation film 4 to the drain region 5 or the source region 6.

As illustrated in FIGS. 2 and 3, a body region 10 is surrounded by the well region 11 in the SOI layer 3. The body region 10 is in contact with an adjacent part of the well region 11. An interconnect layer 25 formed on the interlayer insulation film 4 is electrically connected through a body contact 23 formed in the interlayer insulation film 4 to the body region 10. An interconnect layer 26 formed on the interlayer insulation film 4 is electrically connected through a gate contact 24 formed in the interlayer insulation film 4 to the gate electrode 9.

Figure 102:
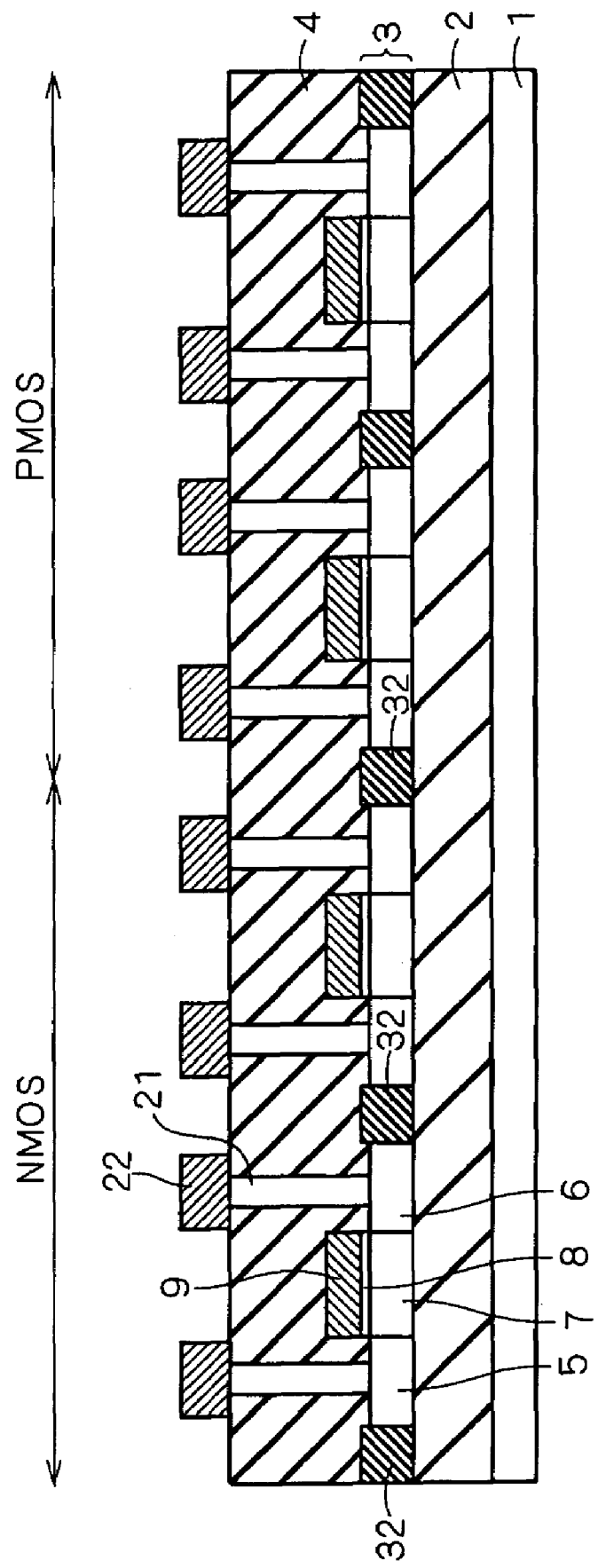
FIG. 102 is a cross-sectional view of a background art semiconductor device having the SOI structure.

Thus, the semiconductor device of the first preferred embodiment as shown in FIGS. 1 through 3 differs from the background art semiconductor device shown in FIG. 102 in that the partial oxide film 31 in an isolation region does not reach the bottom of the SOI layer 3, and the well regions 11 and 12 doped with impurities of the same conductivity type as the channel formation region of the transistor to be isolated are formed beneath the partial oxide film 31.

Therefore, the electric potential of the substrate of each NMOS transistor is fixed through the interconnect layer 25, the body contact 23, the high-concentration body region 10 and the well region 11. Likewise, the electric potential of the substrate of each PMOS transistor is fixed through the body region.

The details of the semiconductor device of the first preferred embodiment are described below with reference to FIGS. 1 through 3. The buried oxide film 2 has a thickness on the order of 100 to 500 nm, and the SOI layer 3 has a thickness on the order of 30 to 200 nm. The channel formation region 7 is formed, for example, by the implantation of impurities of a first conductivity type (p-type impurities for the NMOS transistors, and n-type impurities for the PMOS transistors) having a concentration on the order of $10^{17}$ to $10^{18}$/cm$^3$. The drain and source regions 5 and 6 adjacent the channel formation region 7 are formed, for example, by the implantation of impurities of a second conductivity type (n-type impurities for the NMOS transistors, and p-type impurities for the PMOS transistors) having a concentration on the order of $10^{19}$ to $10^{21}$/cm$^3$.

The partial oxide film 31 for isolating adjacent transistors from each other is formed by leaving lower parts of the SOI layer 3 which are on the order of 10 to 100 nm for the formation of the well regions. It is desirable in terms of micromachining that the top surface of the partial oxide film 31 is level with the surface of the SOI layer 3. However, when the SOI layer 3 is relatively thin, it is difficult for the partial oxide film 31 to have a thickness required for isolation. Thus, raising the top surface of the partial oxide film 31 to a level higher than the surface of the SOI layer 3 enhances isolation performance.

The well regions 11 and 12 formed beneath the partial oxide film 31 for oxide film isolation are of the same conductivity type as the channel formation (and has an impurity concentration of, for example, $10^{17}$ to $5·10^{18}$/cm$^3$; the impurity concentration of the well regions 11 and 12 is equal to or higher than that of the channel formation region; the higher the impurity concentration, the better a punch through prevention effect and the isolation performance).

The body region 10, as shown in FIG. 2, is formed by the implantation of impurities of the same conductivity type as its adjacent well region 11 and having a relatively high concentration of $10^{19}$ to $19^{21}$/cm$^3$.

The body region 10 of FIG. 2 extends vertically from the top surface to the bottom surface of the SOI layer 3, and the body contact 23 extends vertically through the interlayer insulation film 4. A body region as shown in FIG. 4 may be provided in place of the body region 10.

Figure 4:
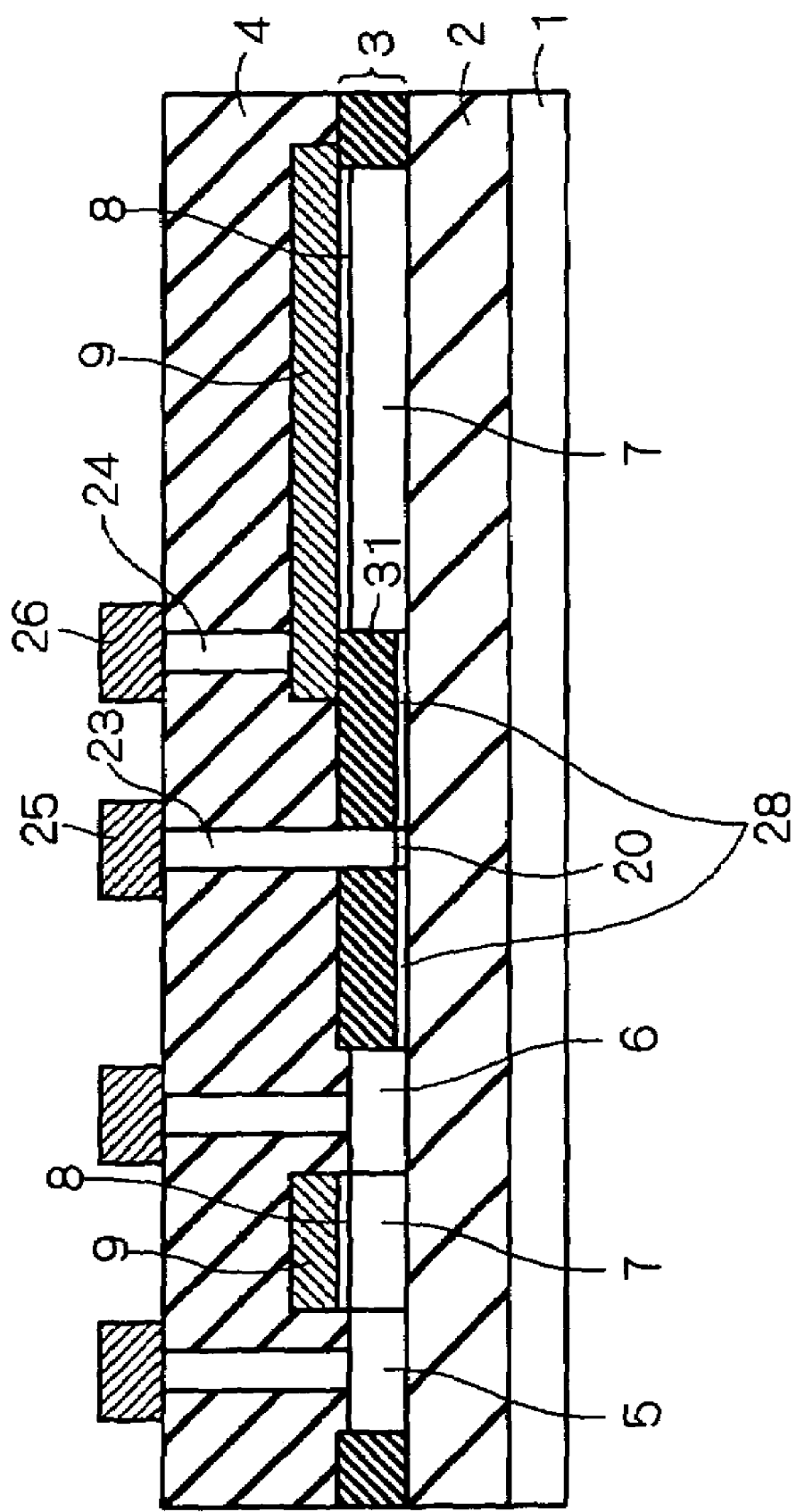
FIG. 4 is a cross-sectional view of a second form of the semiconductor device according to the first preferred embodiment.

Referring to FIG. 4, a body region 20 is formed only in a lower part of the SOI layer 3 so as to conform to the configuration of the body contact 23 extending through the interlayer insulation film 4 and the partial oxide film 31. In this case, a well region 28 is formed adjacent the body region 20 beneath the partial oxide film 31.

For the formation of the structure of FIG. 4, it is desirable to implant high-concentration impurities for the formation of the body region 20 after the contact is formed.

For the isolation of devices of the same conductivity type, the well regions 11 and 12 may be formed only by the implantation of impurities of the same conductivity type as the channel formation region. However, for the isolation between the PMOS and NMOS transistors, it is necessary to provide the p-type well region 11 adjacent to the NMOS transistor and the n-type well region 12 adjacent to the PMOS transistor.

Such an SOI structure may be manufactured using a partial trench isolation technique according to a second preferred embodiment which will be described later.

Second Preferred Embodiment

<First Form>

Figure 5:
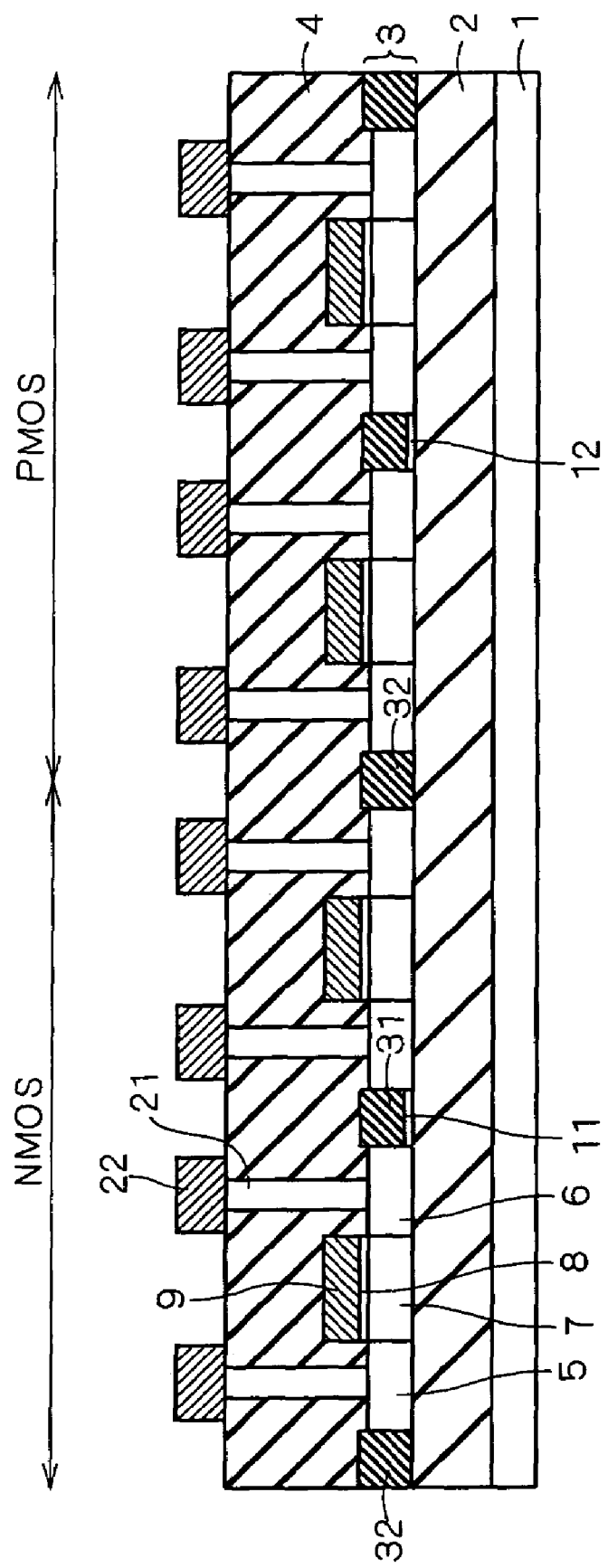
FIG. 5 is a cross-sectional view of a first form of a second preferred embodiment according to the present invention.

FIG. 5 is a cross-sectional view of a first form of the semiconductor device having the SOI structure according to the second preferred embodiment of the present invention.

As shown in FIG. 5, the second preferred embodiment is adapted such that the partial oxide film 31 and the well region 11 (12) formed therebeneath isolate the NMOS transistors from each other and isolate the PMOS transistors from each other, and a full oxide film 32 provides isolation between the PMOS and NMOS transistors. Such an arrangement is more advantageous than the arrangement of the first preferred embodiment in that it reduces the isolation width between the PMOS and NMOS transistors and prevents latchup.

When the source and drain regions 6 and 5 are formed by ion implantation for achievement of the structure of FIG. 5, there is a danger that ions implanted for the purpose of forming the drain and source regions 5 and 6 pass through the partial oxide film 31 into the well region 11 (12) underlying the partial oxide film 31 which should be of the opposite conductivity type from the drain and source regions 5 and 6, impairing the isolation characteristics of the partial oxide film 31 and the well region 11.

<Second Form>

Figure 6:
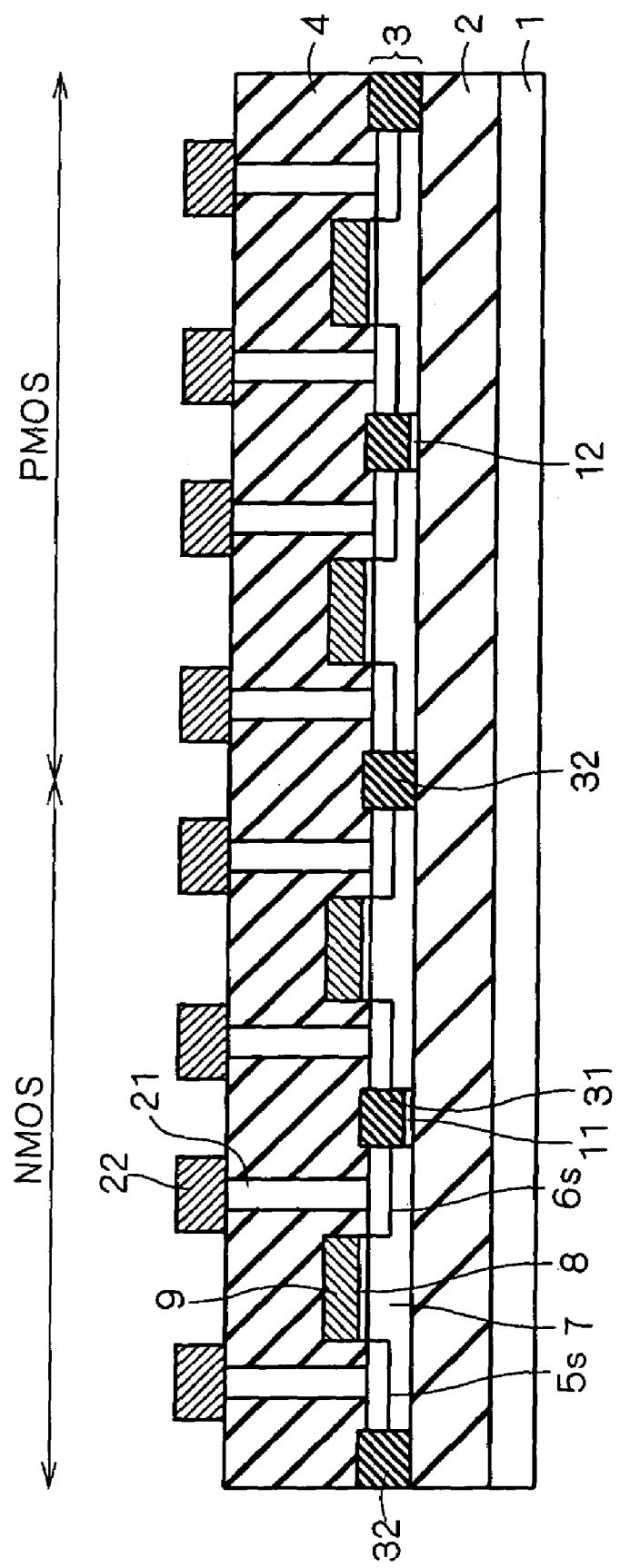
FIG. 6 is a cross-sectional view of a second form of the second preferred embodiment.

To avoid such a situation, it is preferable to form a drain region 5s and a source region 6s at a depth sufficiently less than the thickness of the SOI layer 3 as illustrated in a second form of the second preferred embodiment of FIG. 6. In other words, the drain and source regions 5s and 6s should be shallower than the bottom surface of the partial oxide film 31. Low-energy ion implantation may be performed to form the drain and source regions 5s and 6s at a shallow position, as shown in FIG. 6.

Ideally, the drain region 5s and the source regions 6s have a depth which satisfies the condition that a depletion layer extending from the source/drain reaches the buried oxide film 2 in a built-in state (in which a bias voltage of 0 V is applied to a PN junction).

This is because the source/drain depletion layer which reaches the buried oxide film 2 in the built-in state enhances the isolation characteristic of a partial isolation region including the partial oxide film 31 and the well region 11 (12) while reducing the junction capacitance of the source/drain region 5s/6s and the well region 11 (12).

<Third Form>

Figure 7:
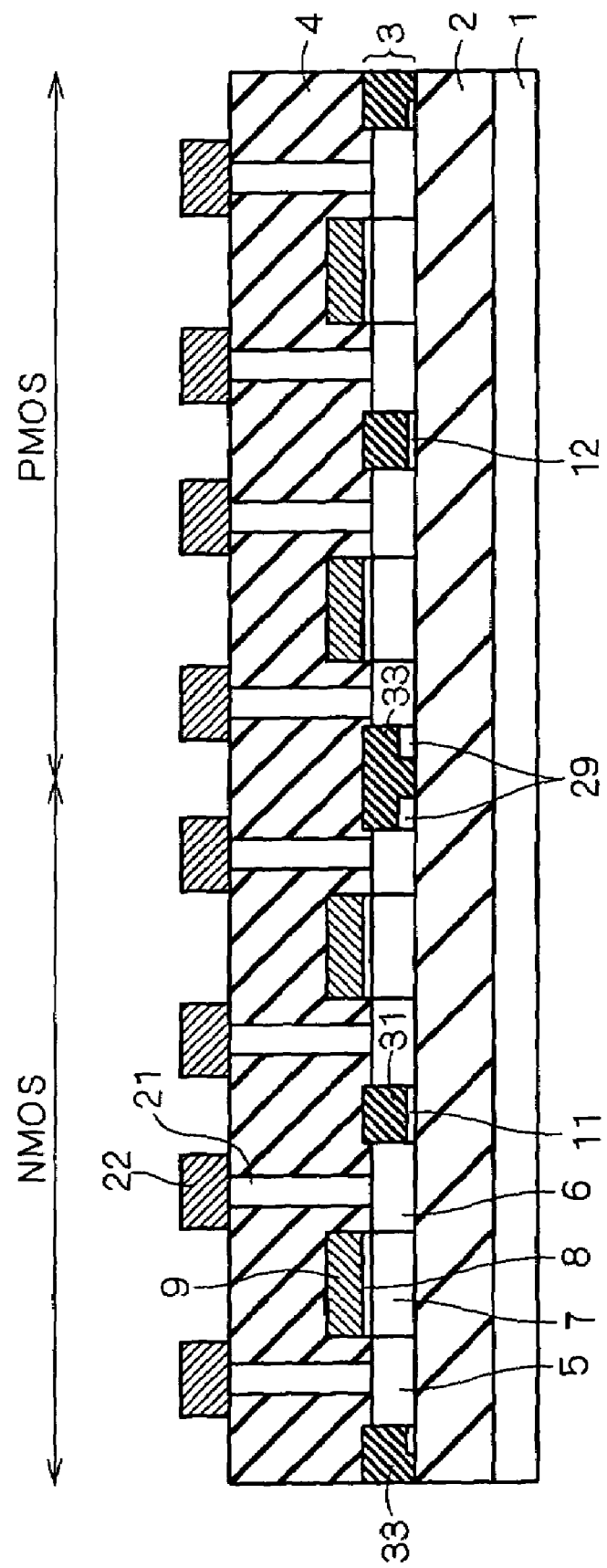
FIG. 7 is a cross-sectional view of a third form of the second preferred embodiment.

As illustrated in a third form of the second preferred embodiment of FIG. 7, an oxide film 33 extending vertically from the top surface to the bottom surface of the SOI layer 3 except parts of the lower portion thereof which serve as a well region 29 may be used to provide complete isolation between the NMOS and PMOS transistors. The third form of the second preferred embodiment may readily form a trench for the oxide film 33 simultaneously with a trench for the partial oxide film 31 to accordingly increase the possibility of easier layout than the isolation using the full oxide film 32.

The complete isolation provided by the oxide film 33 is in some cases referred to hereinafter as the isolation provided by a combined isolation region comprising a complete isolation region and a partial isolation region which are continuous with each other, the complete isolation region including a through part of the oxide film 33 which extends through the SOI layer 3, the partial isolation region including a non-through part of the oxide film 33 which does not extend through the SO layer 3 and the well region 29 serving as part of the SOI layer 3 beneath the non-through part.

<Fourth Form>

Figure 55:
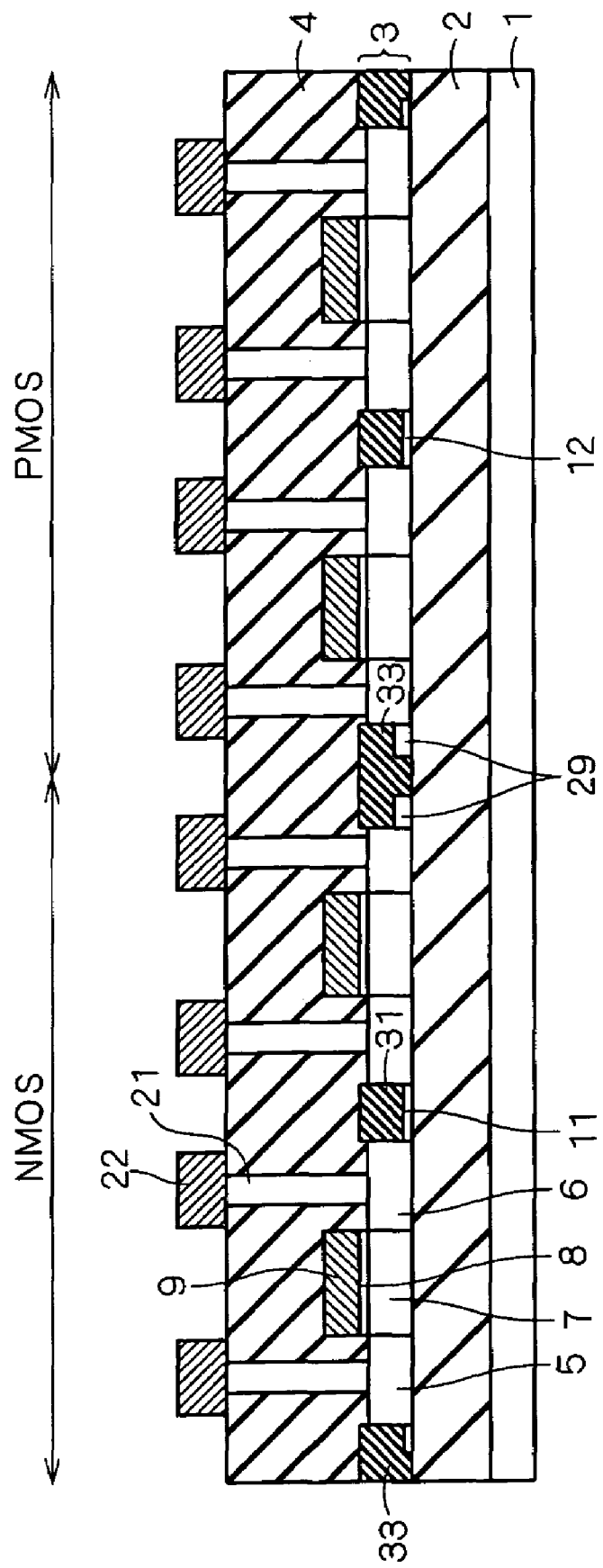
FIG. 55 is a cross-sectional view of a fourth form of the second preferred embodiment.

In a fourth form of the second preferred embodiment shown in FIG. 55, the partial oxide film 31 which provides partial isolation by itself and the oxide film 33 of the combined isolation region have a flat and even top surface, thereby facilitating the patterning for the formation of the gate electrode 9.

<Fifth Form>

Figure 56:
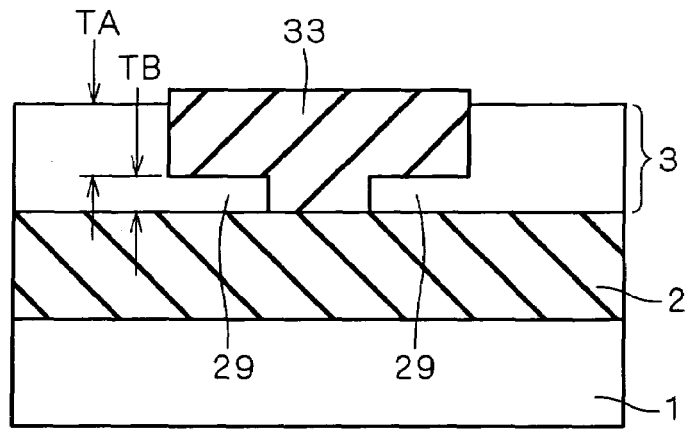
FIG. 56 is a cross-sectional view of a fifth form of the second preferred embodiment.

FIG. 56 is a detailed cross-sectional view of the oxide film 33 of the combined isolation region shown in FIG. 7. As shown in FIG. 56, the oxide film 33 has a central part (the through part) extending vertically from the top surface to the bottom surface of the SOI layer 3, and a peripheral part (the non-through part) which does not extend to the bottom surface thereof. Part of the SOI layer 3 which remains under the peripheral part of the oxide film 33 serves as the well region 29. The oxide film 33 having such a structure is formed so as to satisfy the inequality TA>TB where TA is the thickness of part of the SOI layer 3 which lies above the well region 29, and TB is the thickness of part of the SOI layer 3 which lies under the peripheral part of the oxide film 33 (or the thickness of the well region 29). Specifically, the thickness of the well region 29 is set at less than one-half the thickness (TA+TB) of the SOI layer 3.

The formation of the oxide film 33 so as to satisfy the inequality TA>TB as illustrated in the fifth form of the second preferred embodiment sufficiently increases a threshold voltage resulting from the isolation provided by the oxide film 33 (or a threshold voltage when the oxide film 33 is regarded as a gate oxide film) to provide a sufficiently high isolation breakdown voltage, and also sufficiently reduces the area of a PN junction of the drain/source region in contact with the well region 29 and the well region 29 to suppress the generation of a leakage current. This reduces the capacitance of the PN junction to achieve the high-speed operation of the semiconductor device.

<Sixth Form>

Figure 57:
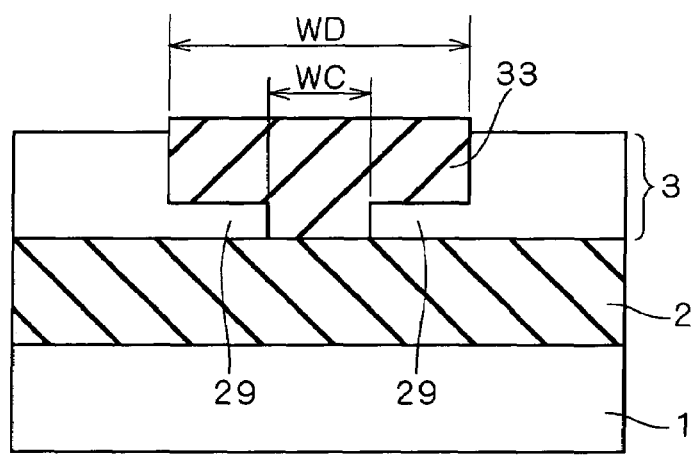
FIG. 57 is a cross-sectional view of a sixth form of the second preferred embodiment.

FIG. 57 is a detailed cross-sectional view of the oxide film 33 shown in FIG. 7. As shown in FIG. 57, the oxide film 33 is formed so as to satisfy the inequality WC<WD/2 where WC is the width (referred to as a complete isolation width) of the central part of the oxide film 33 which extends vertically from the top surface to the bottom surface of the SOI layer 3, and WD is the width (referred to as an oxide isolation width) of the entire oxide film 33.

The structure of the sixth form of the second preferred embodiment ensures the sufficient area of the well region 29 formed under the peripheral part of the oxide film 33, to fix the electric potential of the substrate of the transistor at a level high enough to suppress the floating-substrate effect through the well region 29. Consequently, the transistor is stabilized in operation.

Equalizing the complete isolation width WC in a chip facilitates the control of the isolation shape. Further, since only the patterning of the oxide film 33 is required to provide electrical complete isolation between devices, the complete isolation width WC may be set at a minimum design width. This minimizes the chip area to greatly increase the degree of integration.

<Modifications>

The structure for providing complete isolation at least between the NMOS and PMOS transistors is illustrated in the second preferred embodiment. However, the second preferred embodiment may be applied to a structure for providing complete isolation between a memory part and a logic circuit part in a hybrid logic-memory circuit for noise reduction.

An oxide film having different depths may be used for a plurality of types of partial isolation in place of the use of both the complete isolation region and the partial isolation region. In this case, a well region under part of the oxide film which is relatively deep need not connected to a body contact material such as a body region but may be floating for use as a complete isolation region.

<First Manufacturing Method (First and Second Forms)>

FIGS. 8 through 11 are cross-sectional views showing an isolation process in a method of manufacturing the semiconductor device according to the first and second forms of the second preferred embodiment. The method shown in FIGS. 8 through 11 employs partial trench isolation and full trench isolation in combination.

Figure 8:
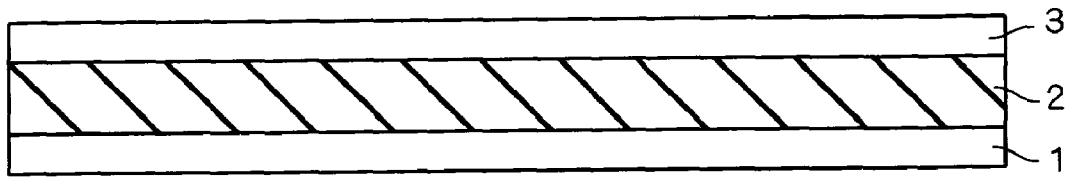
FIGS. 8 through 11 are cross-sectional views showing a first isolation process according to the second preferred embodiment.

Initially, as shown in FIG. 8, the starting material is an SOI substrate comprised of the silicon substrate 1, the buried oxide film 2 and the SOI layer 3, the SOI substrate being formed by the SIMOX method and the like in which the buried oxide film 2 is formed by oxygen ion implantation.

Figure 9:
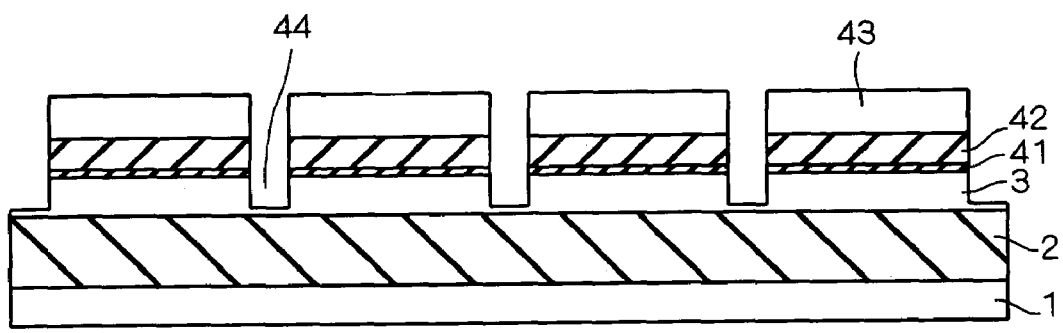
Figure 12:
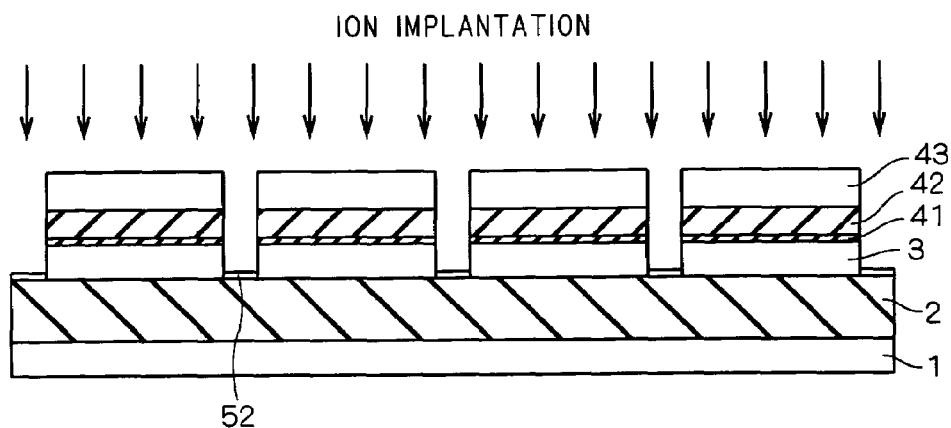
FIGS. 12 and 13 are cross-sectional views showing a high concentration well region formation process.

Referring to FIG. 9, an oxide film 41 having a thickness of about 20 nm is deposited on the SOI substrate, and a nitride film 42 having a thickness of about 200 nm is deposited on the oxide film 41. The patterning of the isolation region using a patterned photoresist 43 as a mask etches a three-layer film comprised of the nitride film 42, the oxide film 41 and the SOI layer 3 so that lower parts of the SOI layer 3 are left, to form a plurality of partial trenches 44. The plurality of partial trenches 44 have a predetermined width and extend substantially perpendicularly to the surface of the silicon substrate 1 to provide isolation which maintains small geometry without impairing the degree of integration. Ion implantation for the formation of high-concentration well regions 52 (corresponding to the well regions 11 and 12) as shown in FIG. 12 in this state may enhance an isolation breakdown voltage.

Figure 10:
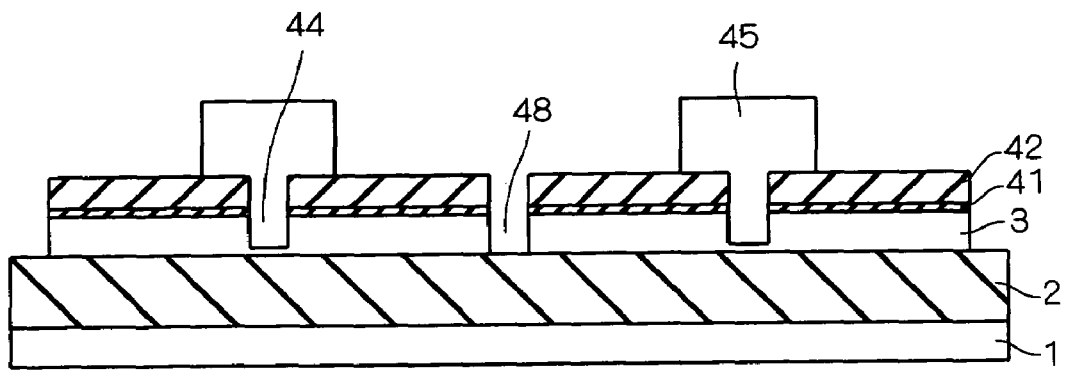

Next, as shown in FIG. 10, a photoresist 45 is formed to cover some of the plurality of partial trenches 44. The remaining partial trench 44 which is not covered with the photoresist 45 is further etched to form a full trench 48 extending through the SOI layer 3.

Figure 11:
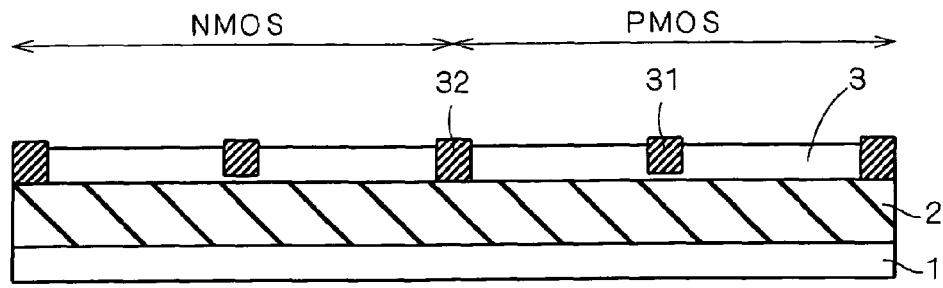
Figure 13:
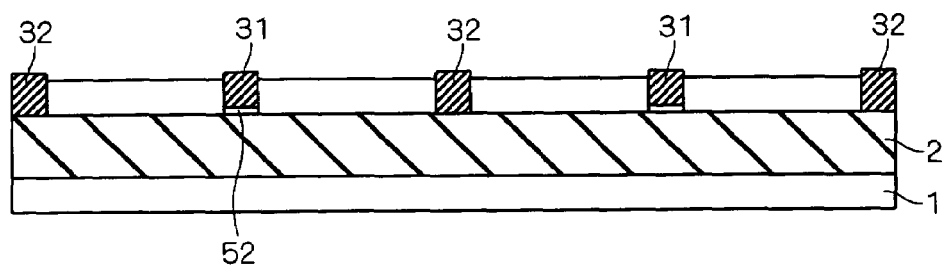

Then, an oxide film having a thickness of about 500 nm is deposited on top of the resultant structure by the HDPCVD (high-density plasma CVD) process and the like. Polishing is performed by the CMP process in a similar manner to the conventional trench isolation so that the nitride film 42 is removed partway. Thereafter, the nitride film 42 and the oxide film 41 are removed. This provides a structure in which the partial oxide film 31, the SOI layer 3 (well regions) therebeneath, and the full oxide film 32 are selectively formed, as shown in FIG. 11. Thus polishing the oxide film by the CMP process provides the flat and even top surfaces of the partial oxide film 31 and the full oxide film 32. When the ion implantation shown in FIG. 12 is performed after the structure of FIG. 9 is provided, the high-concentration well regions 52 are formed beneath the partial oxide film 31 as shown in FIG. 13. The high-concentration well regions 52 can fix the electric potential of the substrate with higher stability.

Then, an NMOS transistor is formed in an NMOS transistor formation region and a PMOS transistor is formed in a PMOS transistor formation region by the existing method. This provides the SOI structure of the first form shown in FIG. 5 or the SOI structure of the second form shown in FIG. 6.

If the step shown in FIG. 10 is eliminated and the other steps are performed in the above-mentioned manner, only the partial trenches 44 are formed and the full trench 48 is not formed. This provides the structure of the first preferred embodiment shown in FIGS. 1 through 3 (the structure having the devices all of which are isolated by the partial oxide film 31).

<Second Manufacturing Method (First and Second Forms)>

FIGS. 14 through 18 are cross-sectional views showing another isolation process in the manufacturing method according to the first and second forms of the second preferred embodiment. The method shown in FIGS. 14 through 18 employs the partial trench isolation and the full trench isolation in combination.

Figure 14:
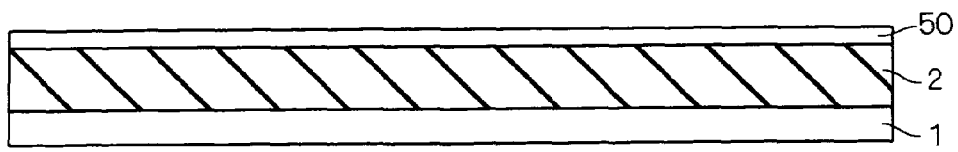
FIGS. 14 through 18 are cross-sectional views showing a second isolation process according to the second preferred embodiment.

Initially, as shown in FIG. 14, the starting material is a multilayer structure comprised of the silicon substrate 1, the buried oxide film 2 and a silicon layer 50. The silicon layer 50 is made thicker than the SOI layer 3 to be finally provided.

Figure 15:
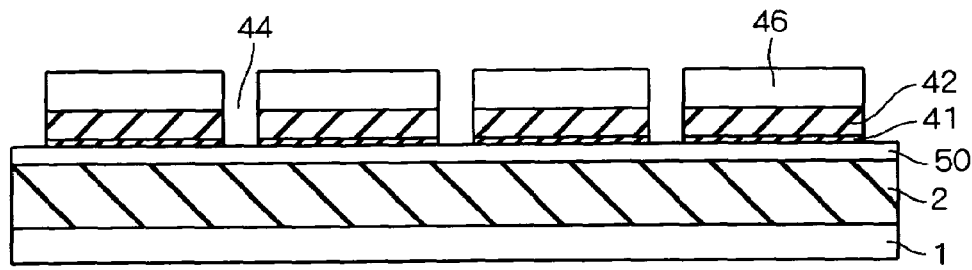

Referring to FIG. 15, the oxide film 41 is deposited on the SOI substrate, and the nitride film 42 is deposited on the oxide film 41. The patterning of the isolation region using a patterned photoresist 46 as a mask etches the nitride film 42 and the oxide film 41 so that the surface of the silicon layer 50 is exposed, to form the plurality of partial trenches 44.

Figure 16:
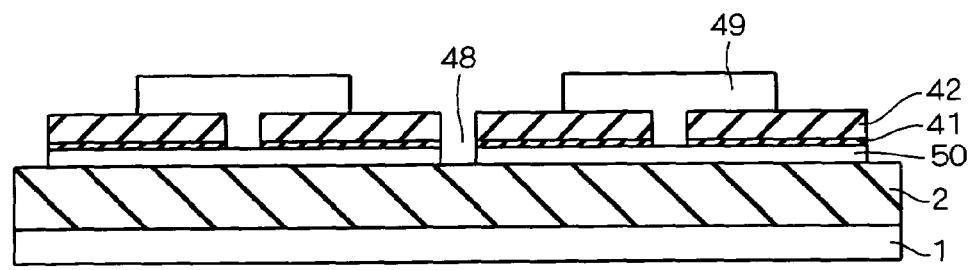

With reference to FIG. 16, a photoresist 49 is formed to cover some of the plurality of partial trenches 44. The remaining partial trench 44 which is not covered with the photoresist 49 is further etched to form the full trench 48 extending through the silicon layer 50.

Figure 17:
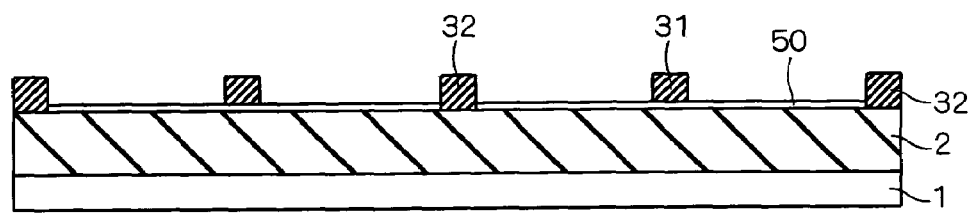

Then, an oxide film is deposited on top of the resultant structure by the HDPCVD process and the like. Polishing is performed by the CMP process in a similar manner to the conventional trench isolation so that the nitride film 42 is removed partway. Thereafter, the nitride film 42 and the oxide film 41 are removed. This provides a structure in which the partial oxide film 31, the silicon layer 50 (well regions) therebeneath, and the full oxide film 32 are selectively formed, as shown in FIG. 17.

Figure 18:
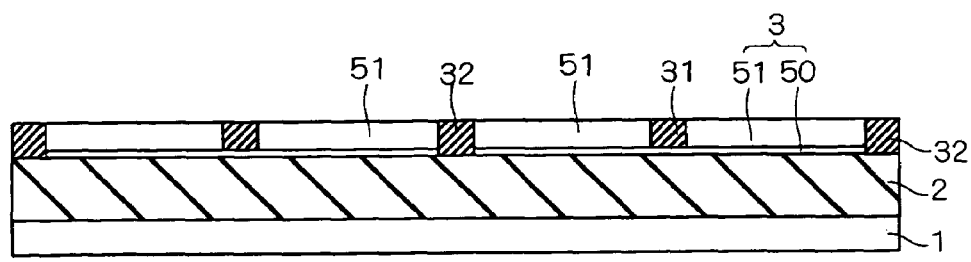

As illustrated in FIG. 18, an epitaxial silicon layer 51 is formed by the epitaxial growth from the silicon layer 50. This provides the high-crystallinity SOI layer 3 comprised of the silicon layer 50 and the epitaxial silicon layer 51.

Then, an NMOS transistor is formed in the NMOS transistor formation region and a PMOS transistor is formed in the PMOS transistor formation region by the existing method. This provides the SOI structure of the first form shown in FIG. 5 or the SOI structure of the second form shown in FIG. 6.

<Third Manufacturing Method (Third Form)>

FIGS. 19 through 22 are cross-sectional views showing still another isolation process in the manufacturing method according to the third form of the second preferred embodiment. The method shown in FIGS. 19 through 22 features the formation of partial trenches having different widths.

Figure 19:
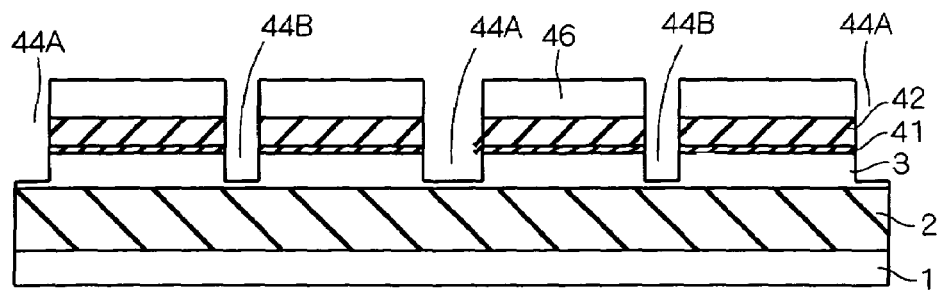
FIGS. 19 through 22 are cross-sectional views showing a third isolation process according to the second preferred embodiment.

Referring to FIG. 19, relatively wide partial trenches 44A and relatively narrow partial trenches 44B are formed. The partial trenches 44A are used for complete isolation, and the partial trenches 44B are used for partial isolation. The partial trenches 44A and 44B are formed so that lower parts of the SOI layer 3 are left.

Figure 20:
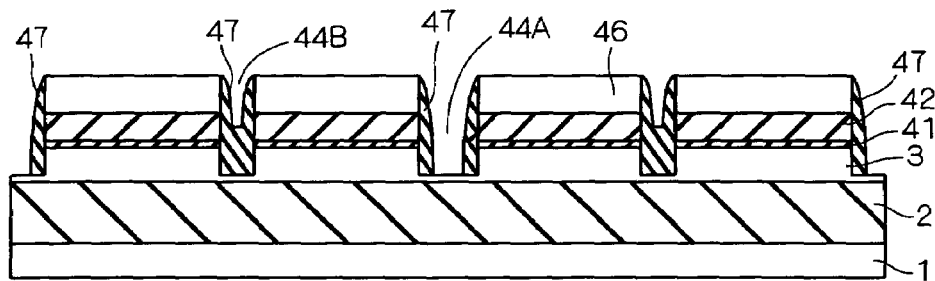

Then, as shown in FIG. 20, oxide films 47 are formed as sidewalls on the side surfaces of the partial trenches 44A and 44B so as to cover the bottom surfaces of the partial trenches 44B but expose the bottom center portions of the partial trenches 44A. This utilizes the fact that the width of the partial trenches 44B is less than that of the partial trenches 44A.

Figure 21:
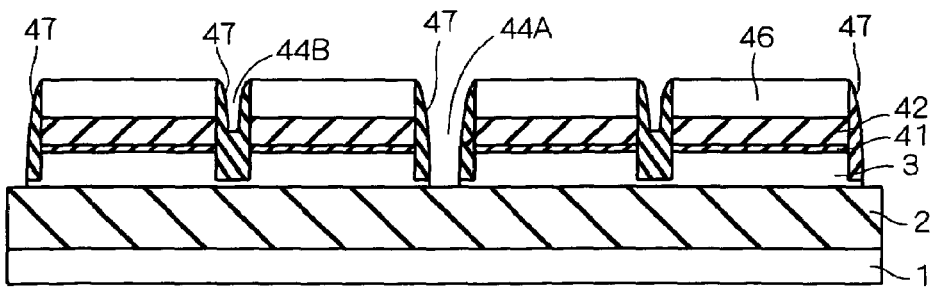
Figure 22:
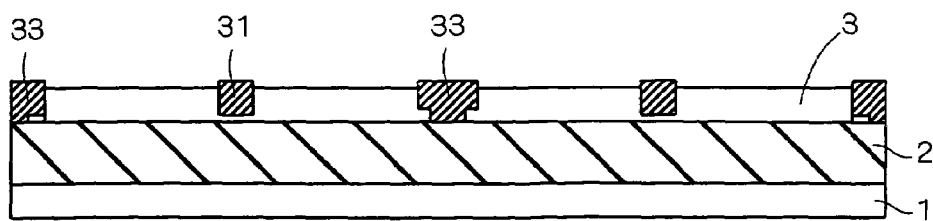

As depicted in FIG. 21, silicon etching is performed on the SOI layer 3 using the oxide films 47 as a mask to remove parts of the SOI layer 3 which are not covered with the oxide films 47, including parts of the SOI layer 3 which are positioned under the bottom center portions of the partial trenches 44A, to expose the surface of the buried oxide film 2 in the partial trenches 44A.

Then, an oxide film having a thickness of about 500 nm is deposited on top of the resultant structure by the HDPCVD process and the like. Polishing is performed by the CMP process in a similar manner to the conventional trench isolation so that the nitride film 42 is removed partway. Thereafter, the nitride film 42 and the oxide film 41 are removed. This provides a structure in which the partial oxide film 31 (with the SOI layer 3 therebeneath), and the oxide film 33 (with the SOI layer 3 beneath the parts thereof) are selectively formed, as shown in FIG. 21.

Then, an NMOS transistor is formed in the NMOS transistor formation region and a PMOS transistor is formed in the PMOS transistor formation region by the existing method. This provides the SOI structure of the third form of the second preferred embodiment shown in FIG. 7.

<Fourth Manufacturing Method (Third Form)>

FIGS. 23 through 27 are cross-sectional views showing still another isolation process in the manufacturing method according to the third form of the second preferred embodiment. The method shown in FIGS. 23 through 27 features the formation of partial trenches having different widths.

Figure 23:
FIGS. 23 through 27 are cross-sectional views showing a fourth isolation process according to the second preferred embodiment.

Initially, as shown in FIG. 23, the starting material is the SOI substrate comprised of the silicon substrate 1, the buried oxide film 2, and the SOI layer 3.

Figure 24:
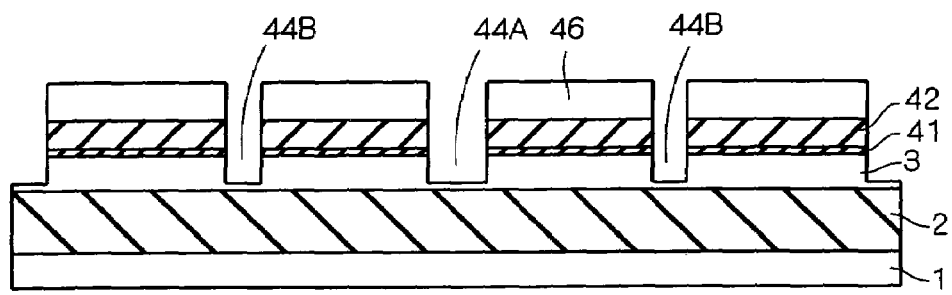

Referring to FIG. 24, the relatively wide partial trenches 44A and the relatively narrow partial trenches 44B are formed. The partial trenches 44A are used for complete isolation, and the partial trenches 44B are used for partial isolation. The partial trenches 44A and 44B are formed so that lower parts of the SOI layer 3 are left.

Figure 25:
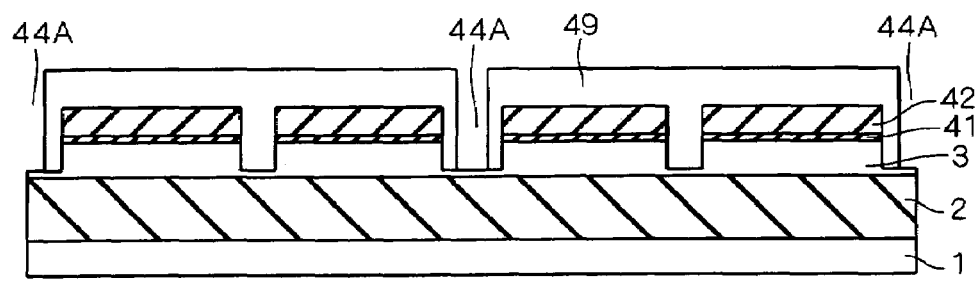

Next, as shown in FIG. 25, the photoresist 49 is patterned so as to entirely fill the partial trenches 44B and to cover the side surfaces of the partial trenches 44A. This ensures that the bottom center portions of the partial trenches 44A are exposed.

Figure 26:
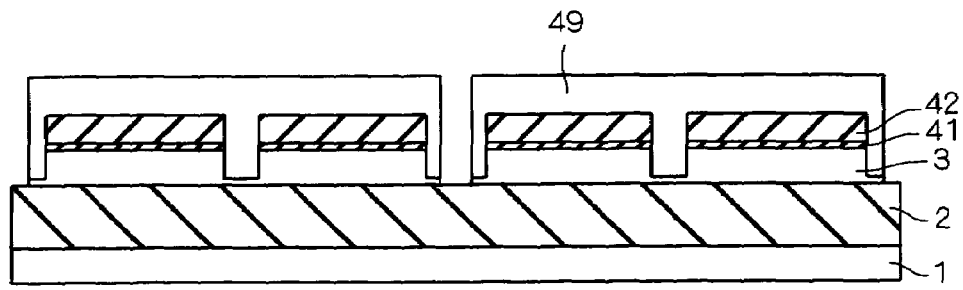

Thereafter, with reference to FIG. 26, silicon etching is performed on the SOI layer 3 using the photoresist 49 as a mask to remove parts of the SOI layer 3 which are not covered with the photoresist 49, including parts of the SOI layer 3 which are positioned under the bottom center portions of the partial trenches 44A, to expose the surface of the buried oxide film 2 in the partial trenches 44A.

Figure 27:
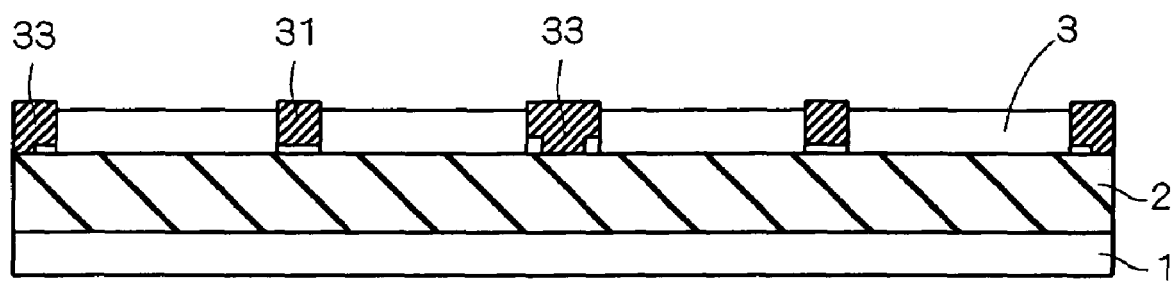

Then, an oxide film is deposited on top of the resultant structure by the HDPCVD process and the like. Polishing is performed by the CMP process in a similar manner to the conventional trench isolation so that the nitride film 42 is removed partway. Thereafter, the nitride film 42 and the oxide film 41 are removed. This provides a structure in which the partial oxide film 31 (with the SOI layer 3 therebeneath), and the oxide film 33 (with the SOI layer 3 therebeneath) are selectively formed, as shown in FIG. 27.

<Fifth Manufacturing Method (Third Form)>

FIGS. 58 through 62 are cross-sectional views showing a further isolation process in the manufacturing method according to the third form of the second preferred embodiment.

Figure 58:
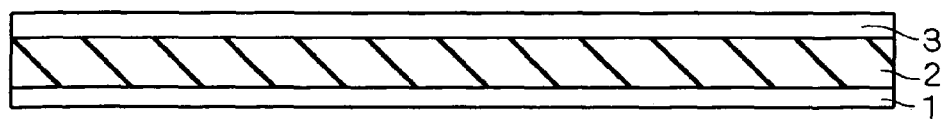
FIGS. 58 through 62 are cross-sectional views showing a fifth isolation process according to the second preferred embodiment.

Initially, as shown in FIG. 58, the starting material is the SOI substrate comprised of the silicon substrate 1, the buried oxide film 2, and the SOI layer 3.

Figure 59:
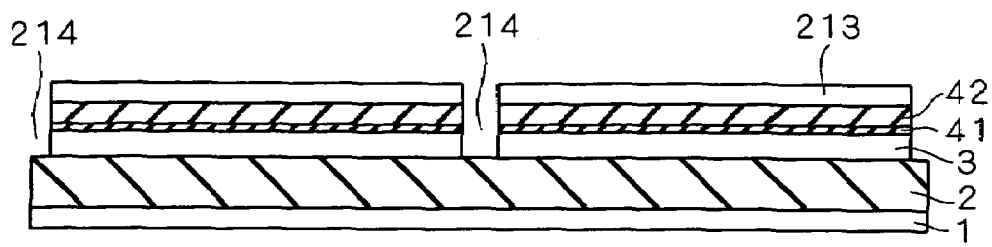

Referring to FIG. 59, the oxide film 41 is deposited on the SOI substrate, and the nitride film 42 is deposited on the oxide film 41. The patterning of the isolation region using a patterned photoresist 213 as a mask etches the nitride film 42, the oxide film 41 and the SOI layer 3 so that the surface of the buried oxide film 2 is exposed, to form a plurality of trenches 214.

Figure 60:
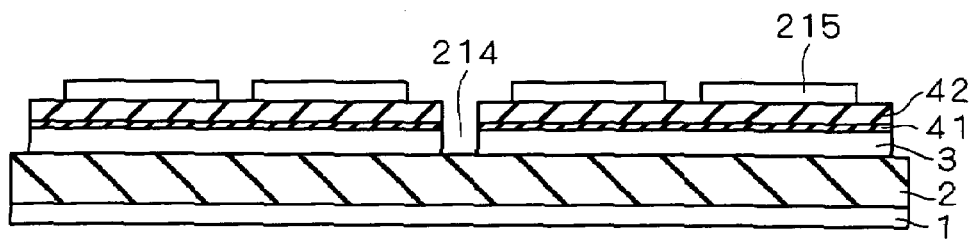

Next, as shown in FIG. 60, a photoresist 215 is selectively formed on the remaining nitride film 42. The photoresist 215 has an opening including each of the trenches 214 and having a width greater than the width of the trenches 214.

Figure 61:
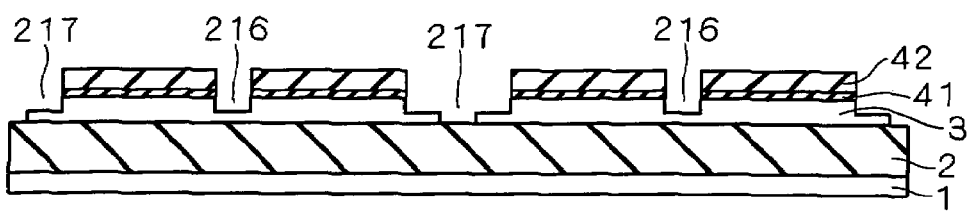

As illustrated in FIG. 61, the nitride film 42, the oxide film 41 and part of the SOI layer 3 are etched by using the photoresist 215 as a mask, to simultaneously form partial trenches 216 with the SOI layer 3 lying therebeneath and combined trenches 217 each including a through part extending through the SOI layer 3 in a central part and a non-through part beneath which the SOI layer 3 remains.

Figure 62:
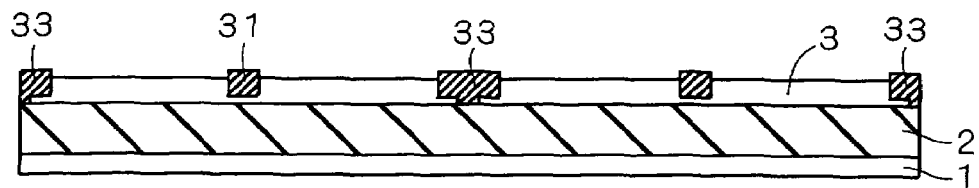

Then, an oxide film is deposited on top of the resultant structure by the HDPCVD process and the like. Polishing is performed by the CMP process in a similar manner to the conventional trench isolation so that the nitride film 42 is removed partway. Thereafter, the nitride film 42 and the oxide film 41 are removed. This provides a structure in which the partial oxide film 31 (with the SOI layer 3 therebeneath), and the oxide film 33 (with the SOI layer 3 beneath the parts thereof) are selectively formed, as shown in FIG. 62.

<Sixth Manufacturing Method (Third Form)>

In an extreme example of the manufacturing method, etching the partial isolation region so that a trench extends through the SOI layer 3 and then filling the trench with an oxide film to change the partial isolation region into a complete isolation region may be performed after the step of forming the gate electrode of a transistor isolated by partial isolation or during the later step of making a contact and an interconnect line.

<Modifications>

The manufacturing methods of the second preferred embodiment include forming the SiN/SiO$_2$ multilayer on the SOI layer for trench isolation, and filling the trenches with the isolation oxide films. Similar effects are provided by other variable methods, e.g. a method including filling the trenches using an SiN/poly-Si/SiO$_2$ multilayer in place of the SiN/SiO$_2$ multilayer, oxidizing the multilayer, and rounding the corners of the trenches.

Third Preferred Embodiment

<First Form>

Figure 28:
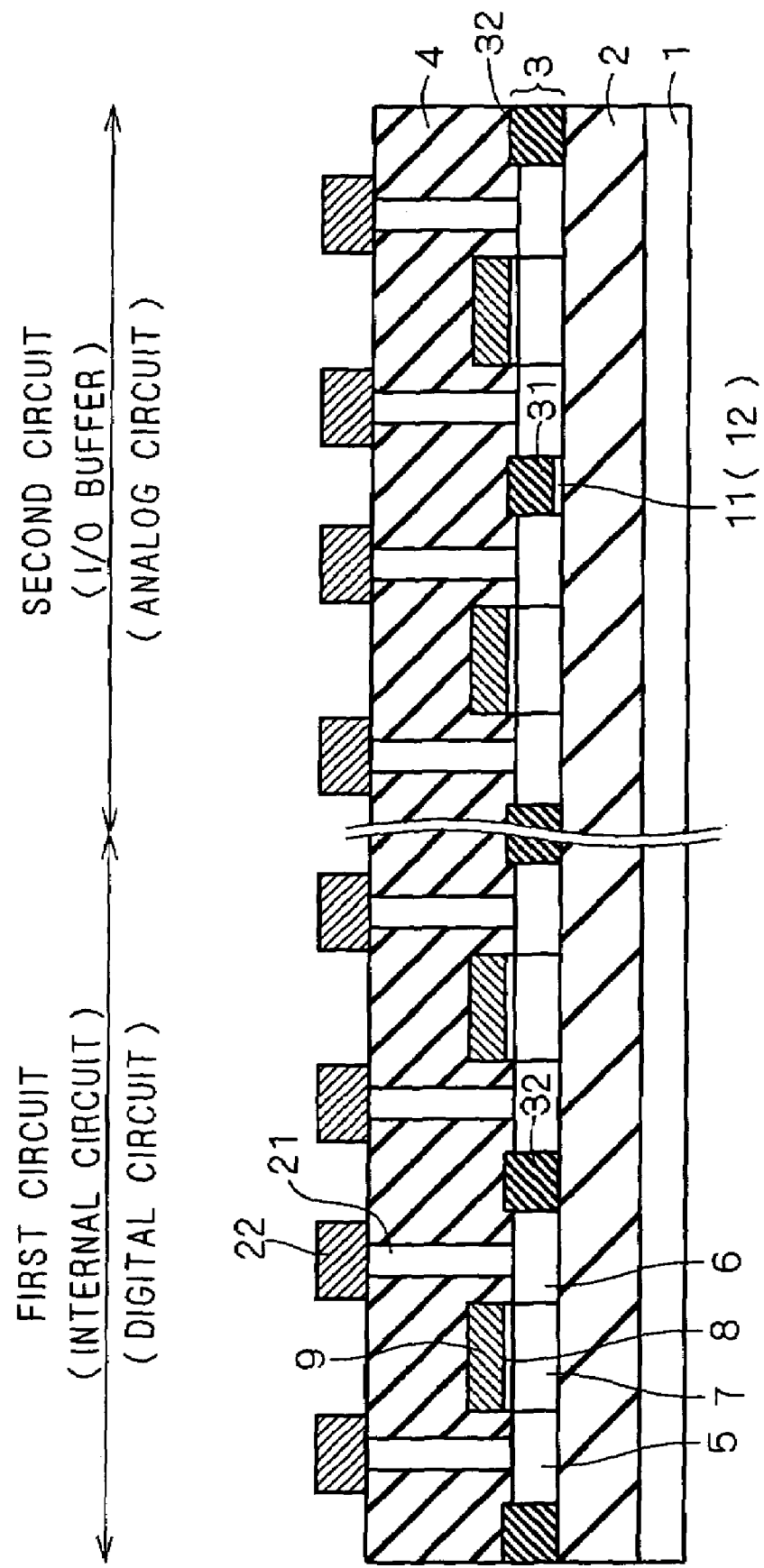
FIG. 28 is a cross-sectional view of a first form of a third preferred embodiment according to the present invention.

FIG. 28 is a cross-sectional view of a first form of the semiconductor device having the SOI structure according to a third preferred embodiment of the present invention.

As shown in FIG. 28, a complete isolation structure using the full oxide film 32 is provided in a region wherein a circuit (first circuit) is to be formed which requires integration (since the partial oxide film 31 has a slightly lower degree of integration than the full oxide film 32 because of the well regions formed therebeneath) but which is less influenced by the floating-substrate effect. On the other hand, a partial isolation structure using the partial oxide film 31 and the well region 11 (12) therebeneath is provided in a region wherein a circuit (second circuit) for which the influence of the floating-substrate effect is a problem is to be formed. The isolation between the region wherein the first circuit is to be formed and the region wherein the second circuit is to be formed is provided by the complete isolation structure using the full oxide film 32.

As illustrated in FIG. 28, examples of the first circuit include an internal circuit and a digital circuit, and examples of the second circuit include an I/O buffer circuit and an analog circuit (a PLL circuit and a sense amplifier circuit). Other examples of the second circuit include a timing circuit, and a dynamic circuit.

Thus, the first form of the third preferred embodiment takes into consideration how much the circuit to be formed is influenced by the floating-substrate effect to select the use of the partial isolation provided by the partial oxide film 31 and the use of the complete isolation provided by the full oxide film 32, thereby achieving the isolation structure which offers an excellent balance of the suppression of the floating-substrate effect and the improvement in integration.

The structure of FIG. 28 may be obtained by using the first to fourth manufacturing methods of the second preferred embodiment to selectively form the partial oxide film 31 and the full oxide film 32 (oxide film 33) for isolation and then to form the first and second circuits.

<Second Form>

Figure 29:
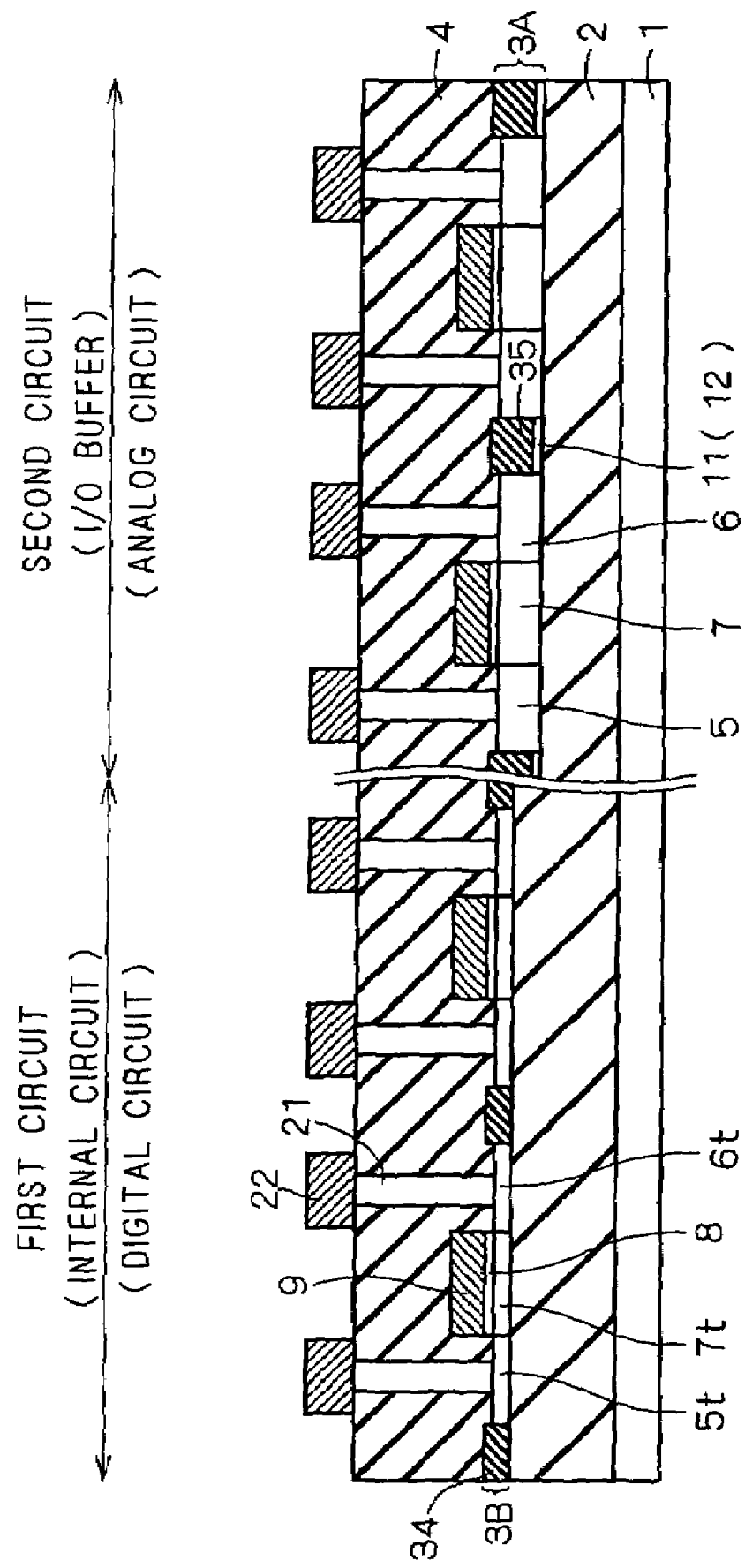
FIG. 29 is a cross-sectional view of a second form of the third preferred embodiment.

FIG. 29 is a cross-sectional view of a second form of the semiconductor device having the SOI structure according to the third preferred embodiment of the present invention. As shown in FIG. 29, a partial SOI layer 3B for the formation of the first circuit to be completely isolated is thinner than a partial SOI layer 3A for the formation of the second circuit to be partially isolated. A full oxide film 34, a drain region 5t, a source region 6t and a channel formation region 7t which are formed in the partial SOI layer 3B are accordingly thinner.

The second form of the third preferred embodiment is characterized in that the partial SOI layer 3B for the formation of the first circuit is thinner than the partial SOI layer 3A for the formation of the second circuit. Thus, etching using the same trench etching conditions allows the separate formation of the partial trenches for the partial SOI layer 3A and the full trenches for the partial SOI layer 3B. Therefore, the second form of the third preferred embodiment simplifies the manufacturing method, for example, the omission of the step shown in FIG. 10 in the first manufacturing method, to provide the complete isolation on the partial SOI layer 3B and the partial isolation on the partial SOI layer 3A.

Regardless of whether the complete isolation or the partial isolation is provided, it is preferable to increase the thickness of the SOI layer for the formation of the I/O buffer circuit, analog circuit (PLL, sense amplifier), timing circuit and dynamic circuit which correspond to the second circuit for which a fixed substrate potential is required. The second form of the third preferred embodiment is reasonable in this regard, and can effectively suppress the rise of temperature using film thickness particularly if it is applied to a protective circuit.

<Third Form>

A third form of the third preferred embodiment features the semiconductor device having the SOI structure in which the complete isolation using at least the full oxide film 32 may be employed as the isolation between a noise source such as an I/O circuit and an RF circuit and other circuits, and the isolation using the partial oxide film 31 may be employed as the isolation of other portions. This reduces the influence of noises upon the internal circuit and minimizes the influence of the floating-substrate effect.

Fourth Preferred Embodiment

Figure 30:
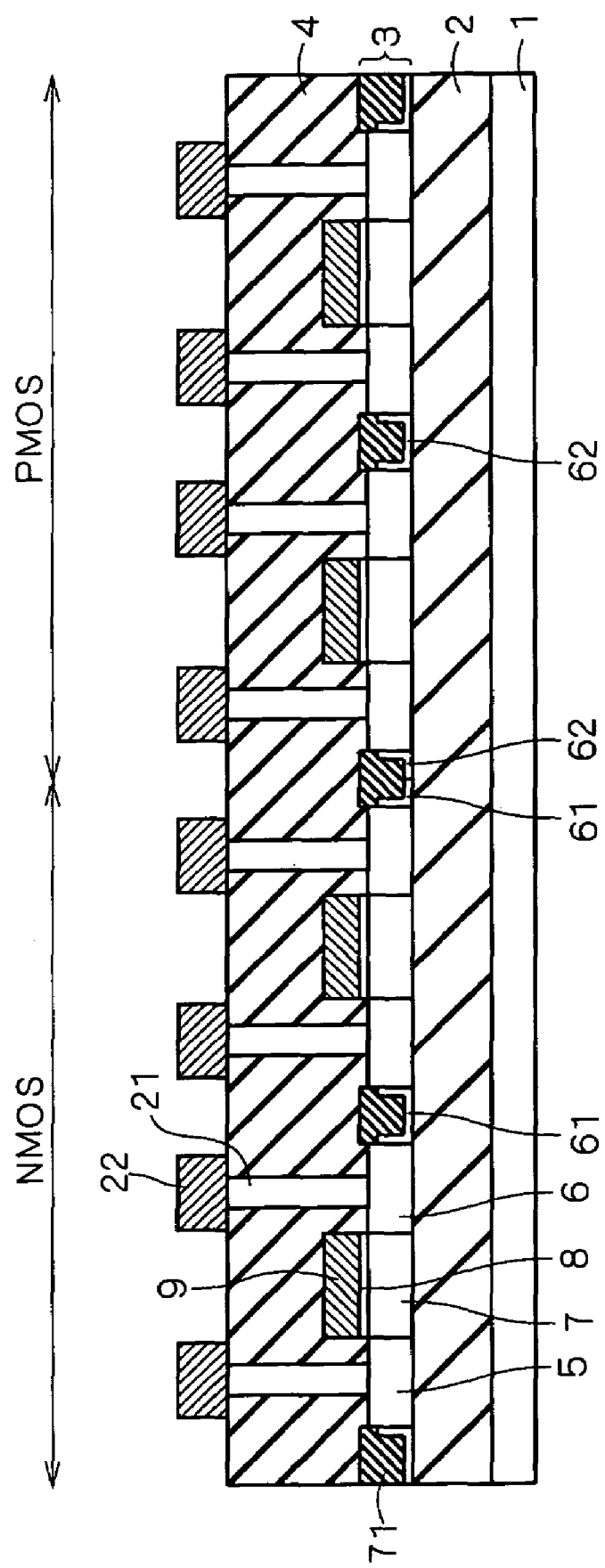
FIGS. 30 and 31 are cross-sectional views of an SOI structure according to a fourth preferred embodiment of the present invention.
Figure 31:
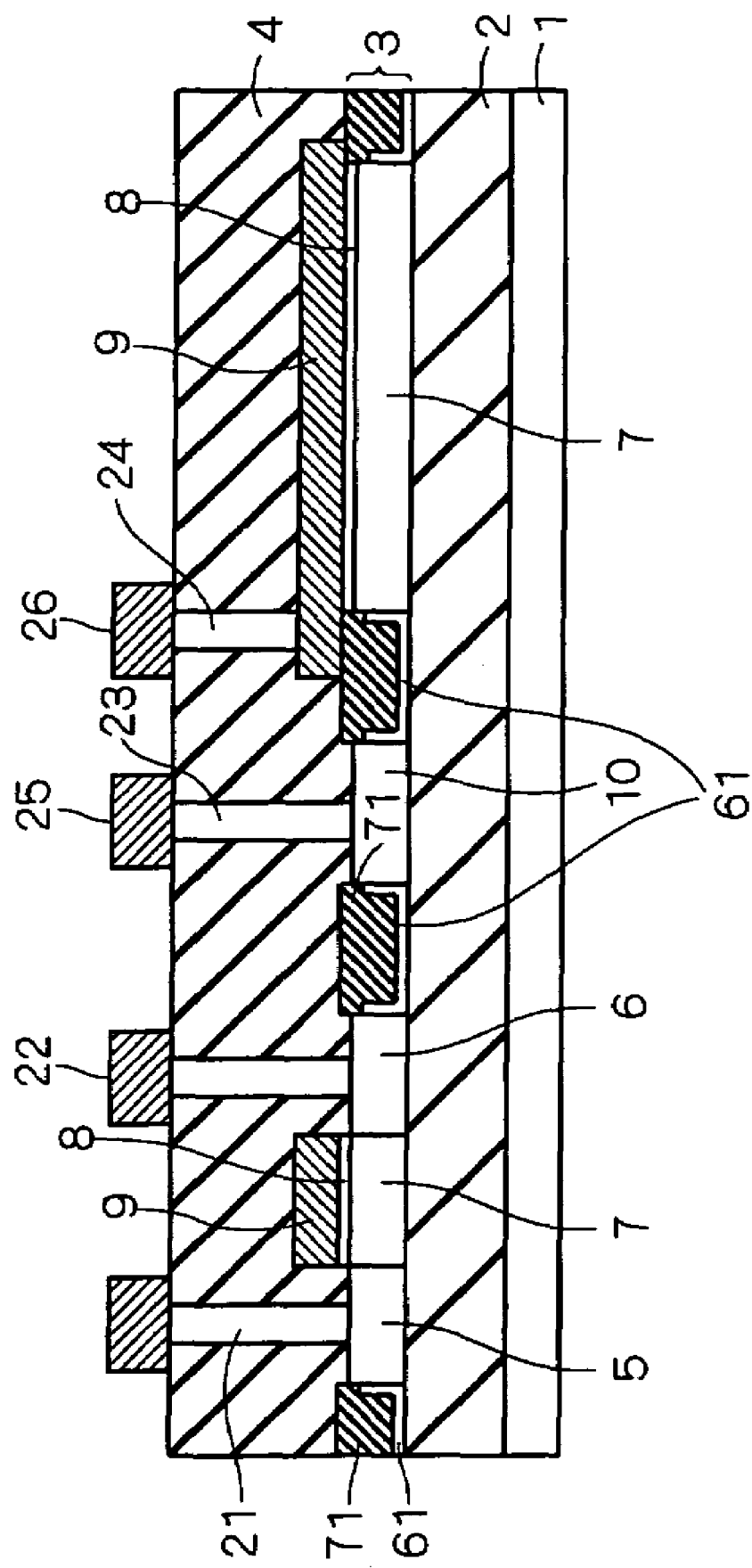

FIGS. 30 and 31 are cross-sectional views of the semiconductor device having the SOI structure according to a fourth preferred embodiment of the present invention, and correspond to the cross sections of the first preferred embodiment taken along the lines A-A and B-B of FIG. 3, respectively.

As shown in FIGS. 30 and 31, the semiconductor device having the SOI structure comprised of the silicon substrate 1, the buried oxide film 2 and the SOI layer 3 is constructed such that a partial oxide film 71 with well regions formed therebeneath isolates the transistor formation regions in the SOI layer 3 from each other. A p-type polysilicon region 61 is formed beneath part of the partial oxide film 71 which isolates NMOS transistors from each other, and an n-type polysilicon region 62 is formed beneath part of the partial oxide film 71 which isolates PMOS transistors from each other. The p-type polysilicon region 61 (closer to NMOS transistors) and the n-type polysilicon region 62 (closer to PMOS transistors) are formed in side-by-side relation beneath part of the partial oxide film 71 which isolates NMOS and PMOS transistors from each other.

As illustrated in FIG. 31, the body region 10 is surrounded by the polysilicon region 61 in the SOI layer 3. The body region 10 is in contact with an adjacent part of the polysilicon region 61. The interconnect layer 25 formed on the interlayer insulation film 4 is electrically connected through the body contact 23 formed in the interlayer insulation film 4 to the body region 10.

Thus, the semiconductor device of the fourth preferred embodiment utilizes the polysilicon regions 61 and 62 formed beneath the partial oxide film 71 as the well regions, and has the electric potential fixed through the body region 10. Therefore, the semiconductor device of the fourth preferred embodiment stabilizes the potential of the channel formation region 7 to reduce the floating-substrate effect.

Figure 32:
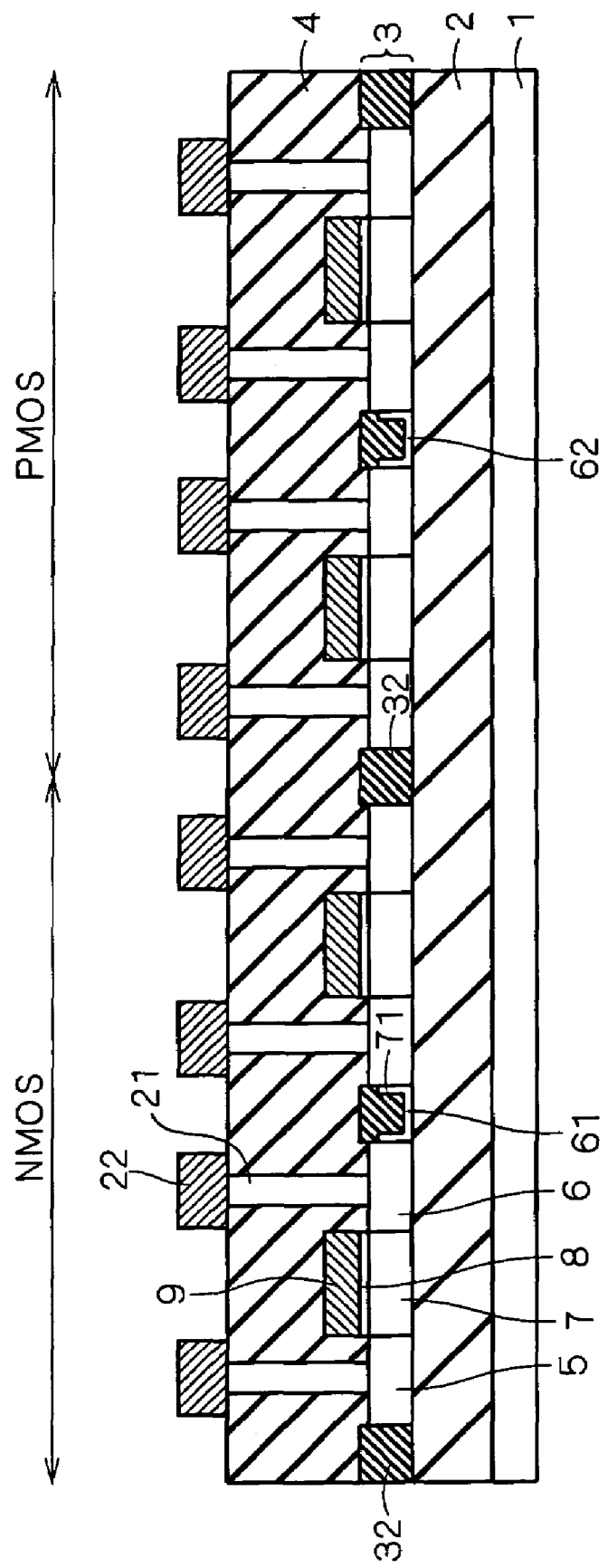
FIG. 32 is a cross-sectional view of another SOI structure according to the fourth preferred embodiment.

Alternatively, as shown in FIG. 32, the partial oxide film 71 and the polysilicon region 61 (62) formed therebeneath may isolate the NMOS transistors from each other and isolate the PMOS transistors from each other, and the full oxide film 32 may provide isolation between the PMOS and NMOS transistors. Such an arrangement is more advantageous than the arrangement shown in FIGS. 30 and 31 in that it reduces the isolation width between the PMOS and NMOS transistors and prevents latchup.

<Manufacturing Method>

FIGS. 33 through 37 are cross-sectional views showing an isolation process in the method of manufacturing the semiconductor device according to the fourth preferred embodiment.

Figure 33:
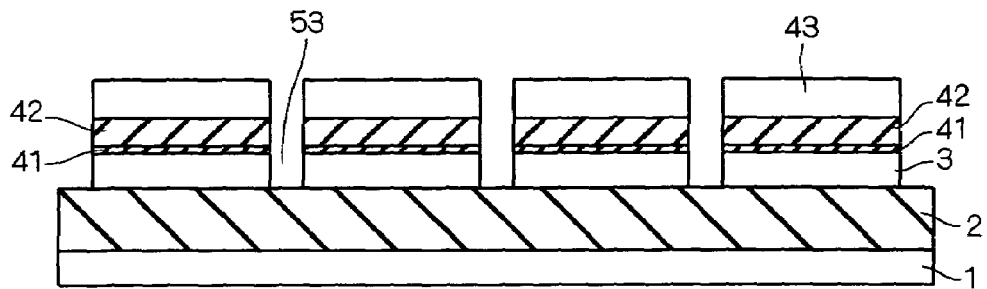
FIGS. 33 through 37 are cross-sectional views showing an isolation process according to the fourth preferred embodiment.

Initially, as shown in FIG. 33, the starting material is the SOI substrate comprised of the silicon substrate 1, the buried oxide film 2 and the SOI layer 3. The oxide film 41 is deposited on the SOI substrate, and the nitride film 42 is deposited on the oxide film 41. The patterning of the isolation region using the patterned photoresist 43 as a mask forms a plurality of trenches 144 extending through a three-layer film comprised of the nitride film 42, the oxide film 41 and the SOI layer 3.

Figure 34:
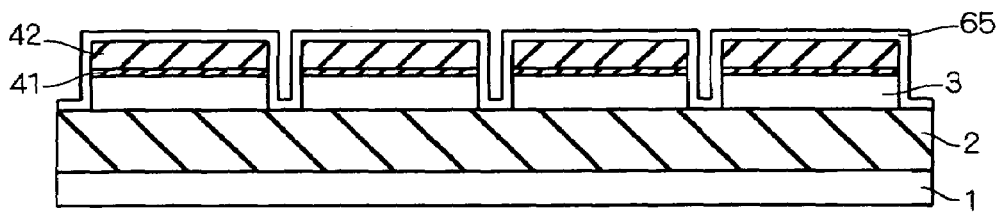
Figure 35:
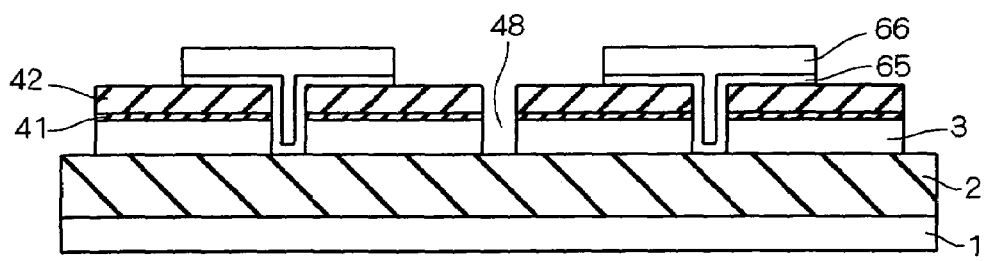

Referring to FIG. 34, a polysilicon layer 65 with a well-controlled film thickness is deposited to entirely cover the resultant structure. Thereafter, as depicted in FIG. 35, a photoresist 66 is formed to cover some of the plurality of trenches 144. The polysilicon layer 65 in the remaining trench 144 which is not covered with the photoresist 66 is etched away to form the full trench 48.

Figure 36:
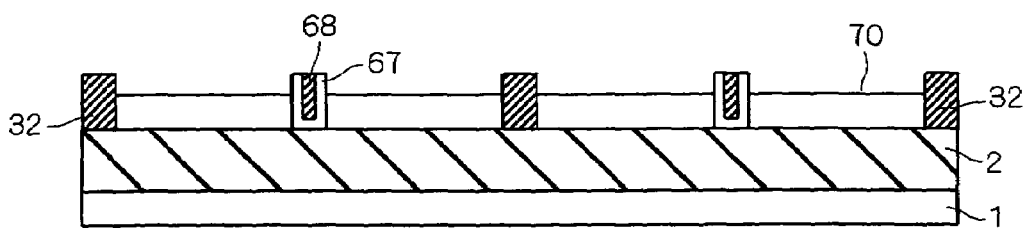

Then, a trench-filling oxide film is deposited to entirely cover the resultant structure by the HDPCVD process and the like. Polishing is performed by the CMP process in a similar manner to the conventional trench isolation so that the nitride film 42 is removed partway. Thereafter, the nitride film 42 and the oxide film 41 are removed. This provides a structure in which a polysilicon region 67, an oxide film 68 remaining therein, and the full oxide film 32 are selectively formed, as shown in FIG. 36.

Figure 37:
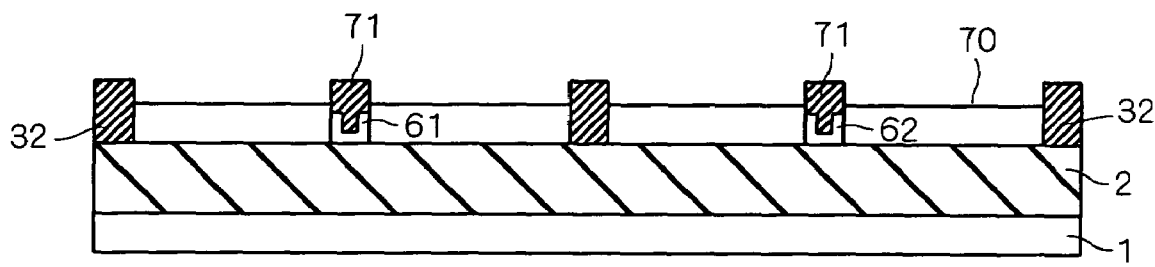

With reference to FIG. 37, the polysilicon region 67 is oxidized to complete a partial isolation structure having the partial oxide film 71 including the oxide film 68 and the oxidized part of the polysilicon region 67, and the polysilicon region 61 (62) left unoxidized.

Since the degree of oxidation of the polysilicon region 67 is higher than that of an oxide film 70 formed on the SOI layer 3, a sufficient level difference is caused between the surface of the SOI layer 3 and the top of the polysilicon region 61 (62) to prevent a short circuit between the gate electrode 9 and the polysilicon region 61 due to defectiveness of the oxide film during the formation of the gate oxide film.

Then, an NMOS transistor is formed in the NMOS transistor formation region and a PMOS transistor is formed in the PMOS transistor formation region by the existing method. This provides the SOI structure shown in FIG. 32.

Fifth Preferred Embodiment

<First Form>

Figure 38:
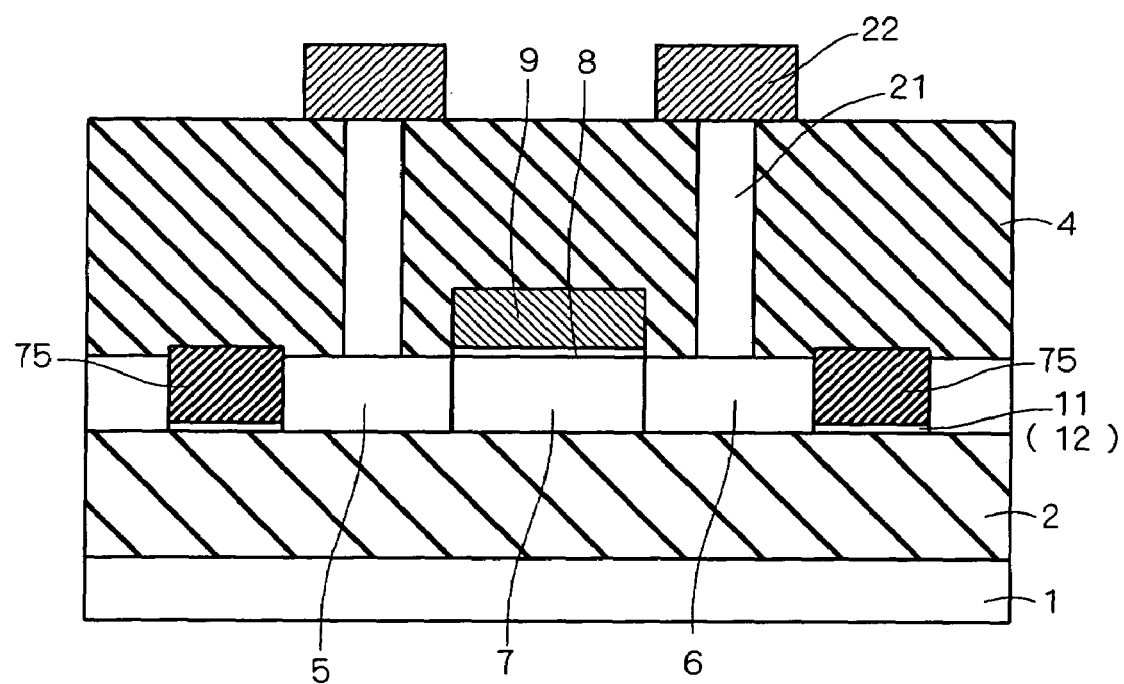
FIG. 38 is a cross-sectional view of a first form of a fifth preferred embodiment according to the present invention.

FIG. 38 is a cross-sectional view of a first form of the semiconductor device having the SOI structure according to a fifth preferred embodiment of the present invention. As shown in FIG. 38, the semiconductor device having the SOI structure comprised of the silicon substrate 1, the buried oxide film 2 and the SOI layer 3 is constructed such that a low dielectric constant film (an insulation film having a dielectric constant lower than that of general insulation films such as the buried oxide film 2) 75 with well regions formed therebeneath isolates the transistor formation regions in the SOI layer 3 from each other. In a similar manner to the first preferred embodiment, the p-type well region 11 is formed beneath part of the low dielectric constant film 75 which isolates NMOS transistors from each other, and the n-type well region 12 is formed beneath part of the low dielectric constant film 75 which isolates PMOS transistors from each other. A p-type well region and an n-type well region (both not shown in FIG. 38) are formed beneath part of the low dielectric constant film 75 which isolates NMOS and PMOS transistors from each other. The electric potential may be fixed through the well regions described above, similar to those of the first preferred embodiment, and the body region electrically connected thereto.

In the SOI structure, the thickness of the SOI layer 3 is in some cases as thin as about 50 nm. At this time, there is a danger that the well region formed beneath the isolating oxide film (the partial oxide film 31 of FIG. 1) is depleted or inverted to cause a leakage current to flow between the transistors to be isolated from each other.

In the first form of the fourth preferred embodiment, the low dielectric constant film 75 is used for device isolation to sufficiently suppress the capacitance thereof even if the thickness thereof is very thin, thereby positively avoiding the generation of the leakage current.

The low dielectric constant film 75 used herein is a silicon oxide film (having a relative dielectric constant on the order of 3.9 to 4) for use as the buried oxide film 2 with fluorine mixed therein, and an organic film, which have a relative dielectric constant of about three.

<Second Form>

Figure 39:
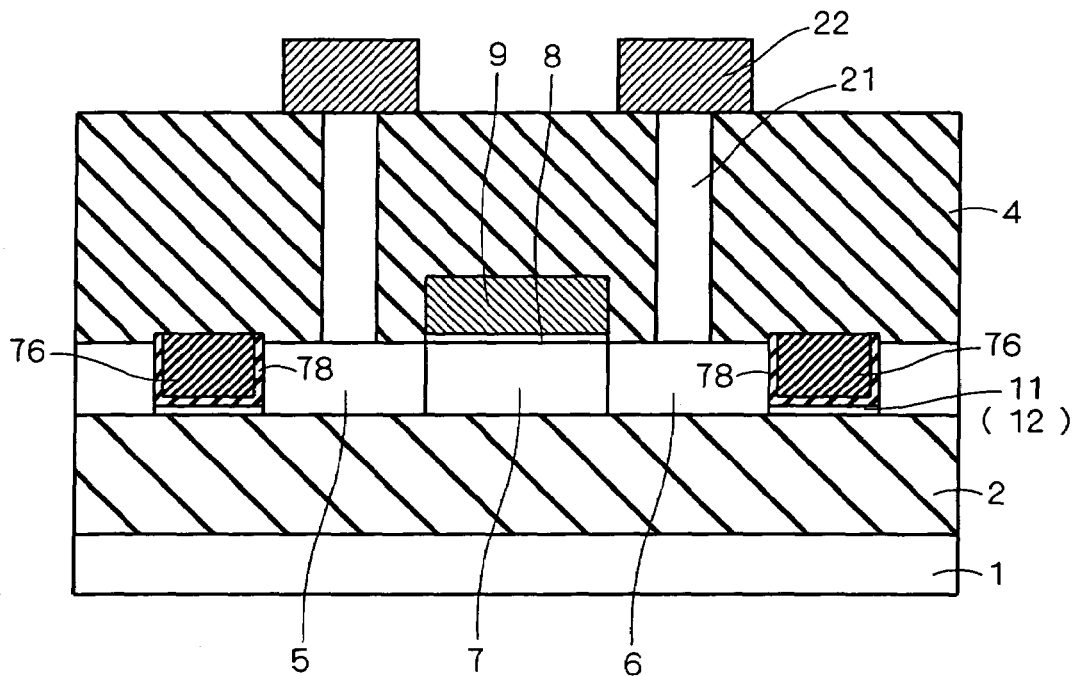
FIG. 39 is a cross-sectional view of a second form of the fifth preferred embodiment.

FIG. 39 is a cross-sectional view of a second form of the fifth preferred embodiment. As shown in FIG. 39, a low dielectric constant film 76 and a silicon oxide film 78 formed on the bottom and side surfaces of the low dielectric constant film 76 are used in place of the low dielectric constant film 75 of FIG. 38 for device isolation. Other components of FIG. 39 are similar to those of the first form shown in FIG. 38.

The silicon oxide film 78 is thus formed on the bottom and side surfaces of the low dielectric constant film 76 to positively suppress the generation of defects at the interface with silicon (drain region 5, source region 6, well regions 11 and 12 and the like) and electric charges at the interface. The silicon oxide film 78 is formed using the thermal oxidation and CVD techniques.

<Third Form>

Figure 40:
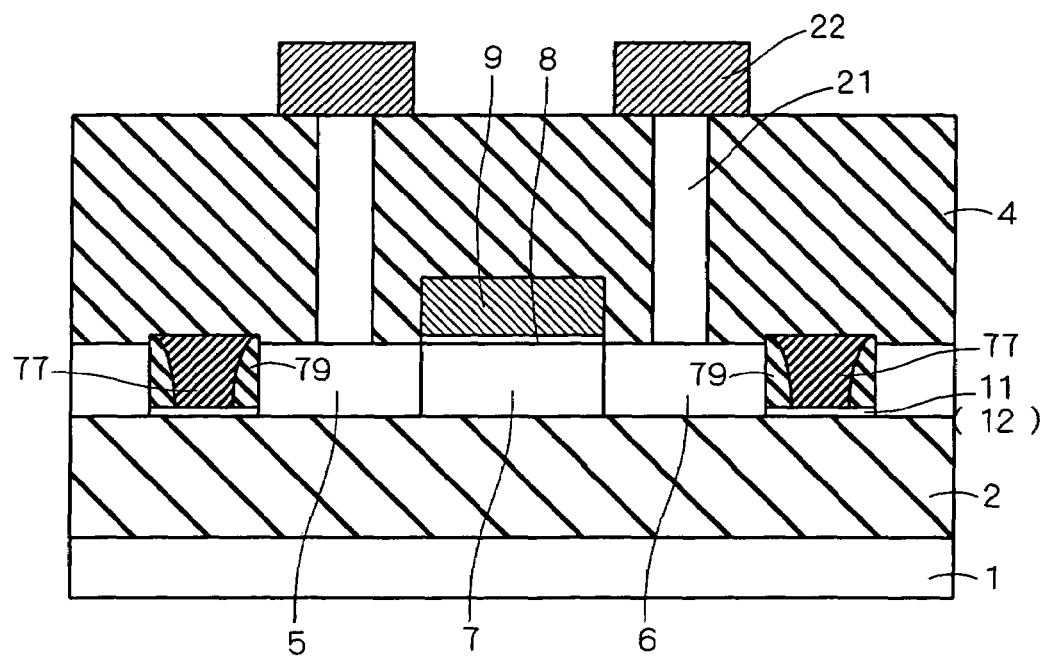
FIG. 40 is a cross-sectional view of a third form of the fifth preferred embodiment.

FIG. 40 is a cross-sectional view of a third form of the fifth preferred embodiment. As shown in FIG. 40, a low dielectric constant film 77 and a silicon oxide film 79 formed on the side surfaces of the low dielectric constant film 77 are used in place of the low dielectric constant film 75 of FIG. 38 for device isolation. Other components of FIG. 40 are similar to those of the first form shown in FIG. 38.

The silicon oxide film 79 is thus formed on the side surfaces of the low dielectric constant film 77 with the primary aim of positively suppressing the generation of defects at the interface with silicon (drain region 5 and source region 6) disposed in lateral relation therewith and also with the channel formation region 7 and electric charges at the interface.

Sixth Preferred Embodiment

<First Form>

Figure 41:
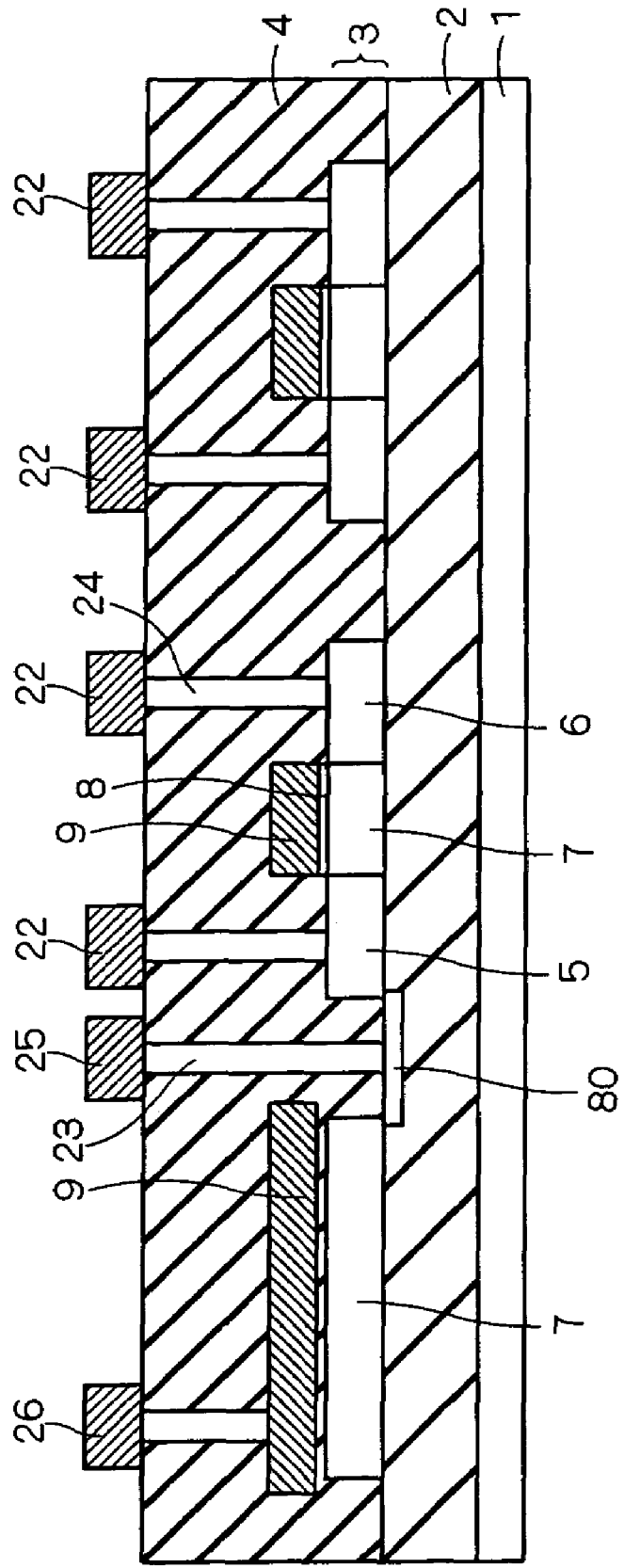
FIG. 41 is a cross-sectional view of a first form of a sixth preferred embodiment according to the present invention.

FIG. 41 is a cross-sectional view of a first form of the semiconductor device having the SOI structure according to a sixth preferred embodiment of the present invention.

As shown in FIG. 41, the interlayer insulation film 4 (although a portion corresponding to the full oxide film 32 is also illustrated as the interlayer insulation film 4) completely isolates the devices from each other. A connection region 80 serving as a body region is formed in an upper portion of the buried oxide film 2, and parts of the connection region 80 are in contact with the bottom surfaces of the end portions of the SOI layer 3 (the drain region 5 and the channel formation region 7 in FIG. 41) to maintain electric connection thereto. The connection region 80 is of the same conductivity type as the channel formation region 7. Like reference numerals are used to designates components similar to those of FIGS. 1 and 2, and the description thereon will be dispensed with.

Thus, the semiconductor device of the first form of the sixth preferred embodiment is designed such that the connection region 80 serving as the body region is provided in the upper portion of the buried oxide film 2, rather than in the SOI layer 3, to provide a level difference at least equal to or greater than the thickness of the SOI layer 3 from the gate electrode 9. As a result, the first form of the sixth preferred embodiment can positively avoid a troublesome short circuit between the gate electrode 9 and the connection region 80 during the manufacture.

<Second Form>

Figure 42:
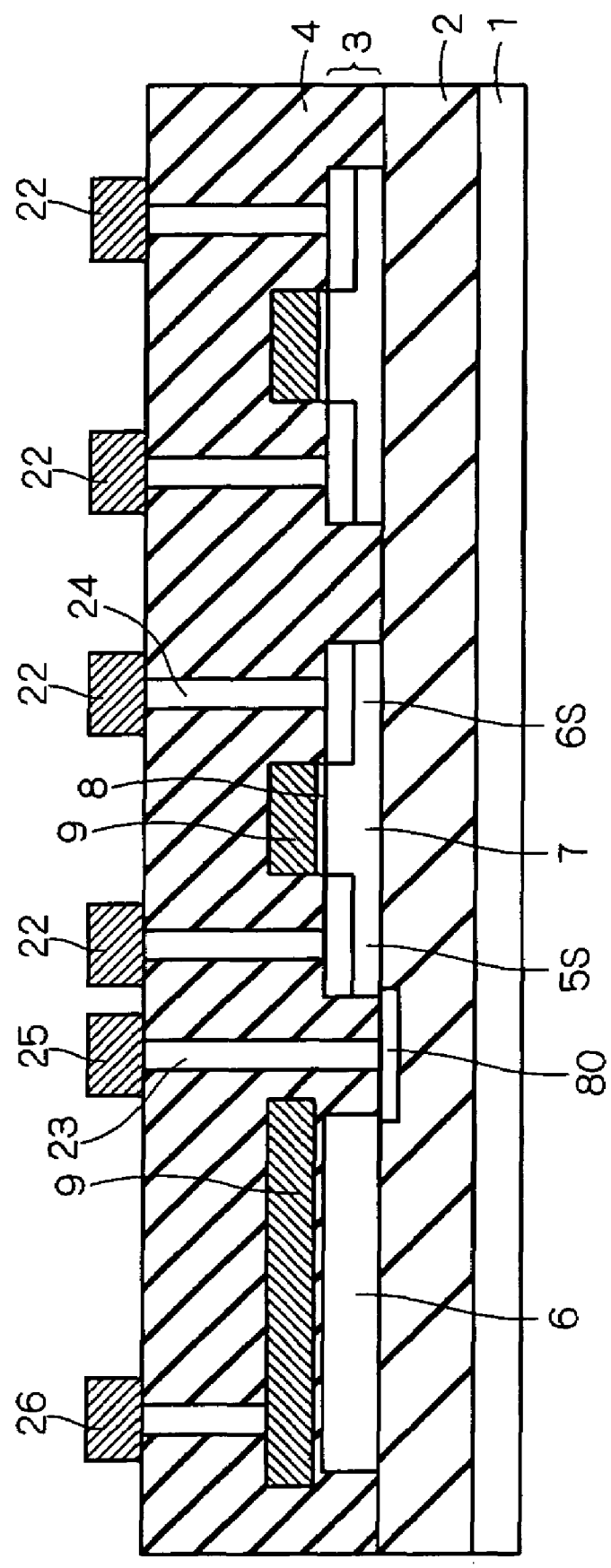
FIG. 42 is a cross-sectional view of a second form of the sixth preferred embodiment.

FIG. 42 is a cross-sectional view of a second form of the semiconductor device having the SOI structure according to the sixth preferred embodiment of the present invention.

As shown in FIG. 42, the shallow drain region 5s and the shallow source region 6s are formed in the upper portion of the SOI layer 3. Other components of FIG. 42 are similar to those of the first form shown in FIG. 41.

Thus, the semiconductor device according to the second form of the sixth preferred embodiment is designed such that the shallow drain region 5s and the shallow source region 6s are formed in the upper portion of the SOI layer 3 to maintain contact with the connection region 80 and to positively avoid a leakage current.

<Concept of Manufacturing Method>

Figure 43:
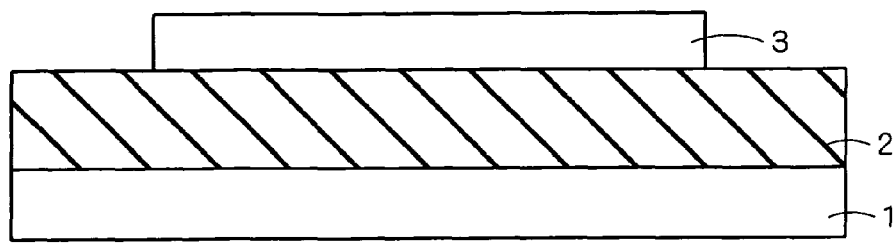
FIGS. 43 through 45 are cross-sectional views showing a first connection region formation process according to the sixth preferred embodiment.
Figure 44:
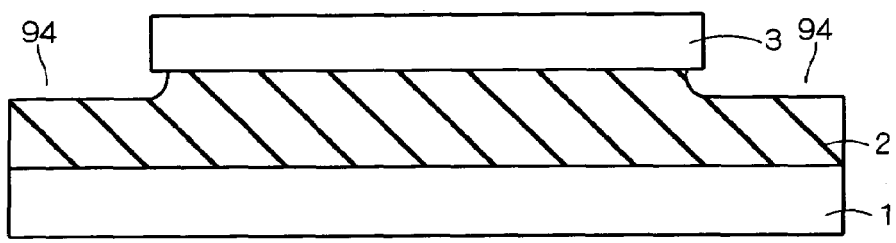
Figure 45:
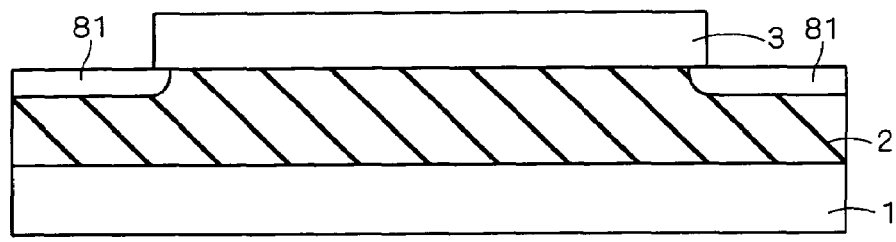

FIGS. 43 through 45 are cross-sectional views conceptually showing the process of forming a polysilicon region serving as the connection region 80.

First, as shown in FIG. 43, the SOI structure comprised of the silicon substrate 1, the buried oxide film 2 and the SOI layer 3 is prepared, and the SOI layer 3 is selectively removed from the surface of the SOI structure to form a trench-isolated device formation region.

Referring to FIG. 44, wet etching is performed on the buried oxide film 2 using the SOI layer 3 as a mask to remove parts of the buried oxide film 2 which underlie the bottom surface of the end portions of the SOI layer 3 and upper parts of the buried oxide film 2 which are not covered with the SOI layer 3, thereby forming holes 94.

As illustrated in FIG. 45, the holes 94 are filled with polysilicon to form a polysilicon region 81 for the connection region 80.

<First Manufacturing Method>

Figure 46:
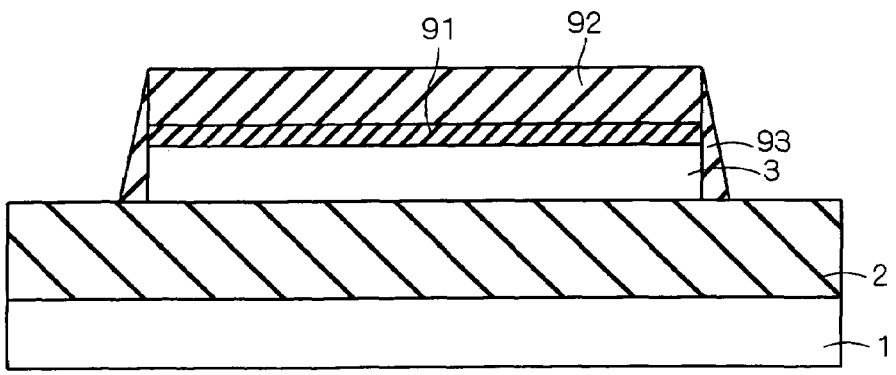
FIGS. 46 through 48 are cross-sectional views showing a second connection region formation process according to the sixth preferred embodiment.
Figure 47:
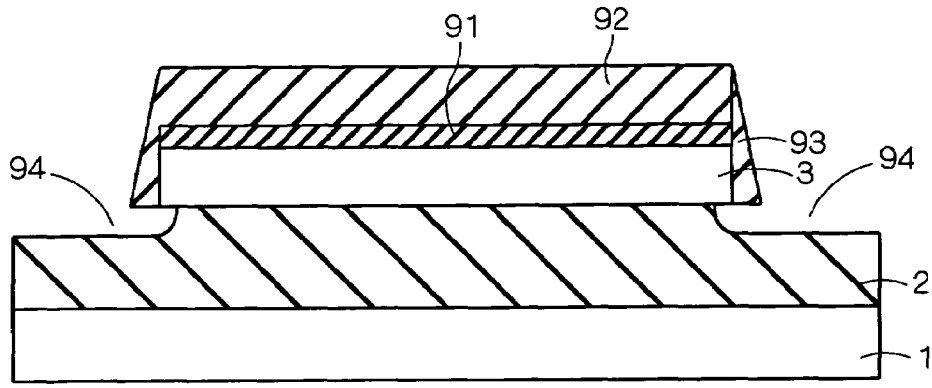
Figure 48:
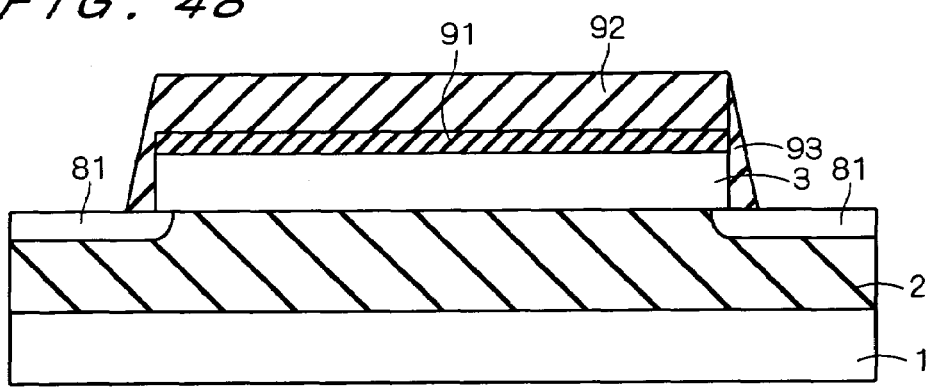

FIGS. 46 through 48 are cross-sectional views showing a first process for forming the polysilicon region serving as the connection region 80 in greater detail.

First, as shown in FIG. 46, a silicon oxide film 91 is deposited on the SOI layer 3 of the SOI substrate, and a silicon nitride film 92 is deposited on the silicon oxide film 91. The SOI layer 3, the silicon oxide film 91 and the silicon nitride film 92 are patterned for trench isolation. Sidewall silicon nitride films 93 are formed on the side surfaces of the patterned SOI layer 3, silicon oxide film 91 and silicon nitride film 92.

With reference to FIG. 47, wet etching is performed on the buried oxide film 2 using the silicon nitride film 92 and the sidewall silicon nitride films 93 as a mask to remove parts of the buried oxide film 2 which underlie the bottom surface of the end portions of the SOI layer 3 and upper parts of the buried oxide film 2 which are not covered with the SOI layer 3 but are exposed, thereby forming the holes 94.

Thereafter, as illustrated in FIG. 48, a polysilicon layer is deposited on top of the resultant structure, and is then etched back by dry etching to fill the holes 94 with polysilicon, thereby forming the polysilicon region 81 serving as the connection region 80.

Subsequently, the step shown in FIG. 11 is performed. Specifically, the plurality of device formation regions are insulated from each other by filling the trenches with the oxide film or by other methods, and the connection region 80 is allowed to externally fix the electric potential. Then, predetermined devices are formed in the plurality of device formation regions, respectively. This completes the structure shown in FIG. 41 or FIG. 42.

<Second Manufacturing Method>

Figure 49:
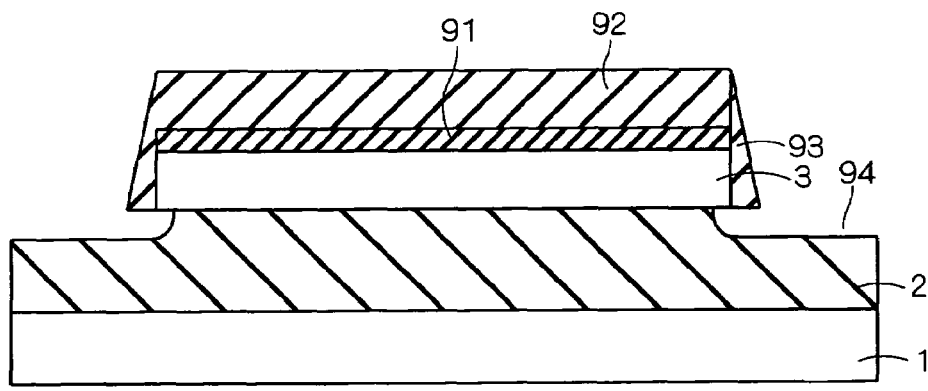
FIGS. 49 through 51 are cross-sectional views showing a third connection region formation process according to the sixth preferred embodiment.
Figure 50:
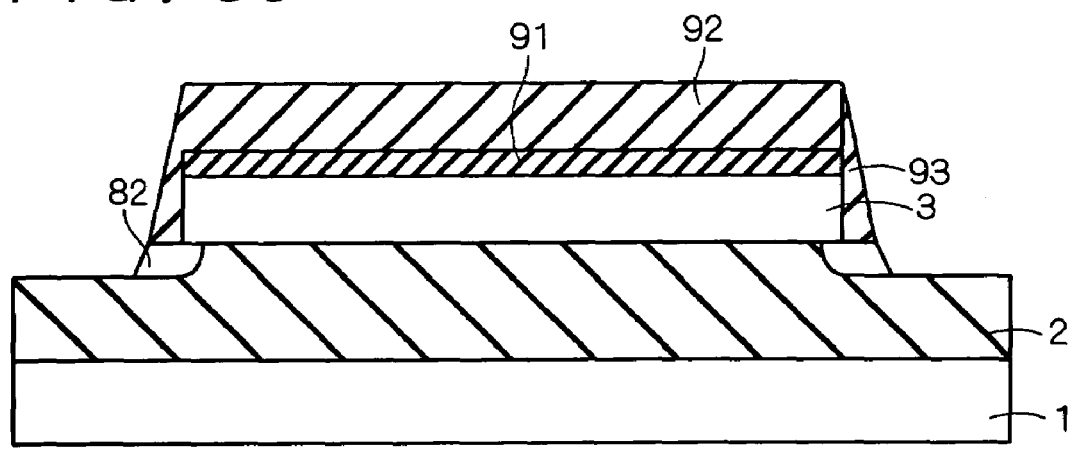
Figure 51:
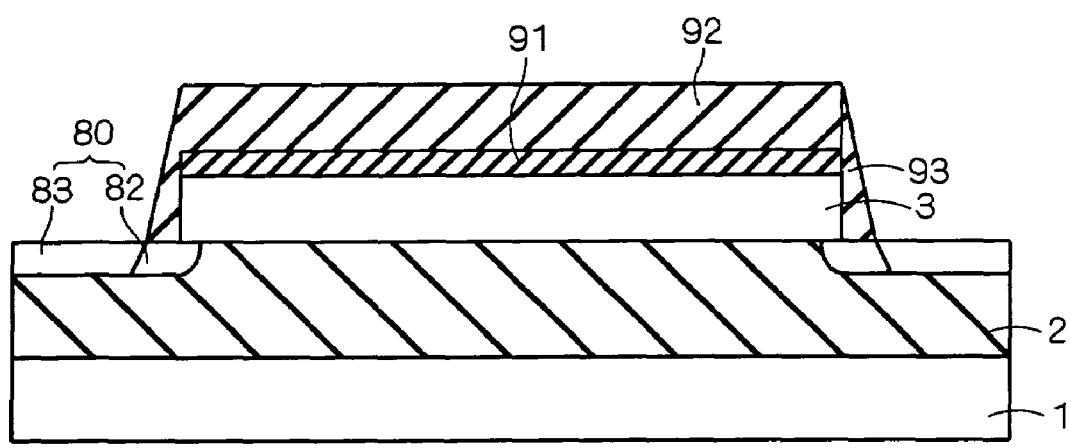

FIGS. 49 through 51 are cross-sectional views showing a second process for forming the polysilicon region serving as the connection region 80 in detail.

First, as shown in FIG. 46, the SOI layer 3, the silicon oxide film 91 and the silicon nitride film 92 are patterned for trench isolation. The sidewall silicon nitride films 93 are formed on the side surfaces of the patterned SOI layer 3, silicon oxide film 91 and silicon nitride film 92.

With reference to FIG. 49, wet etching is performed on the buried oxide film 2 using the silicon nitride film 92 and the sidewall silicon nitride films 93 as a mask to remove parts of the buried oxide film 2 which underlie the bottom surface of the end portions of the SOI layer 3 and upper parts of the buried oxide film 2 which are not covered with the SOI layer 3, thereby forming the holes 94.

Next, as depicted in FIG. 50, epitaxially grown layers 82 are formed under the sidewall silicon nitride films 93 by the epitaxial growth from the exposed bottom surface of the SOI layer 3.

Thereafter, as illustrated in FIG. 51, a polysilicon layer is deposited on top of the resultant structure, and is then etched back to fill the holes 94 with polysilicon, thereby forming polysilicon regions 83 for the connection region 80. Consequently, the epitaxially grown layers 82 and the polysilicon regions 83 constitute the connection region 80.

Subsequently, the plurality of device formation regions are insulated from each other by filling the trenches with the oxide film or by other methods, and the connection region 80 is allowed to externally fix the electric potential. Then, predetermined devices are formed in the plurality of device formation regions, respectively. This completes the structure shown in FIG. 41 or FIG. 42.

The structure of the second form of the sixth preferred embodiment includes the epitaxially grown layers 82 to provide a sufficient distance between the polysilicon regions 83 and a PN junction formed by the drain region 5 or the source region 6 and the channel formation region 7, providing satisfactory electrical characteristics.

<Third Form>

Figure 52:
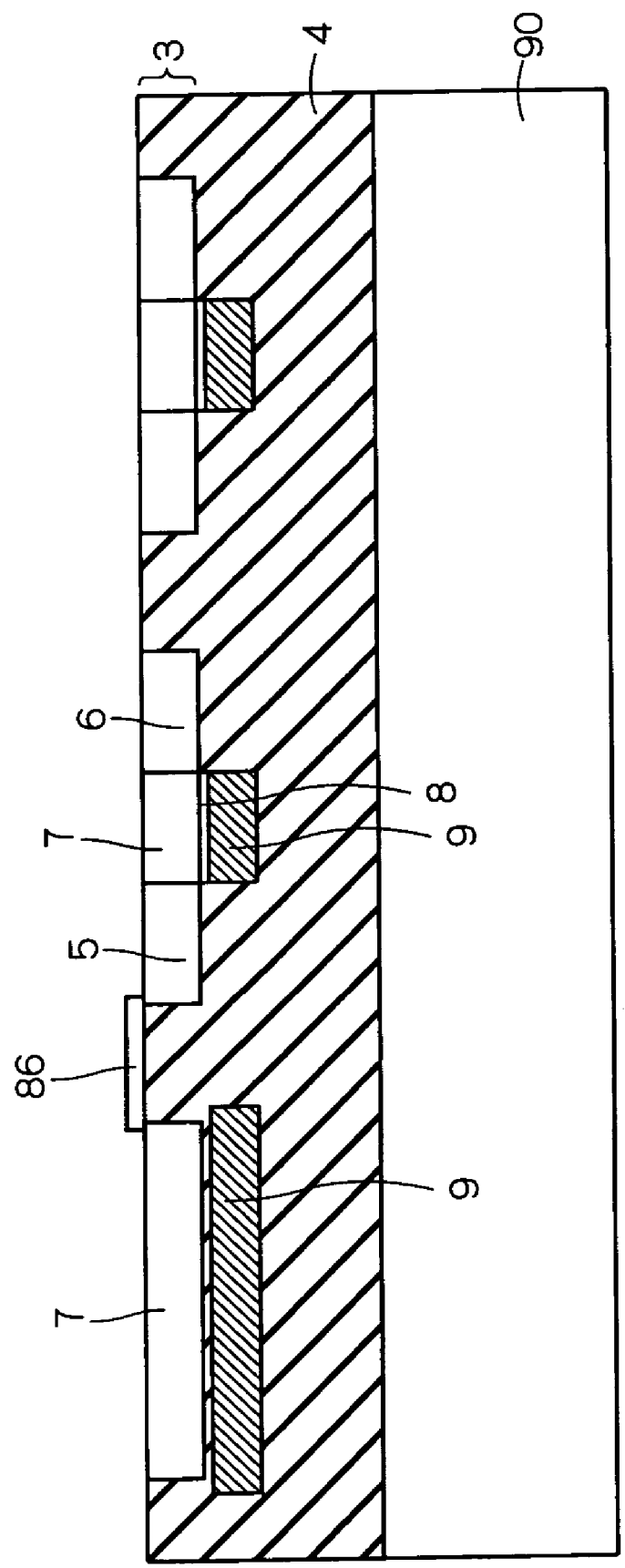
FIG. 52 is a cross-sectional view of a third form of the sixth preferred embodiment.

FIG. 52 is a cross-sectional view of a third form of the sixth preferred embodiment. The structure shown in FIG. 52 is provided by removing the silicon substrate 1 and the buried oxide film 2 by polishing from the structure shown in FIG. 41 (except the connection region 80, the body contact 23, the gate contact 24 and the interconnect layers 22 and 25), turning the resultant structure upside down, bonding a silicon substrate 90 to a new bottom surface, and forming a connection region 86 on a new top surface. Thus, the SOI structure comprises the silicon substrate 90, the interlayer insulation film 4, and a device formation region (including the drain region 5, the source region 6, the channel formation region 7, and the like).

The structure of the third form of the sixth preferred embodiment includes the connection region 86 on the top surface as a consequence to facilitate the manufacturing step thereof.

<Fourth Form>

Figure 53:
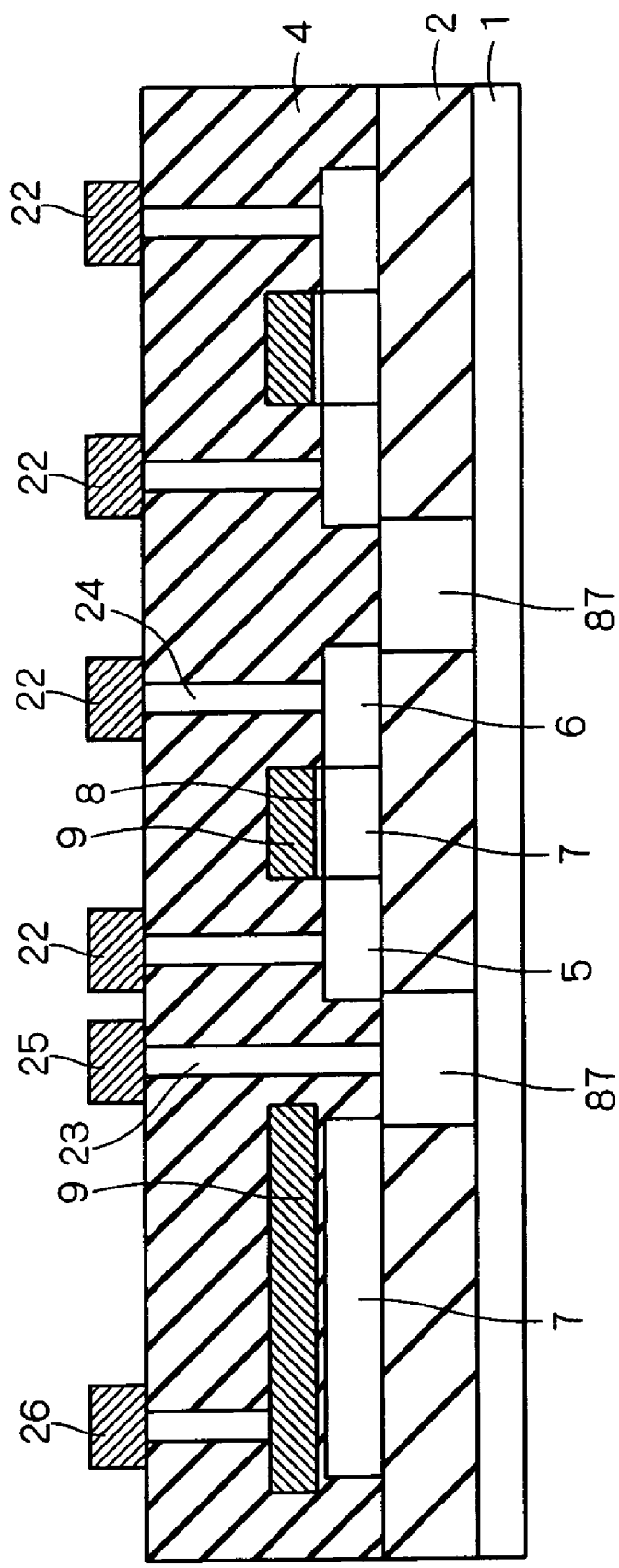
FIG. 53 is a cross-sectional view of a fourth form of the sixth preferred embodiment.
Figure 54:
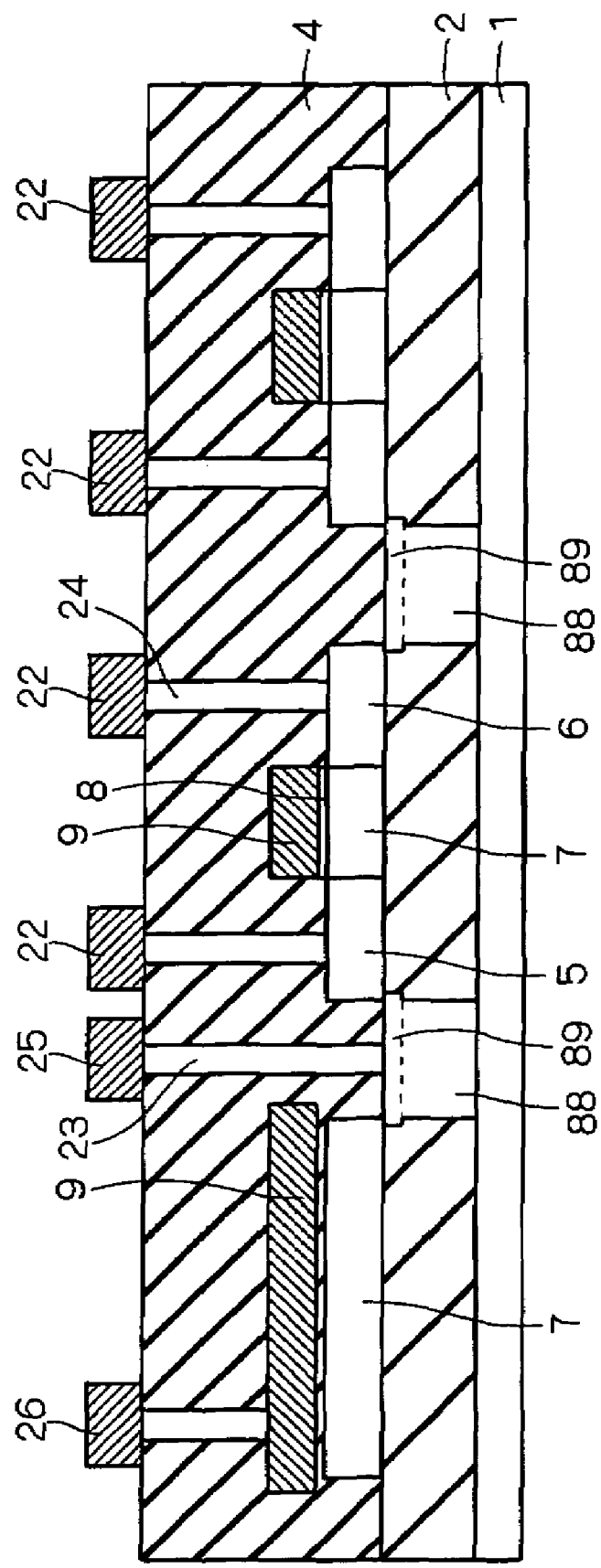
FIG. 54 is a cross-sectional view of a fifth form of the sixth preferred embodiment.

FIG. 53 is a cross-sectional view of a fourth form of the sixth preferred embodiment. As shown in FIG. 53, connection regions 87 are formed vertically through the buried oxide film 2. Other components of FIG. 53 are similar to those of the first form shown in FIG. 41.

Thus, the fourth form of the sixth preferred embodiment is designed such that the connection regions 87 extend through the buried oxide film 2 to fix the electric potential from the silicon substrate 1 serving as a support substrate. Each of the connection regions 87 may be formed by forming a through opening comprised of a hole 89 formed in an upper part of the buried oxide film 2 by wet etching, and a through portion 88 formed vertically through the buried oxide film 2 which has no lateral area increase by dry etching, and then filling the through opening with polysilicon and the like. This provides the connection regions 87 extending vertically through the buried oxide film 2 while suppressing the lateral area increase of the through opening when formed.

Seventh Preferred Embodiment

Figure 63:
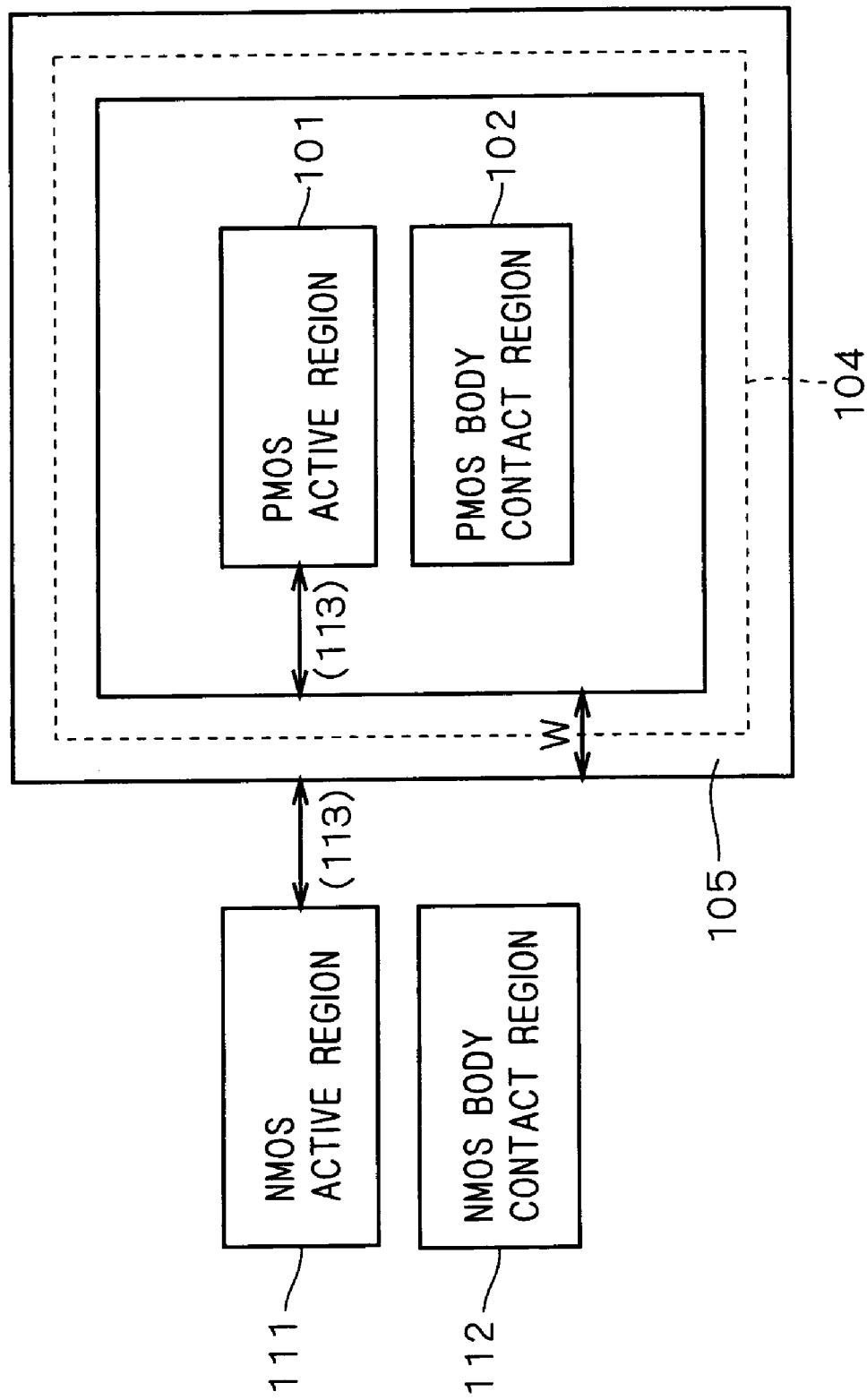
FIG. 63 illustrates a method of defining a complete isolation region according to a seventh preferred embodiment of the present invention.

FIG. 63 is a plan view for illustrating a method of designing a complete isolation region in the semiconductor device having the SOI structure according to a seventh preferred embodiment of the present invention. As shown in FIG. 63, a general configuration of a CMOS transistor is such that a PMOS active region 101 and a PMOS body contact region 102 are selectively formed in a virtual n well region 104, and an NMOS active region 111 and an NMOS body contact region 112 are selectively formed in a P region (not shown) outside the virtual n well region 104.

When the combined isolation region illustrated in the third form (FIG. 7) of the second preferred embodiment provides isolation between the NMOS and PMOS transistors, the virtual n well region 104 substantially corresponds to the partial isolation region, and the complete isolation region is continuous with the partial isolation region.

There is a high possibility that layout data accumulated in the past is available to construct a layout of the semiconductor device using the combined isolation region.

Therefore, the complete isolation region is automatically generated by executing a designing method comprising the steps of:

(1) obtaining the past data concerning a CMOS device including a PMOS transistor inside a well region and an NMOS transistor outside the well region;

(2) defining first and second MOS transistor formation regions (the PMOS active region 101, the PMOS body contact region 102, the NMOS active region 111 and the NMOS body contact region 112) based on the past data; and (3) defining a complete isolation region 105 in the vicinity of the outer periphery of the virtual n well region 104, assuming a well region in the past data as the virtual n well region 104.

Since the virtual n well region 104 generally makes a distinction between the NMOS and PMOS regions, the definition of the complete isolation region based on the virtual n well region 104 provides effective isolation between the NMOS and PMOS transistors.

In the instance shown in FIG. 63, the complete isolation region 105 is defined so that an outer periphery thereof is outwardly spaced a distance W/2 that is one-half the complete isolation width W apart from the outer periphery of the virtual n well region 104 and an inner periphery thereof is inwardly spaced the distance W/2 apart therefrom.

Thus, the complete isolation region is automatically defined based on the complete isolation width W in the vicinity of the outer periphery of the well region in the past data for the manufacture of the conventional CMOS transistor.

Further, a partial isolation region 113 may be defined in continuous relation with the virtual n well region 104 except in the PMOS active region 101, the PMOS body contact region 102, the virtual n well region 104, the NMOS active region 111 and the NMOS body contact region 112. The combined isolation region including the complete isolation region 105 and the partial isolation region 113 is thus designed.

Eighth Preferred Embodiment

<Latchup Phenomenon>

Figure 64:
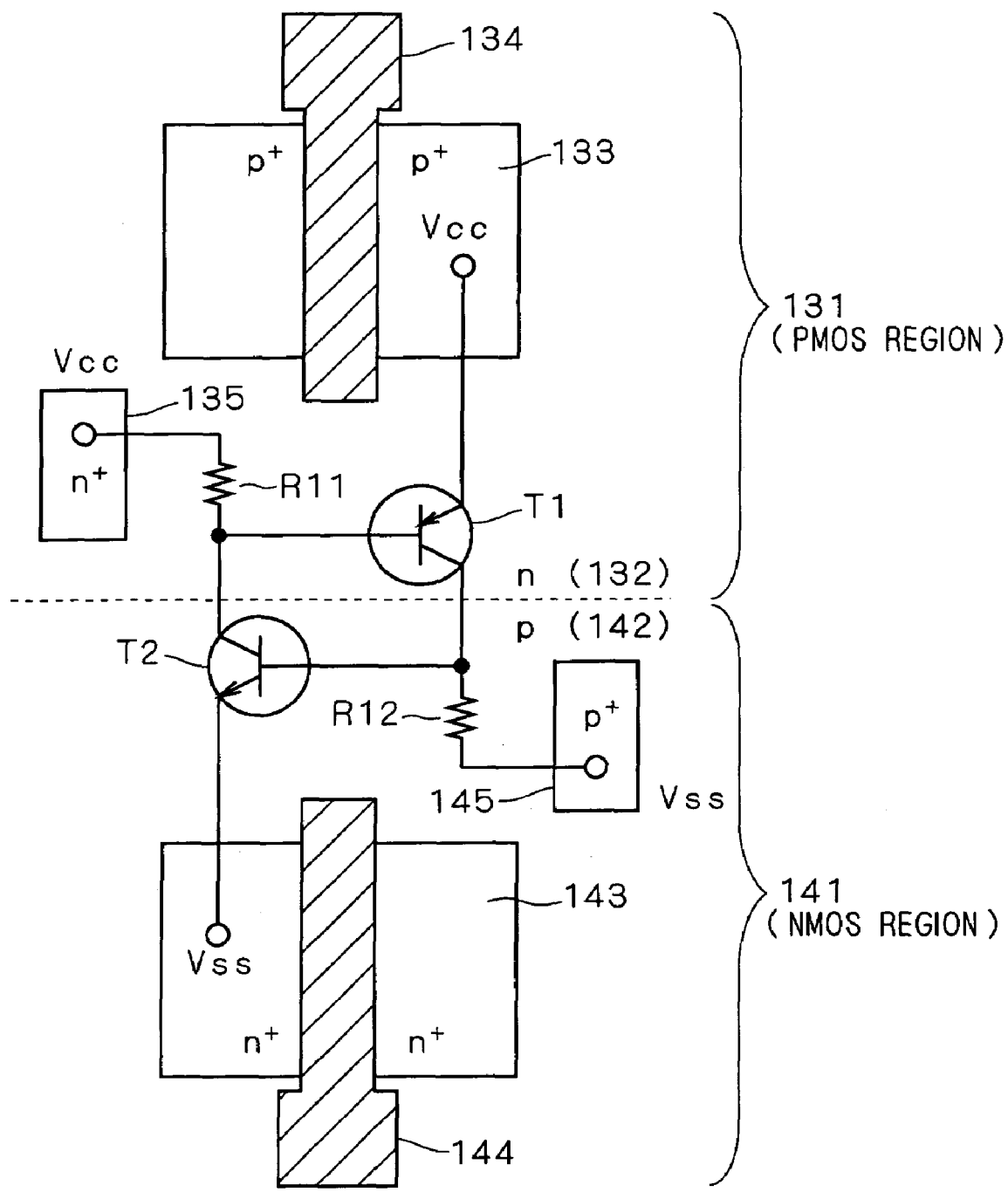
FIG. 64 illustrates latchup.

The latchup phenomenon will be described with reference to FIG. 64. As shown in FIG. 64, a CMOS structure having a PMOS region 131 and an NMOS region 141 which are adjacent to each other includes a parasitic bipolar transistor T1 comprised of a PMOS active region 133 in the PMOS region 131, an n well region 132 in the PMOS region 131 and a p well region 142 in the NMOS region 141, and a parasitic bipolar transistor T2 comprised of an NMOS active region 143 in the NMOS region 141, the p well region 142 in the NMOS region 141 and the n well region 132 in the PMOS region 131.

An $n^+$ body contact region 135 is connected to the base of the parasitic bipolar transistor T1 through a resistance element R11 of the n well region 132. Likewise, a $p^+$ body contact region 145 is connected to the base of the parasitic bipolar transistor T2 through a resistance element R12 of the p well region 142. The $n^+$ body contact region 135 is set at a power supply voltage Vcc and the $p^+$ body contact region 145 is set at a ground level Vss. Gate electrodes 134 and 144 are formed in mid portions of the PMOS active region 133 and the NMOS active region 143, respectively.

The parasitic bipolar transistors T1 and T2 constitute a parasitic thyristor structure to give rise to the latchup phenomenon in which current continues flowing from the power supply voltage Vcc to the ground level Vss once noises turn on the parasitic thyristor.

<First Form>

Figure 65:
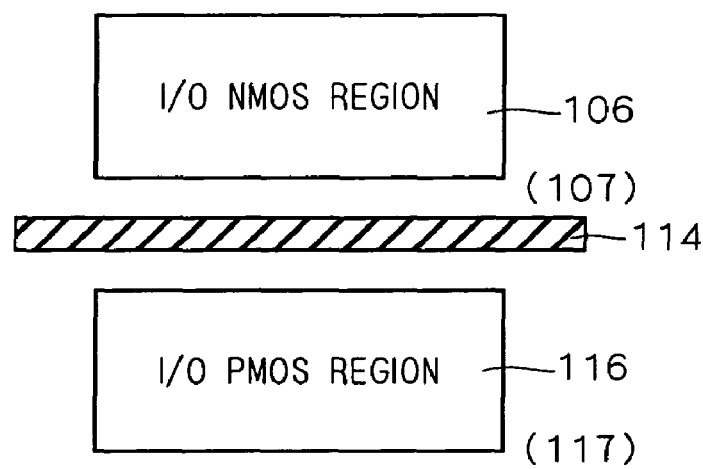
FIG. 65 is a cross-sectional view of a first form of an eighth preferred embodiment according to the present invention.

In general, the noises which induce the latchup phenomenon often enter the CMOS structure at an input/output terminal. To prevent this, as shown in FIG. 65, a complete isolation region 114 is preferably disposed in the vicinity of a boundary between an input/output NMOS (transistor formation) region 106 and an input/output PMOS (transistor formation) region 116 to provide complete isolation therebetween. A partial isolation region 107 partially isolates the I/O NMOS region 106 from its surrounding region, and a partial isolation region 117 partially isolates the I/O PMOS region 116 from its surrounding region.

Figure 66:
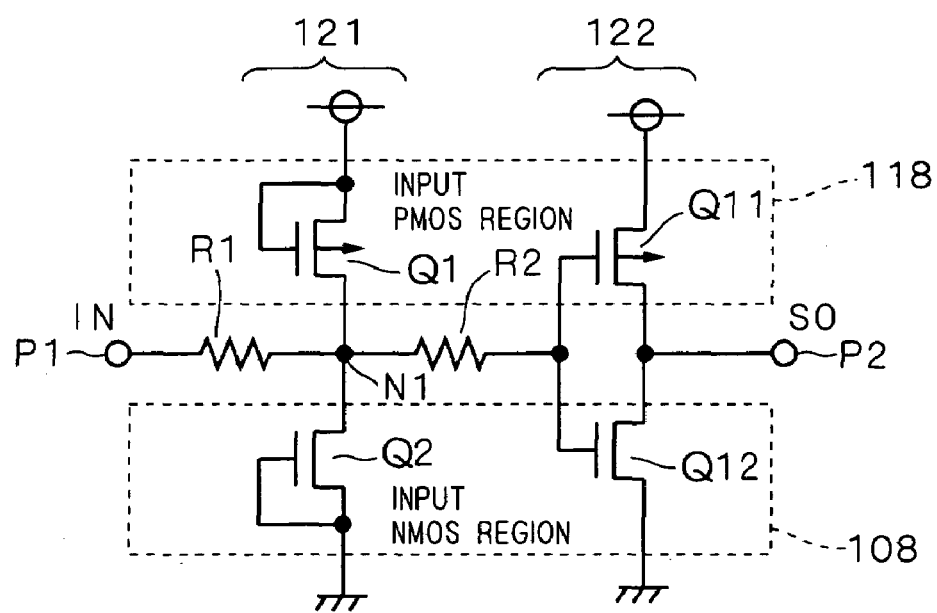
FIG. 66 is a circuit diagram of an input circuit.

The input/output regions mean regions in which an input/output buffer and a protective circuit are mainly to be formed. FIG. 66 is a circuit diagram of an input circuit. As illustrated in FIG. 66, an external input terminal P1 for receiving an input signal IN is connected to the input of an input buffer 122 through resistors R1 and R2. The output of the input buffer 122 is connected to an internal input terminal P2 which outputs an internal signal S0.

An input protective circuit 121 comprises a PMOS transistor Q1 and an NMOS transistor Q2. The PMOS transistor Q1 has a source connected to the power supply voltage Vcc, a gate connected to the power supply voltage Vcc, and a drain connected to a node N1 between the resistors R1 and R2. The NMOS transistor Q2 has a source grounded, a gate grounded, and a drain connected to the node N1.

The input buffer 122 comprises a PMOS transistor Q11 and an NMOS transistor Q12 which constitute a CMOS inverter. The gates of the PMOS and NMOS transistors Q11 and Q12 serve as the input of the CMOS inverter, and the drains thereof serve as the output of the CMOS inverter.

In this circuit arrangement, the PMOS transistors Q1 and Q11 are formed in an input PMOS region 118, and the NMOS transistors Q2 and Q12 are formed in an input NMOS region 108.

Figure 67:
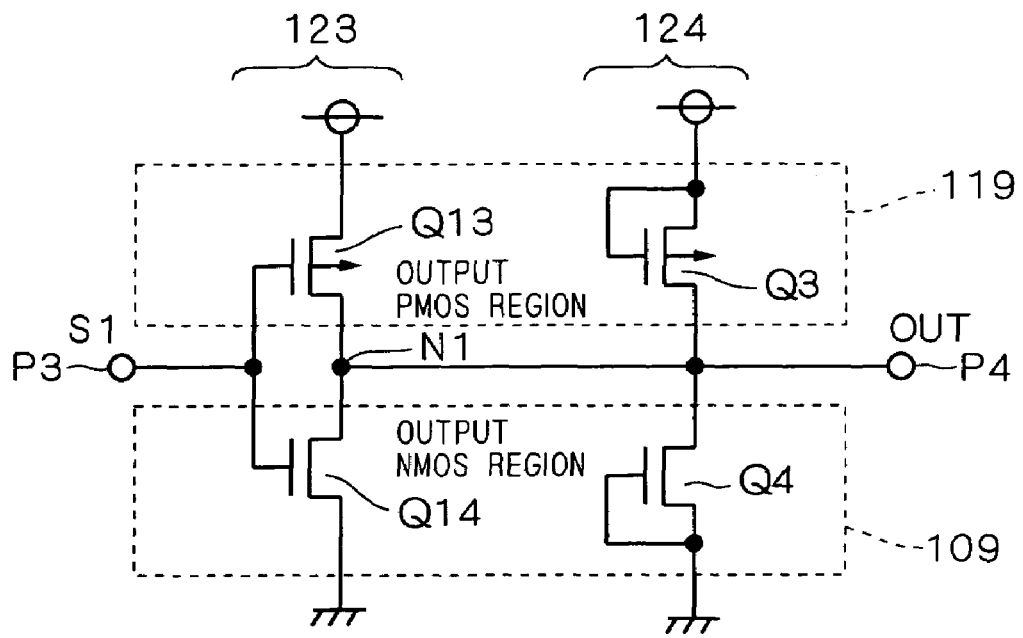
FIG. 67 is a circuit diagram of an output circuit.

FIG. 67 is a circuit diagram of an output circuit. As illustrated in FIG. 67, an internal input terminal P3 for receiving an internal signal S1 is connected to the input of an output buffer 123. A signal from the output of the output buffer 123 is outputted through an external output terminal P4 as an output signal OUT.

The output buffer 123 comprises a PMOS transistor Q13 and an NMOS transistor Q14 which constitute a CMOS inverter. The gates of the PMOS and NMOS transistors Q13 and Q14 serve as the input of the CMOS inverter, and the drains thereof serve as the output of the CMOS inverter.

An output protective circuit 124 comprises a PMOS transistor Q3 and an NMOS transistor Q4. The PMOS transistor Q3 has a source connected to the power supply voltage Vcc, a gate connected to the power supply voltage Vcc, and a drain connected to the external output terminal P4. The NMOS transistor Q4 has a source grounded, a gate grounded, and a drain connected to the external output terminal P4.

In this circuit arrangement, the PMOS transistors Q3 and Q13 are formed in an output PMOS region 119, and the NMOS transistors Q4 and Q14 are formed in an output NMOS region 109.

In the first form of the eighth preferred embodiment, the complete isolation region 114 is formed at least in the vicinity of the boundary between the I/O NMOS region 106 and the I/O PMOS region 116 in which the latchup is prone to occur, to provide complete isolation therebetween, thereby producing a latchup-free structure.

Further, in the first form of the eighth preferred embodiment, the complete isolation region does not entirely extend between the NMOS and PMOS regions, but the complete isolation region 114 is provided only in the vicinity of the boundary between the I/O NMOS and PMOS regions. This effectively suppresses the latchup phenomenon and minimizes the increase in circuit area.

<Second Form>

Figure 68:
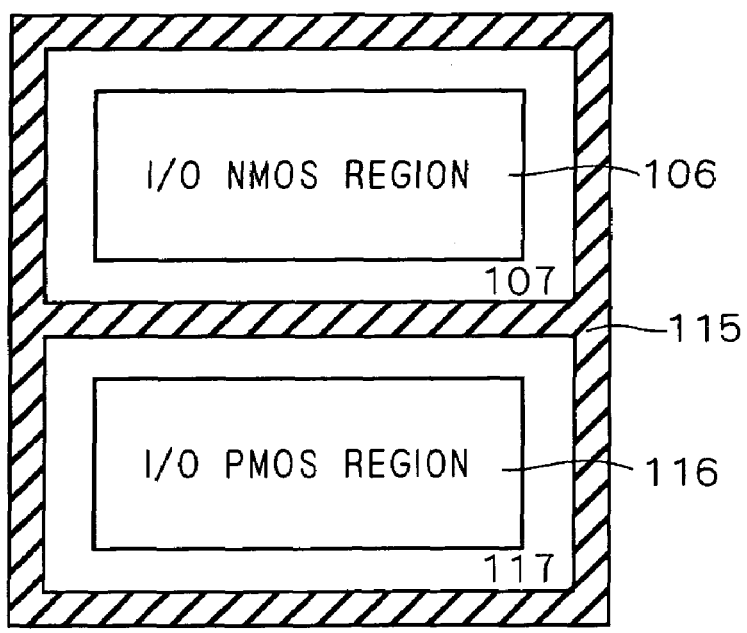
FIG. 68 is a cross-sectional view of a second form of the eighth preferred embodiment.

Although the complete isolation region 114 for complete isolation between the I/O NMOS and PMOS regions 106 and 116 is shown in FIG. 65 as provided only in the vicinity of the boundary therebetween, a complete isolation region 115 may be formed to completely surround the I/O NMOS region 106 and the I/O PMOS region 116 in a second form of the eighth preferred embodiment as shown in FIG. 68.

Further, a complete isolation region may be provided between specific circuits, e.g. between an analog circuit and a digital circuit, as well as between the I/O NMOS and PMOS regions.

<Third Form>

Figure 69:
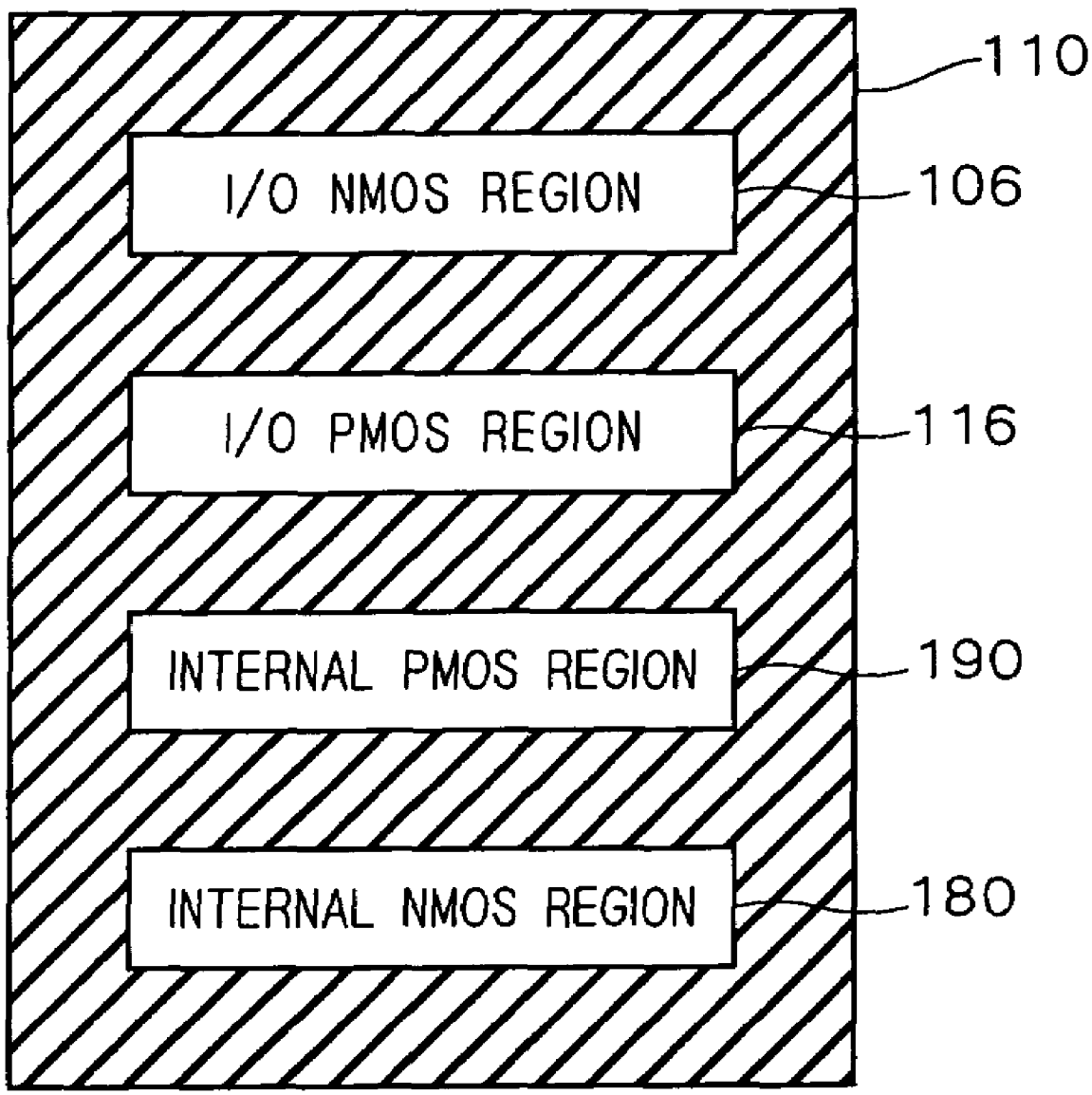
FIG. 69 is a plan view of a third form of the eighth preferred embodiment.

FIG. 69 illustrates a third form of the eighth preferred embodiment. As shown in FIG. 69, a complete isolation region 110 provide complete isolation between NMOS regions (the I/O NMOS region 106 and an internal NMOS region 180) and PMOS regions (the I/O PMOS region 116 and an internal PMOS region 190) and also between an I/O region (the I/O PMOS region 116) and an internal circuit region (the internal NMOS region 180).

The third form of the eighth preferred embodiment produces the effect of completely precluding from the internal circuit region the influence of the I/O region susceptible to noises, in addition to the effects of the first and second forms thereof.

Ninth Preferred Embodiment

<First Form>

Figure 70:
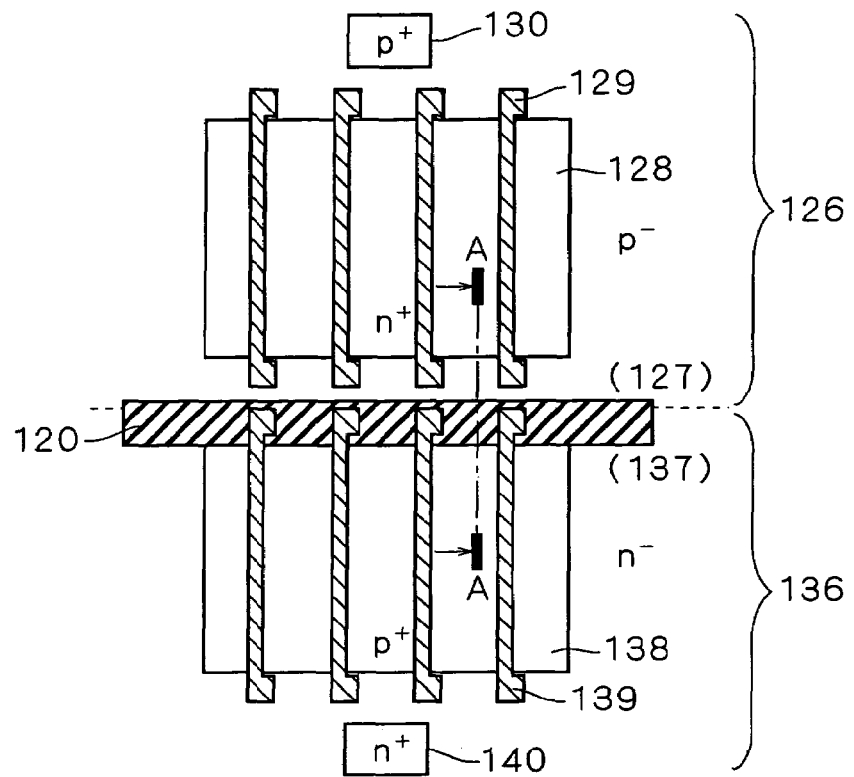
FIG. 70 is a plan view of a first form of a ninth preferred embodiment according to the present invention.
Figure 71:
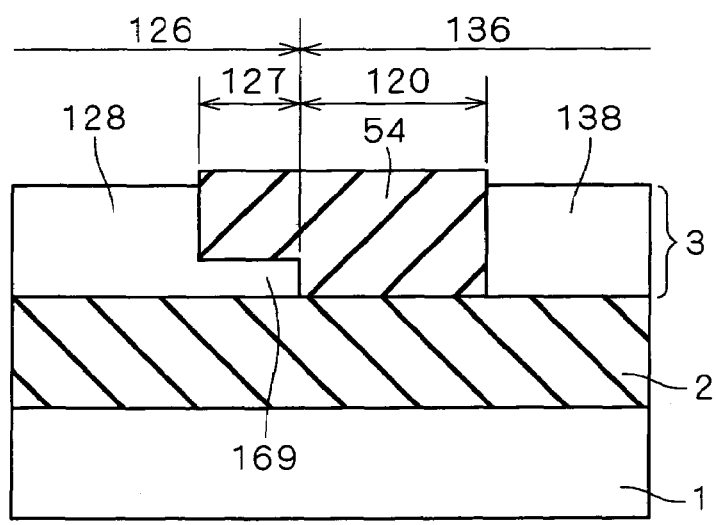
FIG. 71 is a cross-sectional view taken along the line A-A of FIG. 70.

FIG. 70 is a plan view of a first form of the semiconductor device having the SOI structure according to a ninth preferred embodiment of the present invention. FIG. 71 is a cross-sectional view taken along the line A-A of FIG. 70. As depicted in FIGS. 70 and 71, an NMOS (transistor formation) region 126 and a PMOS (transistor formation) region 136 are disposed adjacent to each other. An NMOS active region 128 having a plurality of gate electrodes 129 and a $p^+$ body region 130 are formed in the NMOS region 126, and a partial isolation region 127 surrounds the NMOS active region 128.

A PMOS active region 138 having a plurality of gate electrodes 139 and an n⁺ body region 140 are formed in the PMOS region 136, and a partial isolation region 137 and a complete isolation region 120 surround the PMOS active region 138. The complete isolation region 120 is provided in the PMOS region 136 in the vicinity of a boundary between the NMOS and PMOS regions 126 and 136 so as to surround parts of the gate electrodes 139 which extend outwardly of the PMOS active region 138.

Thus, in the vicinity of the boundary between the NMOS region 126 and the PMOS region 136, the partial isolation region 127 including an oxide film 54 and a well region 169 isolates the NMOS region 126 from its surrounding region, and the complete isolation region 120 including only the oxide film 54 isolates the PMOS region 136 from its surrounding region, as illustrated in FIG. 71.

Thus, no complete isolation region is formed in the NMOS region 126 but the partial isolation region 127 is formed therein to sufficiently fix the electric potential of the substrate of the NMOS transistor through the well region 169 beneath the oxide film 54. This effectively suppresses the floating-substrate effect of the NMOS transistor which exhibits a substantial degree of floating-substrate effect.

The PMOS transistor which exhibits a lower degree of floating-substrate effect than the NMOS transistor is not significantly affected if the complete isolation region is formed partially around the PMOS transistor. The complete isolation region 120 provides insulative isolation between the NMOS region 126 and the PMOS region 136 and is disposed for high area efficiency. This is effective if there is little space for layout.

<Second Form>

Figure 72:
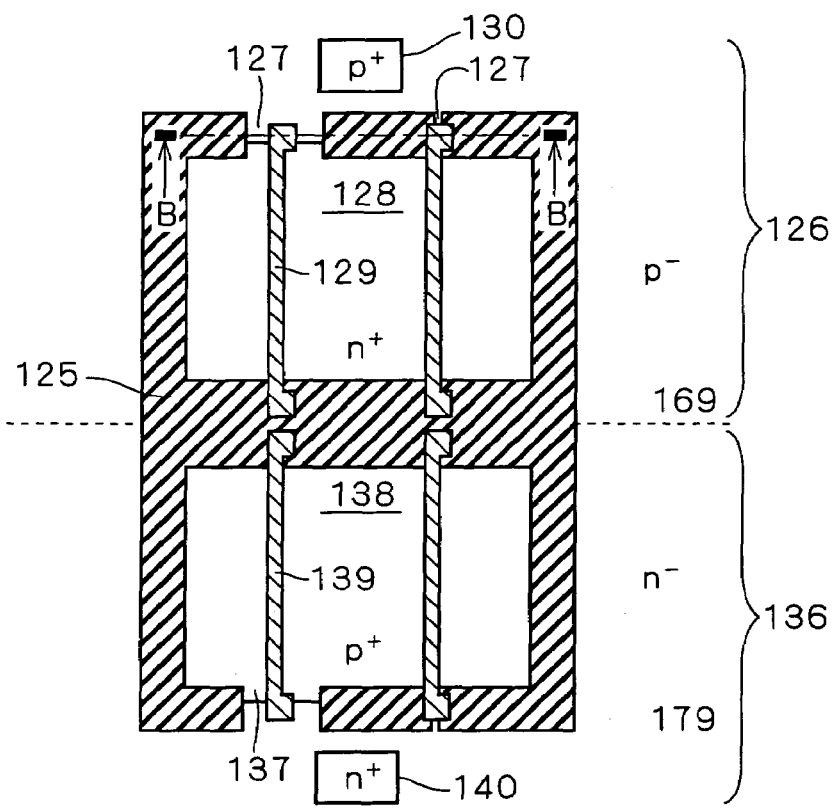
FIG. 72 is a plan view of a second form of the ninth preferred embodiment.
Figure 73:
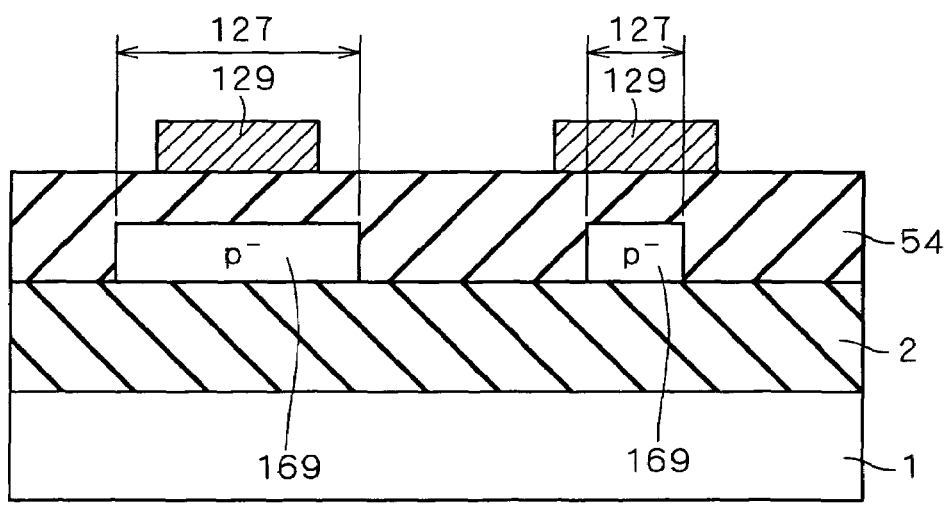
FIG. 73 is a cross-sectional view taken along the line B-B of FIG. 72.

FIG. 72 is a plan view of a second form of the semiconductor device having the SOI structure according to the ninth preferred embodiment of the present invention. FIG. 73 is a cross-sectional view taken along the line B-B of FIG. 72. As depicted in FIGS. 72 and 73, the NMOS region 126 formed in the p⁻ well region 169 and the PMOS region 136 formed in an n⁻ well region 179 are disposed adjacent to each other.

The NMOS active region 128 having the plurality of gate electrodes 129 is formed in the NMOS region 126, and a complete isolation region 125 almost entirely surrounds the NMOS active region 128. The partial isolation region 127 isolates only a first end of each of the gate electrodes 129 (which is located on opposite side from the PMOS transistor 136) from its surrounding region.

As shown in FIG. 73, the oxide film 54 and the well region 169 formed in a lower part of the oxide film 54 constitute the partial isolation region 127. The partial isolation region 127 may be greater (like the left-hand partial isolation region 127 of FIG. 73) or smaller (like the right-hand partial isolation region 127 of FIG. 73) in width than the gate electrodes 129. The p⁺ body region 130 is provided in the well region 169 in the vicinity of the first ends of the gate electrodes 129.

The PMOS active region 138 having the plurality of gate electrodes 139 is formed in the PMOS region 136, and the complete isolation region 125 almost entirely surrounds the PMOS active region 138. As in the NMOS region 126, the partial isolation region 137 isolates only a first end of each of the gate electrodes 139 (which is located on opposite side from the NMOS transistor 126) from its surrounding region. The n⁺ body region 140 is provided in the well region 179 in the vicinity of the first ends of the gate electrodes 139.

In the second form of the ninth preferred embodiment, the partial isolation regions isolate the respective first ends of the gate electrodes so that a channel formation region underlying the gate electrodes contacts the well region of the partial isolation region, thereby fixing the electric potentials of the substrates of the respective transistor formation regions.

The complete isolation region 125 almost entirely surrounds the NMOS and PMOS regions 126 and 136 for the purposes of reducing the PN junction area and cutting off a path through which latchup occurs.

Tenth Preferred Embodiment

<First Form>

Figure 74:
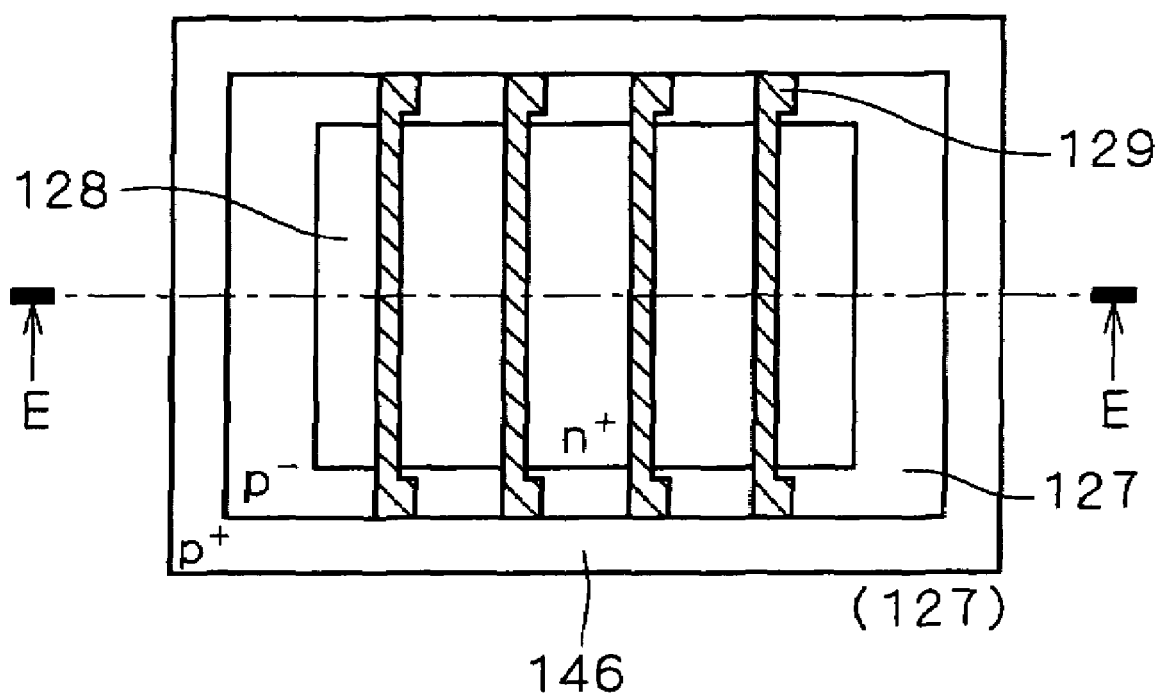
FIG. 74 is a plan view of a first form of a tenth preferred embodiment according to the present invention.
Figure 101:
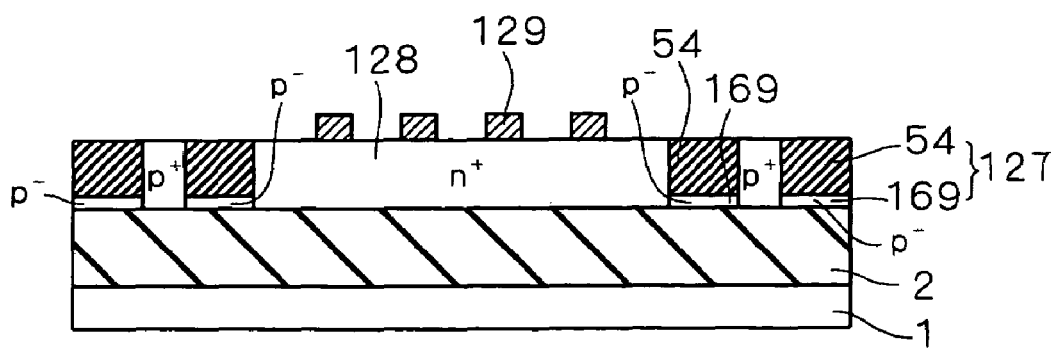
FIG. 101 is a cross-sectional view taken along the line E-E of FIG. 74.

FIG. 74 is a plan view of a first form of the semiconductor device having the SOI structure according to a tenth preferred embodiment of the present invention. As depicted in FIG. 74, the plurality of gate electrodes 129 are formed in the NMOS active region 128, and the partial isolation region 127 surrounds the NMOS active region 128. A p⁺ body region 146 surrounds the partial isolation region 127. FIG. 101 is a cross-sectional view taken along the line E-E of FIG. 74.

As illustrated in FIG. 101, the partial isolation region 127 includes the oxide film 54 and the well region 169. The well region 169, which is formed in contact with a channel formation region formed in the NMOS active region 128, is susceptible to noises and latchup.

In the first form of the tenth preferred embodiment, however, the p⁺ body region 146 is formed to surround the partial isolation region 127. Therefore, the substrate potential of the p⁺ body region 146 may be fixed, e.g., at the ground level to suppress the influence of other circuit parts, thereby stabilizing the substrate potential.

This significantly enhances resistance to noises and latchup.

The first form of the tenth preferred embodiment as above described is suitable for a circuit block of a noise source, a circuit block in which external noise removal is desired, and the like. For the PMOS active region, an n⁺ body region may surround the partial isolation region, producing similar effects.

<Second Form>

Figure 75:
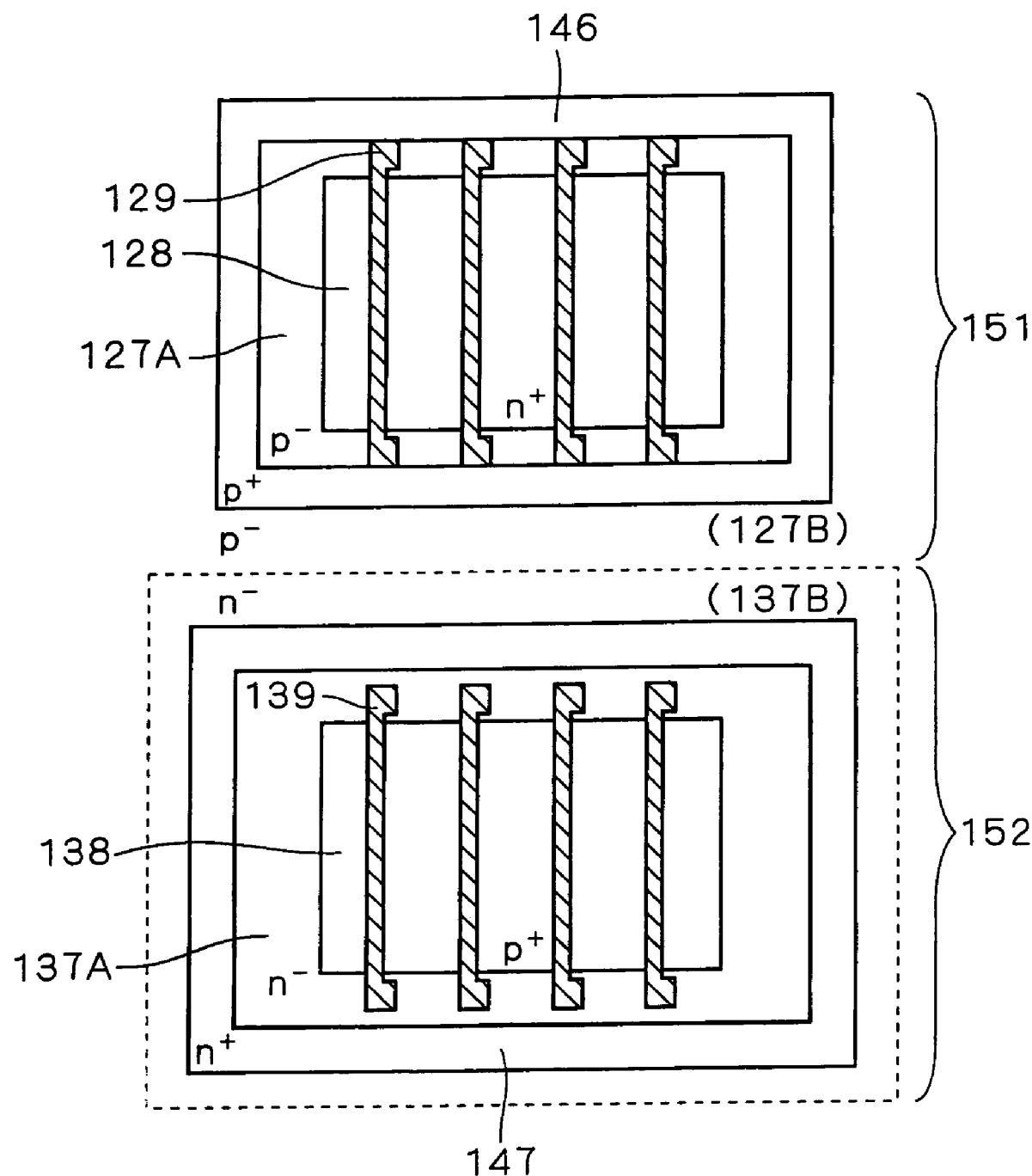
FIG. 75 is a plan view of a second form of the tenth preferred embodiment.

FIG. 75 is a plan view of a second form of the semiconductor device having the SOI structure according to the tenth preferred embodiment of the present invention. As depicted in FIG. 75, an input/output NMOS region 151 and an input/output PMOS region 152 are disposed adjacent to each other.

In the I/O NMOS region 151, the plurality of gate electrodes 129 are formed in the NMOS active region 128, and a partial isolation region 127A surrounds the NMOS active region 128. The p⁺ body region 146 surrounds the partial isolation region 127A. A partial isolation region 127B surrounds the p⁺ body region 146.

In the I/O PMOS region 152, the plurality of gate electrodes 139 are formed in the PMOS active region 138, and a partial isolation region 137A surrounds the PMOS active region 138. An n⁺ body region 147 surrounds the partial isolation region 137A. A partial isolation region 137B surrounds the n⁺ body region 147.

In general, I/O circuits are often influenced by surges and noises from the exterior of the chip. It is hence particularly important to increase the resistance of the I/O circuits to latchup and noises.

In the second form of the tenth preferred embodiment, the p+ body region 146 and the n+ body region 147 surround the partial isolation regions 127A and 137A of the I/O NMOS and PMOS regions 151 and 152, respectively, to suppress the latchup phenomenon resulting from the increase in the potential of the well regions influenced by surges.

The NMOS and PMOS active regions are entirely covered with the body regions in the second form of the tenth preferred embodiment. However, the body regions may be provided at least in the vicinity of a boundary between the I/O NMOS region 151 and the I/O PMOS region 152, thereby enhancing the resistance to latchup and noises to some degree.

Eleventh Preferred Embodiment

<First Form>

Figure 76:
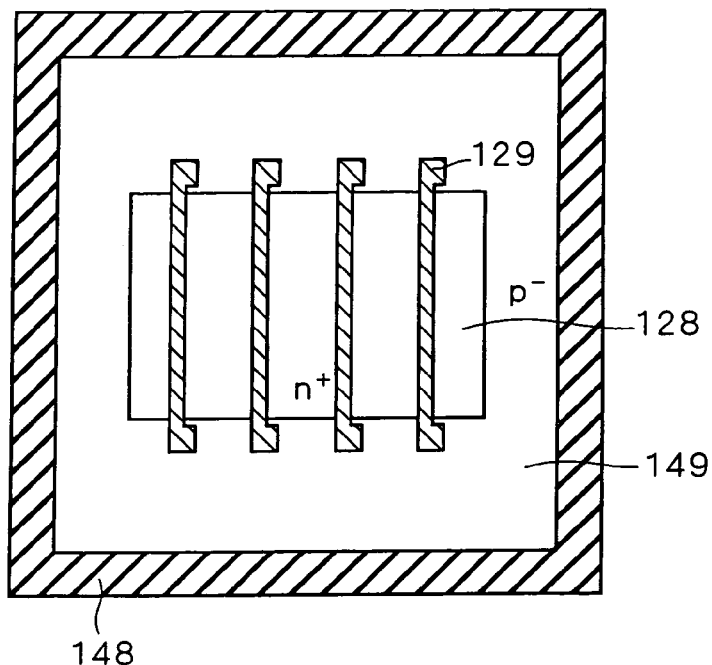
FIG. 76 is a plan view of a first form of an eleventh preferred embodiment according to the present invention.

FIG. 76 is a plan view of a first form of the semiconductor device having the SOI structure according to an eleventh preferred embodiment of the present invention.

As shown in FIG. 76, the plurality of gate electrodes 129 are formed in the NMOS active region 128, and a floating partial isolation region 149 surrounds the NMOS active region 128. A complete isolation region 148 surrounds the floating partial isolation region 149.

The floating partial isolation region 149 has a two-layer structure comprises of an oxide film and a well region similar to the partial oxide film 31 and the well region 11 shown in FIG. 55. The well region of the floating partial isolation region 149 has a potential which is not fixed but is always floating. Since carriers generated by impact ionization flow into the well region of the floating partial isolation region 149 if the well region of the floating partial isolation region 149 is floating, the increase in electric potential is minimized. Additionally, the well region of the floating partial isolation region 149 disperses the electric charge generated by cosmic rays, to enhance resistance to soft errors.

The construction of the first form of the eleventh preferred embodiment which includes the floating partial isolation region 149 is effective for a high-density circuit, such as an SRAM, which is difficult to contact the body region.

The provision of the complete isolation region 148 is desirable in terms of the enhancement of latchup-resistance, but is not necessarily required.

<Second Form>

Figure 77:
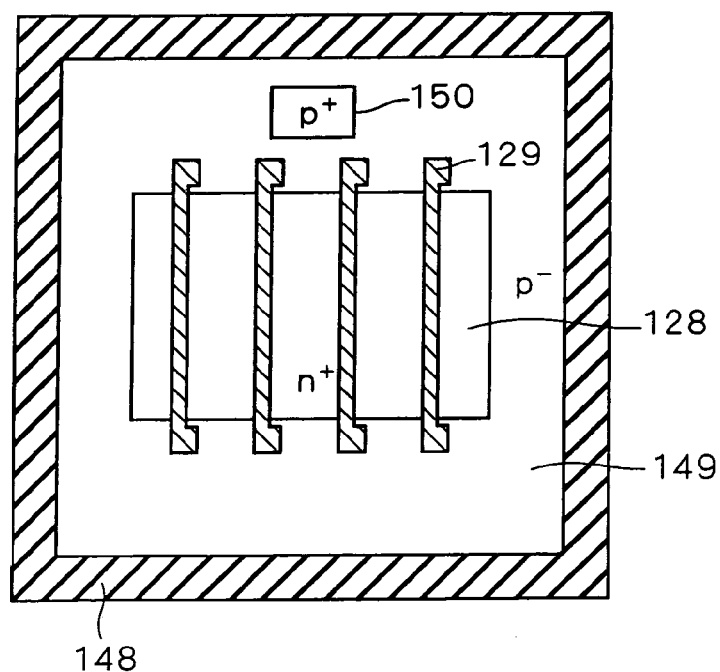
FIG. 77 is a plan view of a second form of the eleventh preferred embodiment.

FIG. 77 is a plan view of a second form of the semiconductor device having the SOI structure according to the eleventh preferred embodiment of the present invention.

As illustrated in FIG. 77, a floating p+ body region 150 is provided in the floating partial isolation region 149. The remaining structure of the second form shown in FIG. 77 is similar to that of the first form shown in FIG. 76.

The electric potential of the floating p+ body region 150 is not fixed but is always floating. Accordingly, the well region of the floating partial isolation region 149 is also floating.

With the well region of the floating partial isolation region 149 floating in the second form, the increase in electric potential is minimized and the resistance to soft errors is enhanced, as in the first form.

Furthermore, the presence of the floating p+ body region 150 in the second form promotes carrier recombination to produce the greater effect of suppressing the floating-substrate effect than the first form.

Twelfth Preferred Embodiment

<First Form>

Figure 78:
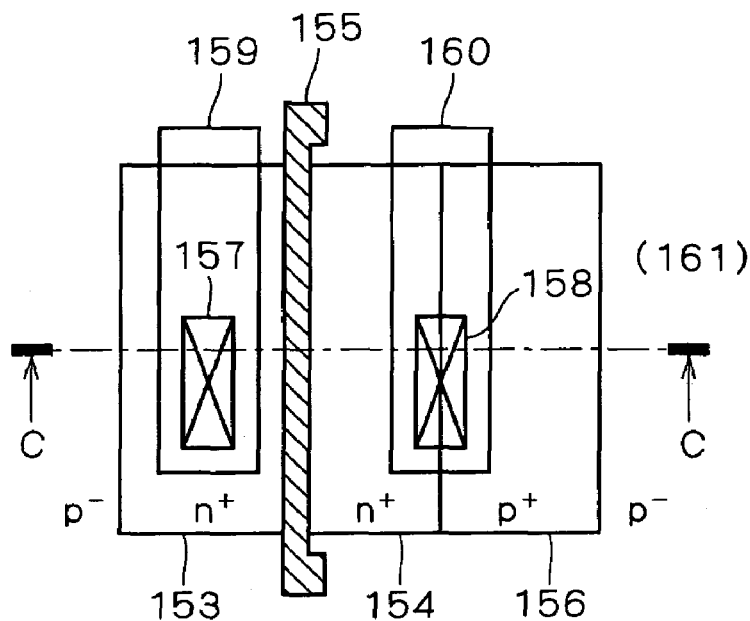
FIG. 78 is a plan view of a first form of a twelfth preferred embodiment according to the present invention.
Figure 79:
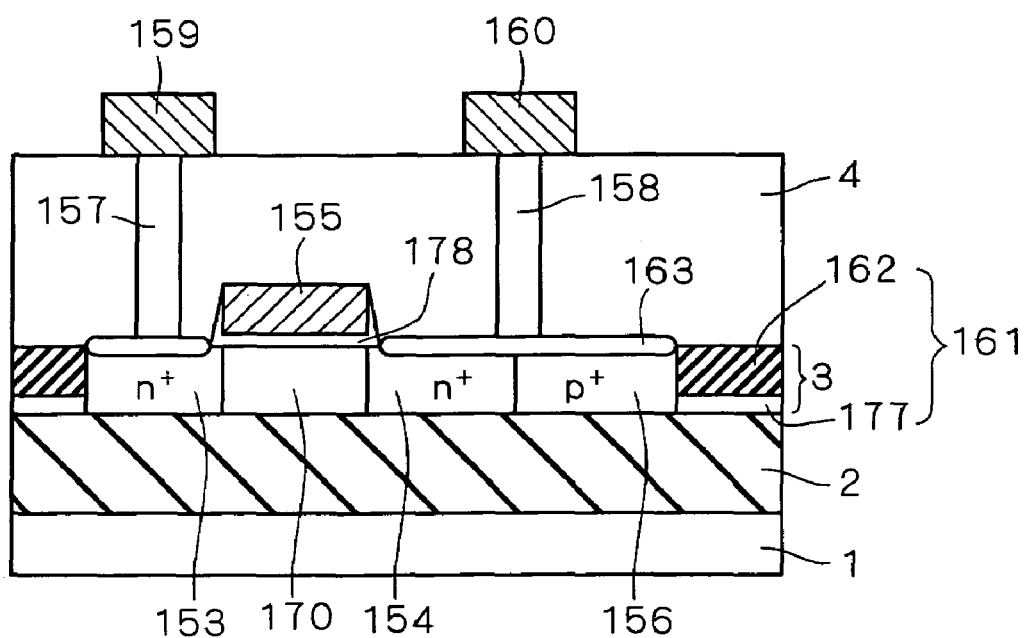
FIG. 79 is a cross-sectional view taken along the line C-C of FIG. 78.

FIG. 78 is a plan view of a first form of the semiconductor device having the SOI structure according to a twelfth preferred embodiment of the present invention. FIG. 79 is a cross-sectional view taken along the line C-C of FIG. 78.

As illustrated in FIGS. 78 and 79, an NMOS transistor has a drain region 153, a source region 154 and a gate electrode 155, and a p+ body region 156 is disposed adjacent to the source region 154 of the NMOS transistor. The source region 154 and the body region 156 are electrically connected to an aluminum interconnect layer 160 through a contact 158.

The drain region 153 is electrically connected to an aluminum interconnect layer 159 through a contact 157. A partial isolation region 161 surrounds the drain region 153, the source region 154 and the body region 156.

As depicted in FIG. 79, the partial isolation region 161 includes an oxide film 162 and a p− well region 177. For ease of connection between the source region 154 and the body region 156, a silicide layer 163 is formed over the top surfaces of the source region 154 and the body region 156, and the contact 158 is formed on the silicide layer 163. Part of the SOI layer 3 which underlies a gate oxide film 178 for the gate electrode 155 serves as a channel formation region 170.

In such a construction, the aluminum interconnect layer 160 fixes the electric potentials of the source region 154 and the body region 156 at the ground level to fix the well region 177 at the same potential as the source region 154, thereby fixing the electric potential of the channel formation region 170 through the well region 177.

In the first form of the twelfth preferred embodiment, the source region 154 and the body region 156 are arranged adjacent to each other as shown in FIGS. 78 and 79, thereby increasing the degree of integration.

A PMOS transistor may be similarly constructed except that the electric potentials of a source region and a body region are fixed at the power supply level.

<Second Form>

Figure 80:
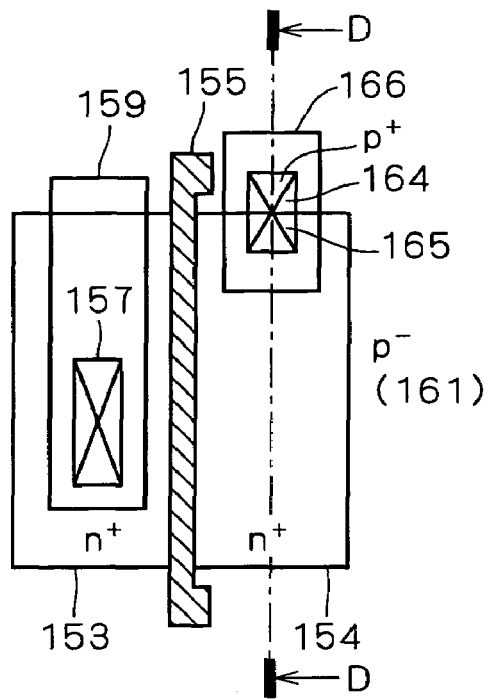
FIG. 80 is a plan view of a second form of the twelfth preferred embodiment.
Figure 81:
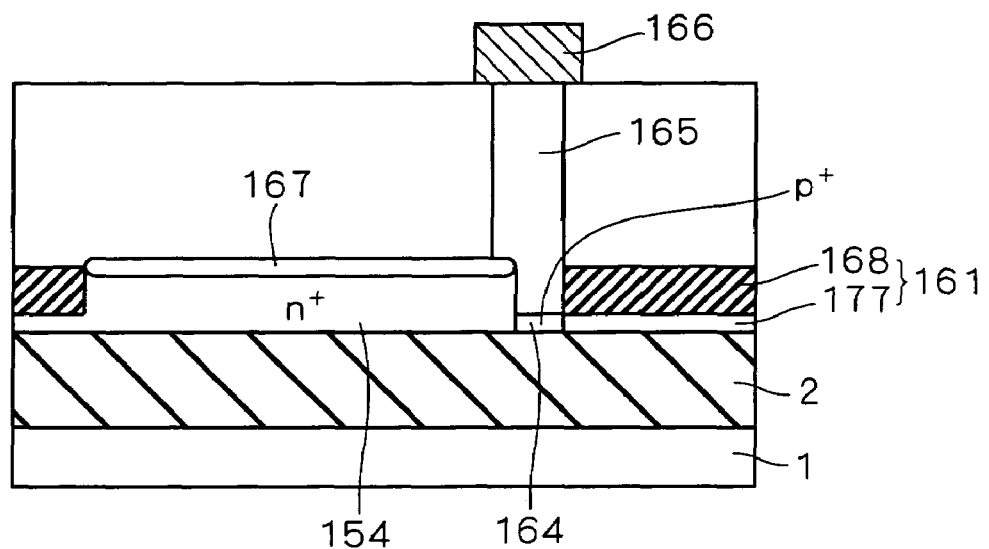
FIG. 81 is a cross-sectional view taken along the line D-D of FIG. 80.

FIG. 80 is a plan view of a second form of the semiconductor device having the SOI structure according to the twelfth preferred embodiment of the present invention. FIG. 81 is a cross-sectional view taken along the line D-D of FIG. 80.

As illustrated in FIGS. 80 and 81, a p+ body region 164 is disposed adjacent to the source region 154. The source region 154 and the body region 164 are electrically connected to an aluminum interconnect layer 166 through a contact 165. The contact 165 is formed in contact with the source region 154 and the body region 164. The partial isolation region 161 surrounds the drain region 153, the source region 154 and the body region 164.

With reference to FIG. 81, a silicide layer 167 is formed on the source region 154, and the contact 165 is formed on the body region 164 and part of the silicide layer 167. The remaining structure of the second form shown in FIGS. 80 and 81 is similar to that of the first form shown in FIGS. 78 and 79.

In such a construction, the aluminum interconnect layer 166 fixes the electric potentials of the source region 154 and the body region 164 at the ground level to fix the well region 177 at the same potential as the source region 154, thereby fixing the electric potential of the channel formation region 170 through the well region 177.

In the second form of the twelfth preferred embodiment, the source region 154 and the body region 164 are arranged adjacent to each other as shown in FIGS. 80 and 81, thereby increasing the degree of integration.

<Third Form>

Figure 82:
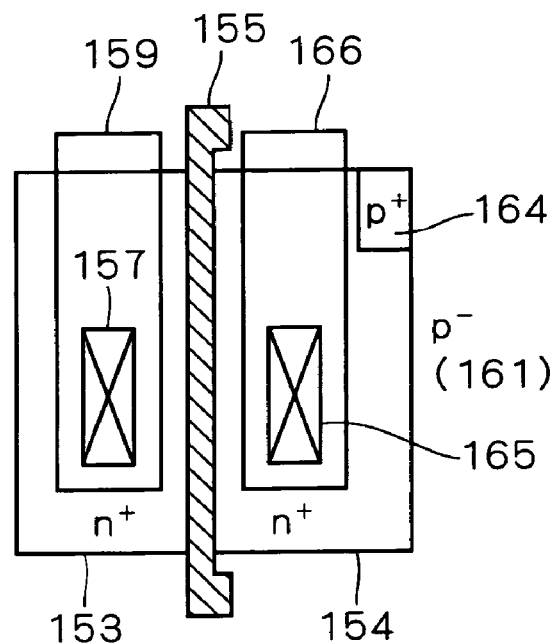
FIG. 82 is a plan view of a third form of the twelfth preferred embodiment.

Referring to FIG. 82, the body region 164 is provided in a region which is normally part of the source region 154 and which is adjacent to the partial isolation region 161, and the contact 165 is formed on the source region 154. This produces effects similar to those of the second form.

In the third form of the twelfth preferred embodiment, the body region 164 is contained within the region which is to serve as part of the source region 154 as shown in FIG. 82, thereby further increasing the degree of integration as compared with the first and second forms.

Thirteenth Preferred Embodiment

Figure 83:
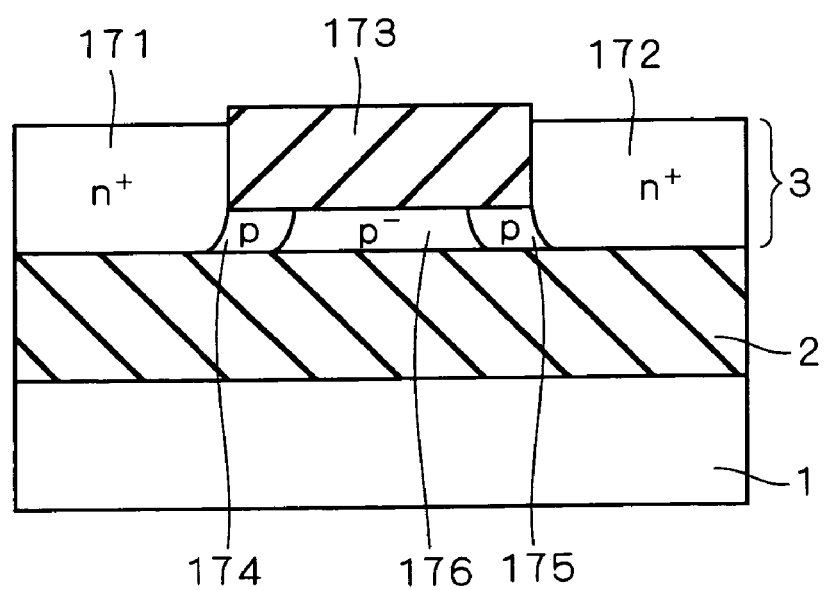
FIG. 83 is a cross-sectional view of a thirteenth preferred embodiment according to the present invention.

FIG. 83 is a cross-sectional view of the semiconductor device having the SOI structure according to a thirteenth preferred embodiment of the present invention. As shown in FIG. 83, a partial isolation region including an oxide film 173 and a well region (having a pair of p regions 174 and 175 and a $p^-$ region 176) formed beneath the oxide film 173 provides isolation between $n^+$ active regions 171 and 172. The $n^+$ active regions 171 and 172 correspond to, for example, source and drain regions of a transistor, respectively. The p regions 174 and 175 serve as peripheral regions of the well region adjacent to the $n^+$ active regions 171 and 172, and the $p^-$ region 176 serves as a central region of the well region.

Thus, the thirteenth preferred embodiment is adapted such that the impurity concentration of the p regions 174 and 175 adjacent to the $n^+$ active regions 171 and 172, respectively, is higher than that of the $p^-$ region 176, to enhance resistance to punch-through in the partial isolation region.

The p regions 174 and 175 may be manufactured as shown in FIG. 83 by implanting boron ions or $BF_2$ ions to reach the well region by the oblique-rotating ion implantation technique after a $p^-$ well region is formed beneath the oxide film 173.

For example, boron (B) ions may be implanted at an energy of 20 keV, at an angle of 45 degrees and at a dose of $4 \times 10^{13}/cm^2$. With a low implant energy for B and $BF_2$ (e.g. an implant energy of 20 keV for $BF_2$), the p regions 174 and 175 are formed adjacent to the $n^+$ active regions 171 and 172 by accelerated diffusion resulting from lattice defects which occur when an $n^+$ impurity is implanted.

Fourteenth Preferred Embodiment

<First Form>

Figure 84:
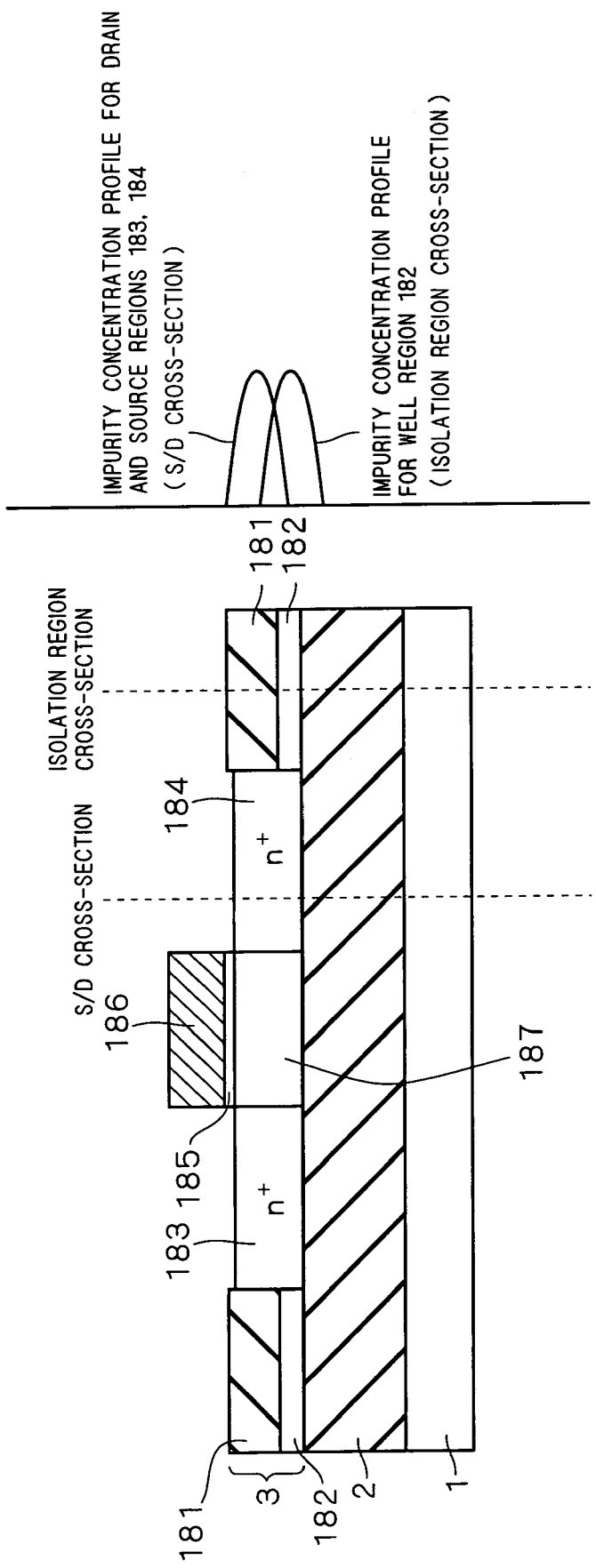
FIG. 84 illustrates a feature of a first form of a fourteenth preferred embodiment according to the present invention.

FIG. 84 is a cross-sectional view of a first form of the semiconductor device having the SOI structure according to a fourteenth preferred embodiment of the present invention. As shown in FIG. 84, an NMOS transistor formed in the SOI layer 3 overlying the buried oxide film 2 on the silicon substrate 1 and comprising a drain region 183, a source region 184, a gate oxide film 185, a gate electrode 186 and a channel formation region 187 is partially isolated by a partial isolation region including an oxide film 181 and a well region 182.

Referring to the right-hand part of FIG. 84, the semiconductor device of FIG. 84 is designed such that a comparison between an impurity concentration profile for the drain region 183 and the source region 184 and an impurity concentration profile for the well region 182 shows that an impurity concentration peak for the well region 182 is deeper from the surface of the SOI layer 3 than an impurity concentration peak for the drain region 183 and the source region 184.

In the semiconductor device of the first form of the fourteenth preferred embodiment, the PN junction of the drain and source regions 183, 184 and the well region 182 may be formed in a location where the impurity concentration of the drain and source regions 183, 184 and the impurity concentration of the well region 182 are both low in the impurity concentration profiles. This increases the breakdown voltage of the PN junction of the drain and source regions 183, 184 and the well region 182.

<Second Form>

Figure 85:
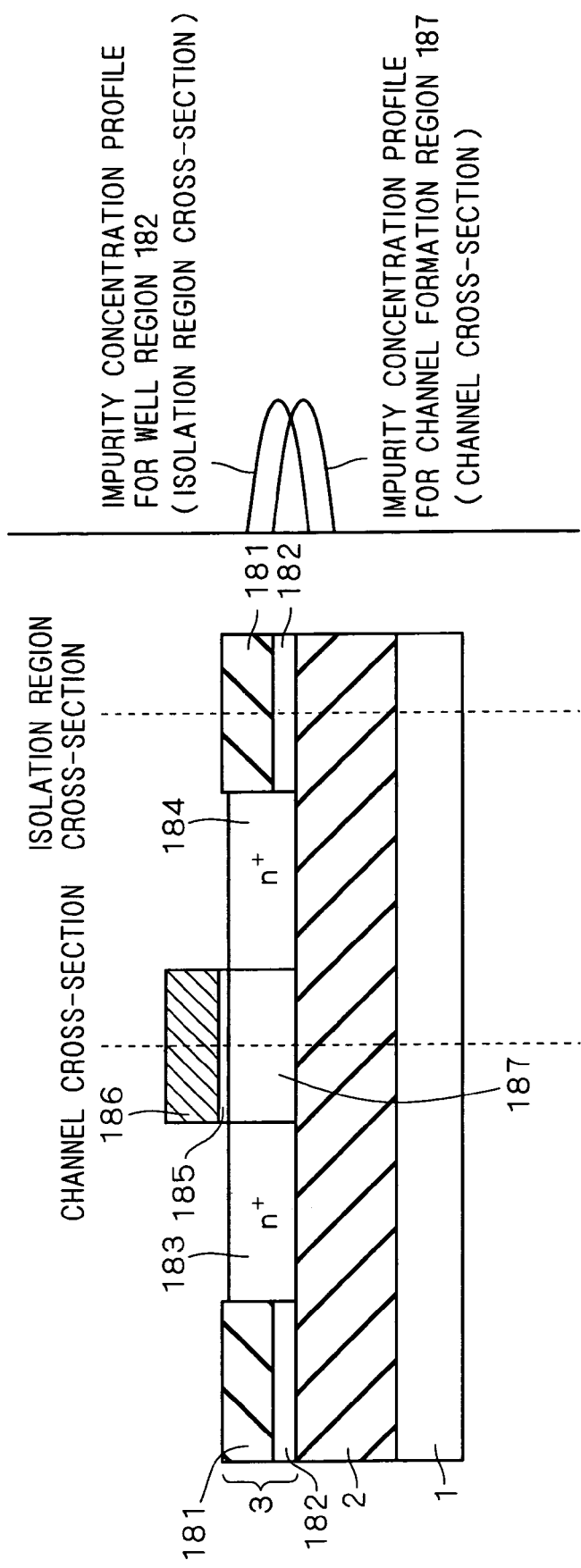
FIG. 85 illustrates a feature of a second form of the fourteenth preferred embodiment.

FIG. 85 is a cross-sectional view of a second form of the semiconductor device having the SOI structure according to the fourteenth preferred embodiment of the present invention. The semiconductor device of the second form shown in FIG. 85 is similar in construction to that of the first form.

Referring to the right-hand part of FIG. 85, the semiconductor device of FIG. 85 is designed such that a comparison between an impurity concentration profile for the well region 182 and an impurity concentration profile for the channel formation region 187 shows that an impurity concentration peak for the well region 182 is shallower from the surface of the SOI layer 3 than an impurity concentration peak for the channel formation region 187. For example, when ion implantation is performed with the top surface of the oxide film 181 for partial isolation positioned above the surface of the SOI layer 3 to simultaneously form the well region 182 and the channel formation region 187, the impurity concentration profile for the channel formation region 187 automatically exhibits the peak deeper than the peak of the well region 182.

In the semiconductor device of the second form of the fourteenth preferred embodiment, the impurity concentration of the surface of the channel formation region 187 is sufficiently lowered to prevent a threshold voltage from exceeding a desired value.

Fifteenth Preferred Embodiment

<First Form>

Figure 86:
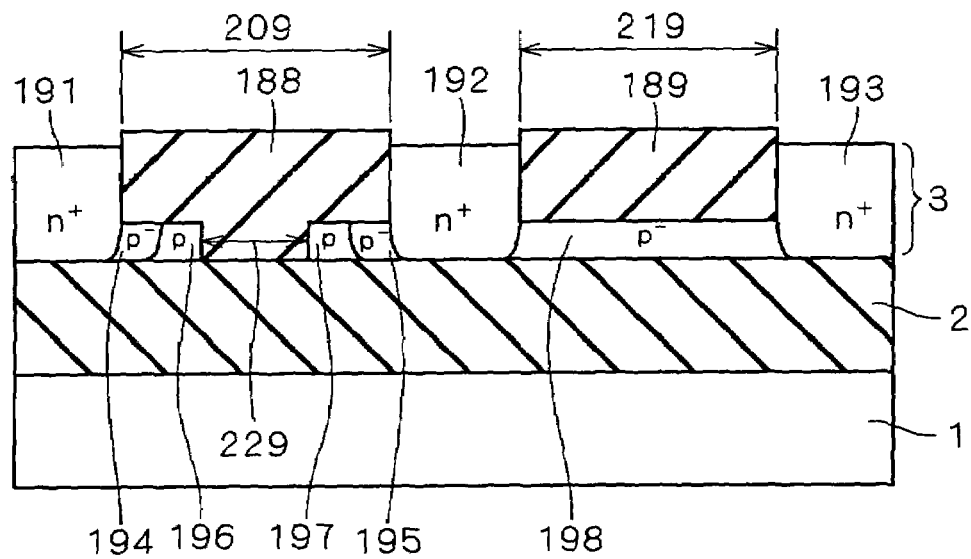
FIG. 86 is a cross-sectional view of a first form of a fifteenth preferred embodiment according to the present invention.

FIG. 86 is a cross-sectional view of a first form of the semiconductor device having the SO structure according to a fifteenth preferred embodiment of the present invention. As illustrated in FIG. 86, $n^+$ active regions 191 to 193 are selectively formed in the SOI layer 3 overlying the buried oxide film 2 on the silicon substrate 1. A complete isolation region 209 provides isolation between the $n^+$ active regions 191 and 192, and a partial isolation region 219 provides isolation between the $n^+$ active regions 192 and 193.

The complete isolation region 209 includes an oxide film 188 and a well region (having a pair of $p^-$ well regions 194, 195 and a pair of p well regions 196, 197) formed beneath the oxide film 188. The oxide film 188 has a central complete insulation part 229 extending through the SOI layer 3 to provide complete isolation between the $n^+$ active regions 191 and 192. The partial isolation region 219 includes an oxide film 189 and a $p^-$ well region 198 lying beneath the oxide film 189.

The well region beneath the oxide film 188 is designed such that the impurity concentration of the p well regions 196, 197 adjacent to the complete insulation part 229 is higher than that of the other regions 194, 195.

In the vicinity of the complete insulation part 229, there is a strong likelihood that undesirable conditions occur, for example, stresses applied to the SOI layer 3 develop electric charge and punch-through is prone to occur due to segregation of impurities into the oxide film.

However, the p well regions 196, 197 having a relatively high impurity concentration are provided adjacent to the complete insulation part 229 to decrease the likelihood of the undesirable conditions in the first form of the fifteenth preferred embodiment.

<Second Form>

Figure 87:
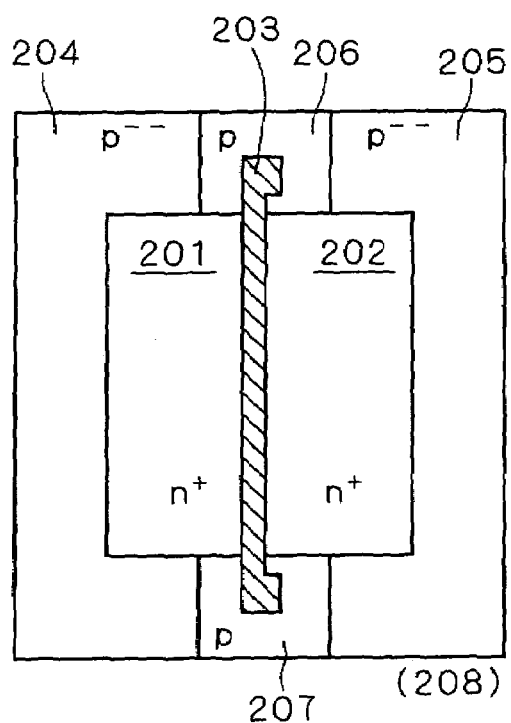
FIG. 87 is a plan view of a second form of the fifteenth preferred embodiment.

FIG. 87 is a plan view of a second form of the semiconductor device having the SOI structure according to the fifteenth preferred embodiment of the present invention. As shown in FIG. 87, partial isolation regions 204 to 207 surround an NMOS transistor including a drain region 201, a source region 202 and a gate electrode 203. A complete isolation region 208 surrounds the partial isolation regions 204 to 207.

The partial isolation regions 204 to 207 are arranged such that the p well regions 206 and 207 having a relatively high impurity concentration are disposed adjacent to the gate electrode 203 and the p$^{--}$ well regions 204 and 205 having a relatively low impurity concentration are disposed in other regions in contact with the drain region 201 and the source region 202.

In the arrangement of the second form of the fifteenth preferred embodiment, the p$^{--}$ well regions 204 and 205 reduce the PN junction capacitance and the p well regions 206 and 207 prevent punch-through.

Sixteenth Preferred Embodiment

<First Form>

Figure 88:
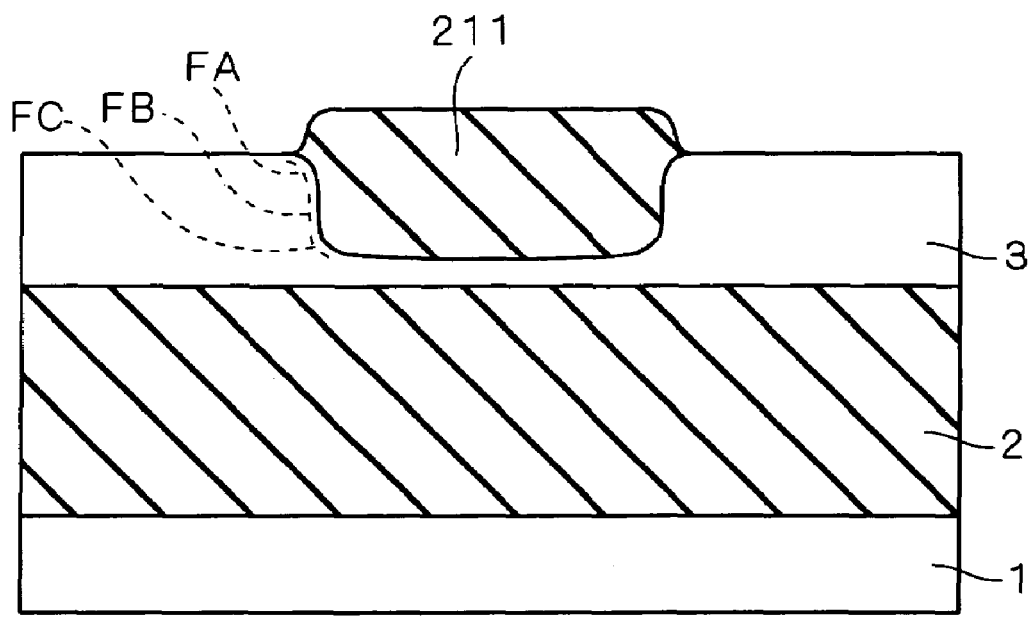
FIG. 88 is a cross-sectional view of a first form of a sixteenth preferred embodiment according to the present invention.

FIG. 88 is a cross-sectional view of a first form of the semiconductor device having the SOI structure according to a sixteenth preferred embodiment of the present invention. As illustrated in FIG. 88, an oxide film 211 for a partial isolation region is formed in the SOI layer 3 overlying the buried oxide film 2 on the silicon substrate 1.

The optimization of the isolation shape requires the reduction in isolation width and the alleviation of stresses applied to the SOI layer to be kept in balance. For reduction in isolation width, it is desired that an oxide film for a partial isolation region is shaped to have a steeper curvature (or a smaller radius of curvature) in its corner part and to have a surface extending in a depth direction which is as nearly vertical as possible. For stress alleviation, on the other hand, it is desired that the corner part of the oxide film has a gentler curvature (or a greater radius of curvature). Additionally, a bird's beak is preferably as small as possible to ensure the effective width of an active region.

From such a viewpoint, the cross-sectional shape of the oxide film 211 of the first form is such that a bird's beak shape FA (protrusion) at a surface corner has a steeper curvature for reduction in isolation width and a bottom corner shape FC has a gentler curvature for stress alleviation. For reduction in isolation width, it is desirable that at least part of a side surface shape FB extending in the depth direction is as nearly vertical as possible.

<Second Form>

Figure 89:
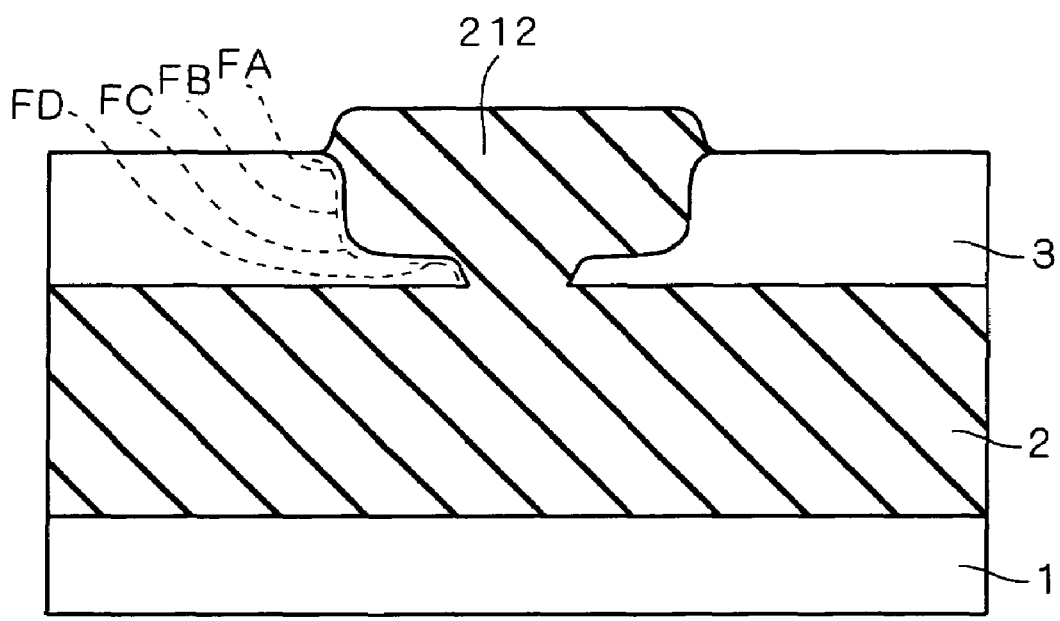
FIG. 89 is a cross-sectional view of a second form of the sixteenth preferred embodiment.

FIG. 89 is a cross-sectional view of a second form of the semiconductor device having the SOI structure according to the sixteenth preferred embodiment of the present invention. As illustrated in FIG. 89, an oxide film 212 for a complete isolation region is formed in the SOI layer 3 overlying the buried oxide film 2 on the silicon substrate 1.

From a viewpoint similar to that of the first form, the cross-sectional shape of the oxide film 212 includes the shapes FA, FB, FC similar to those of the first form. Additionally, a stepped part shape FD defined between a complete insulation part at a bottom and a partial isolation part has a steeper curvature than that of the shape FC to reduce the isolation width.

Seventeenth Preferred Embodiment

<First Form>

Figure 90:
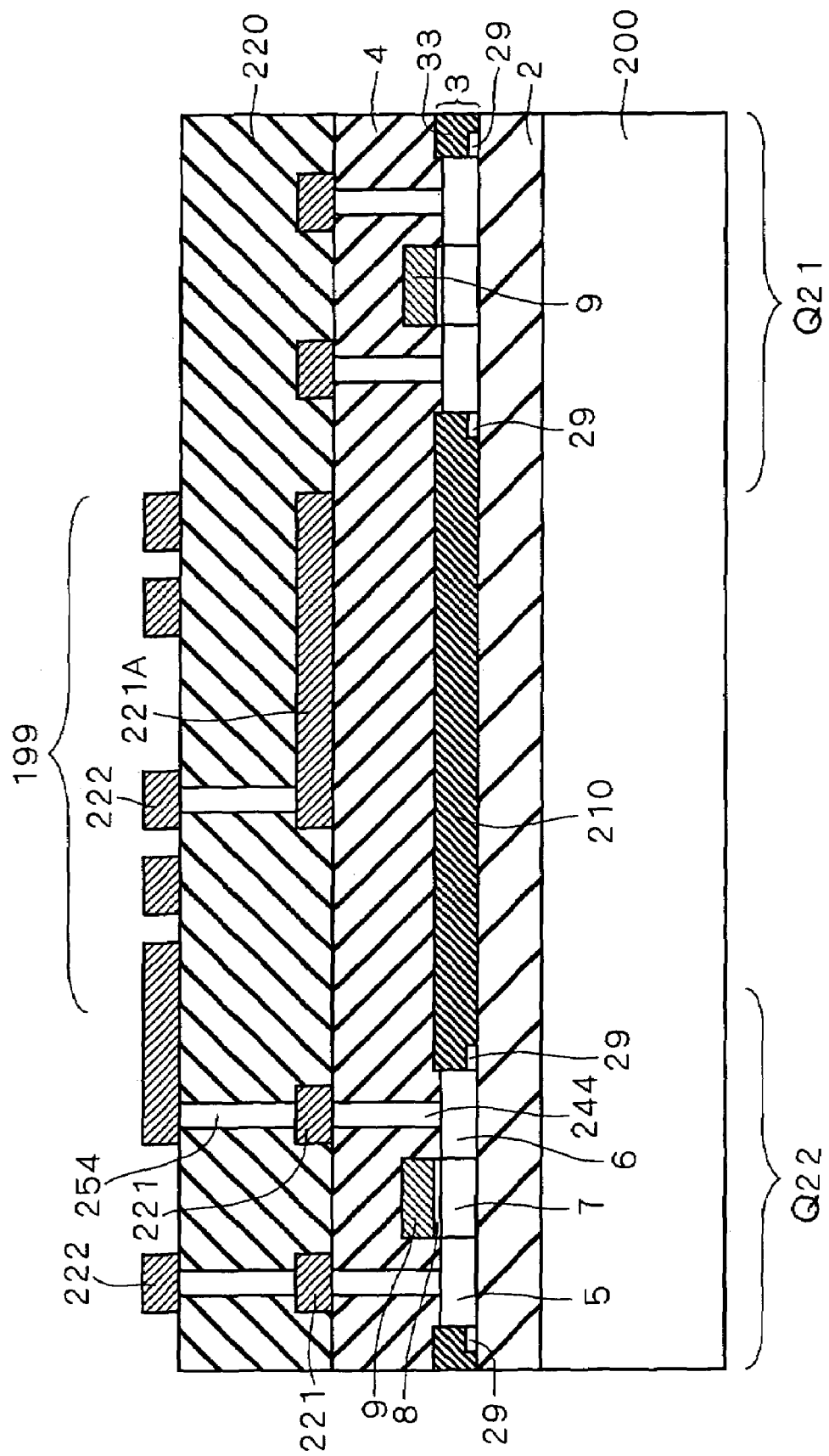
FIG. 90 is a cross-sectional view of a first form of a seventeenth preferred embodiment according to the present invention.
Figure 91:
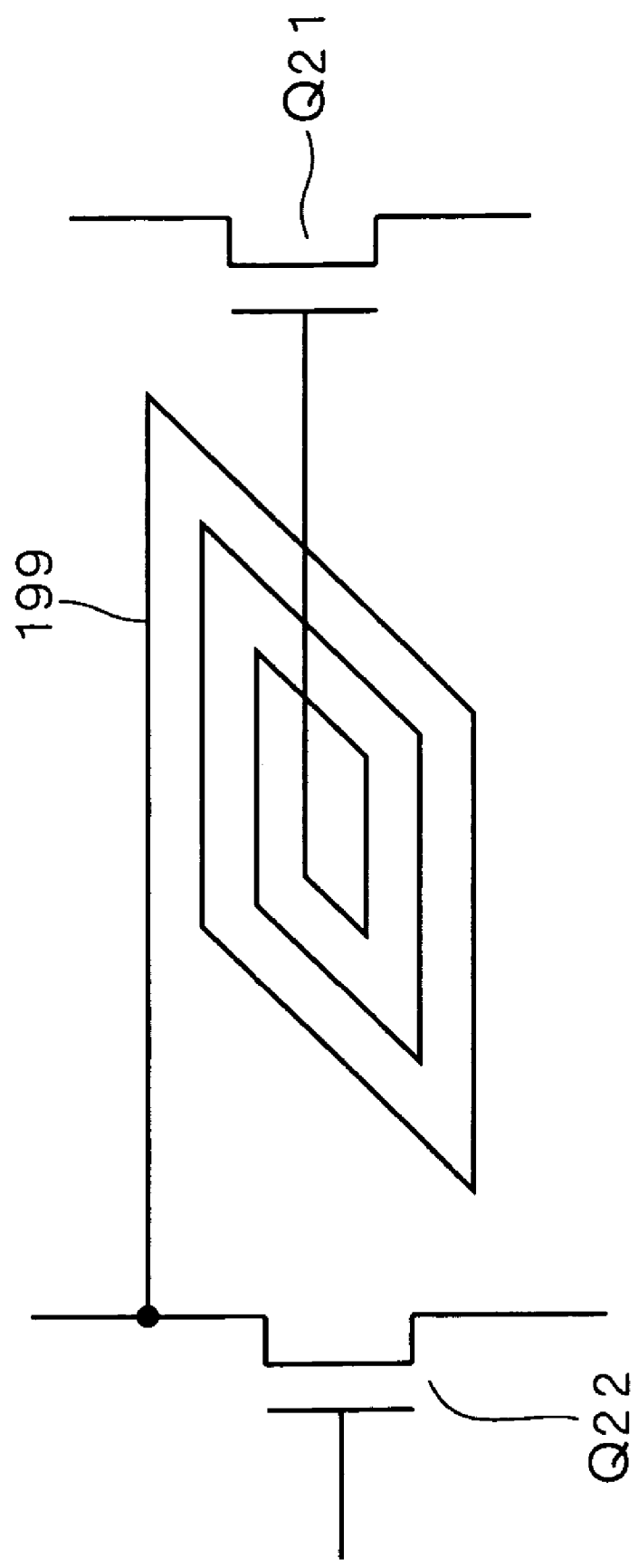
FIG. 91 is a circuit diagram showing a circuit configuration of the seventeenth preferred embodiment.

FIG. 90 is a cross-sectional view of a first form of the semiconductor device having the SOI structure according to a seventeenth preferred embodiment of the present invention. The first form of the seventeenth preferred embodiment provides a circuit shown in FIG. 91. Referring to FIG. 91, a circuit configuration of the first form includes a spiral inductor 199 connected between a gate electrode of a transistor Q21 for an analog circuit and a first electrode of a transistor Q22 for an analog circuit.

With reference to FIG. 90, the buried oxide film 2 is formed on a high-resistance silicon substrate 200, and the transistors Q21 and Q22 are manufactured into the SOI layer 3 overlying the buried oxide film 2.

Each of the transistors Q21 and Q22 includes the drain region 5, the source region 6, the channel formation region 7, the gate oxide film 8 and the gate electrode 9. An oxide film 210 having a relatively large area provides complete isolation between the transistors Q21 and Q22. The oxide film 33 having a relatively small area provides complete isolation between each of the transistors Q21, Q22 and its surrounding region. The well regions 29 are formed in lower parts of the oxide films 210 and 33.

The interlayer insulation film 4 is formed on the entire surface of the SOI layer 3 including the transistors Q21 and Q22. A first interconnect layer 221 is selectively formed on the interlayer insulation film 4. Parts of the first interconnect layer 221 are electrically connected to the drain regions 5 and the source regions 6 of the transistors Q21 and Q22 through contact holes 244.

An interlayer insulation film 220 is formed on the entire surface of the interlayer insulation film 4 including the first interconnect layer 221. A second interconnect line 222 is selectively formed on the interlayer insulation film 220. Part of the second interconnect line 222 forms the spiral inductor 199. Parts of the second interconnect line 222 are electrically connected to associated parts of the first interconnect layer 221 (221A) through contact holes 254, respectively. The gate electrode 9 of the transistor Q21 is connected to the first interconnect layer part 221A through a contact hole formed through the interlayer insulation film 4 although not shown in FIG. 90.

Such a construction of the first form has a complete insulation region including the oxide film 210 and the well regions 29 under the spiral inductor 199 to reduce a parasitic capacitance associated with the spiral inductor 199. Specifically, if an isolation region under the spiral inductor 199 is a partial isolation region including an oxide film and a well region, a parasitic capacitance is generated between the well region and the spiral inductor 199 to decrease a performance index Q (an energy loss to store ratio), resulting in energy losses, in which case desired inductance performance is not achieved. The construction of the first form eliminates such undesirable conditions.

The use of the high-resistance silicon substrate 200 as an underlying substrate of the SOI substrate in the first form reduces power losses due to eddy current and capacitance, reduces the parasitic capacitance, and increases the performance index Q.

Since analog circuits are required to be kept free from extraneous noises, the oxide film 210 or the oxide film 33 completely isolate the transistors Q21 and Q22 for analog circuits from their surrounding regions to electrically cut off the transistors Q21 and Q22 from the exterior, thereby increasing performance.

Although not shown in FIG. 90, if a partial isolation region is formed under a pad, a large parasitic capacitance is prone to be generated as in the case of the spiral inductor to result in power losses. It is therefore desirable that a complete isolation region is provided under the pad as well as under the spiral inductor 199.

<Second Form>

Figure 92:
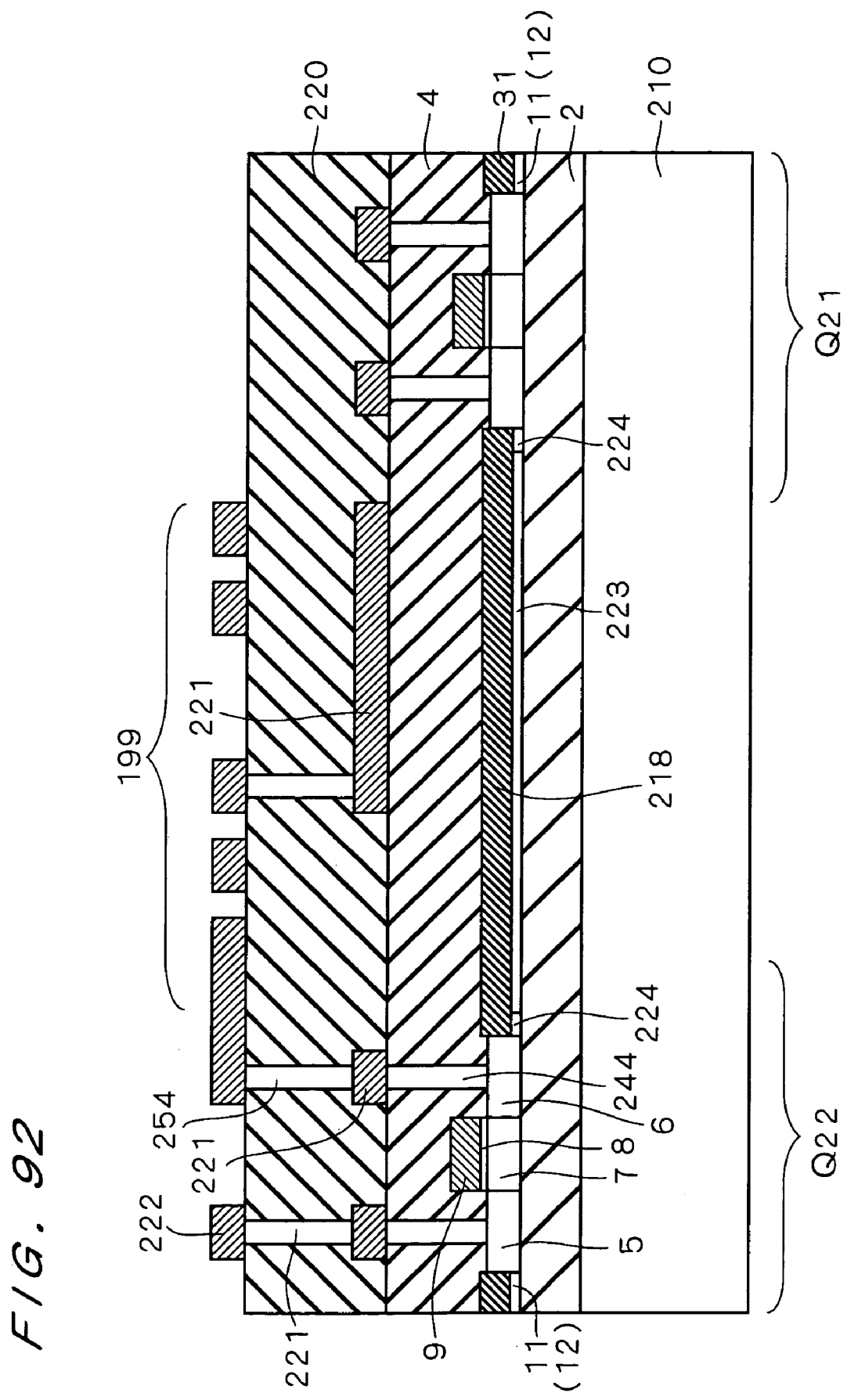
FIG. 92 is a cross-sectional view of a second form of the seventeenth preferred embodiment.

FIG. 92 is a cross-sectional view of a second form of the semiconductor device having the SOI structure according to the seventeenth preferred embodiment of the present invention. The second form of the seventeenth preferred embodiment, similar to the first form, provides the circuit shown in FIG. 91.

As illustrated in FIG. 92, an oxide film 218 having a relatively large area, and a high-resistance region 223 and well regions 224 which are formed beneath the oxide film 218 provide partial isolation between the transistors Q21 and Q22. The oxide film 31 having a relatively small area and the well region 11 (12) formed beneath the oxide film 31 provide partial isolation between each of the transistors Q21, Q22 and its surrounding region.

The high-resistance region 223 occupies most of the area beneath the oxide film 218, and the well regions 224 occupy a small peripheral area. The remaining structure of the second form is similar to that of the first form shown in FIG. 90.

In the second form of the seventeenth preferred embodiment, while the partial isolation is provided, the oxide film 218 and the high-resistance region 223 occupy almost all part of the partial isolation region under the spiral inductor 199. This sufficiently suppresses the parasitic capacitance associated with the spiral inductor 199.

The high-resistance region 223 may be manufactured in such a manner that no impurities are introduced into the high-resistance region 223. Alternatively, the method of manufacturing the high-resistance region 223 may comprises the steps of implanting silicon ions at a dose as high as about $1 \times 10^{20}/cm^2$, for example, to render a lower region of the oxide film amorphous, and then heating the lower region to form a polysilicon layer serving as the high-resistance region 223.

Eighteenth Preferred Embodiment

Figure 93:
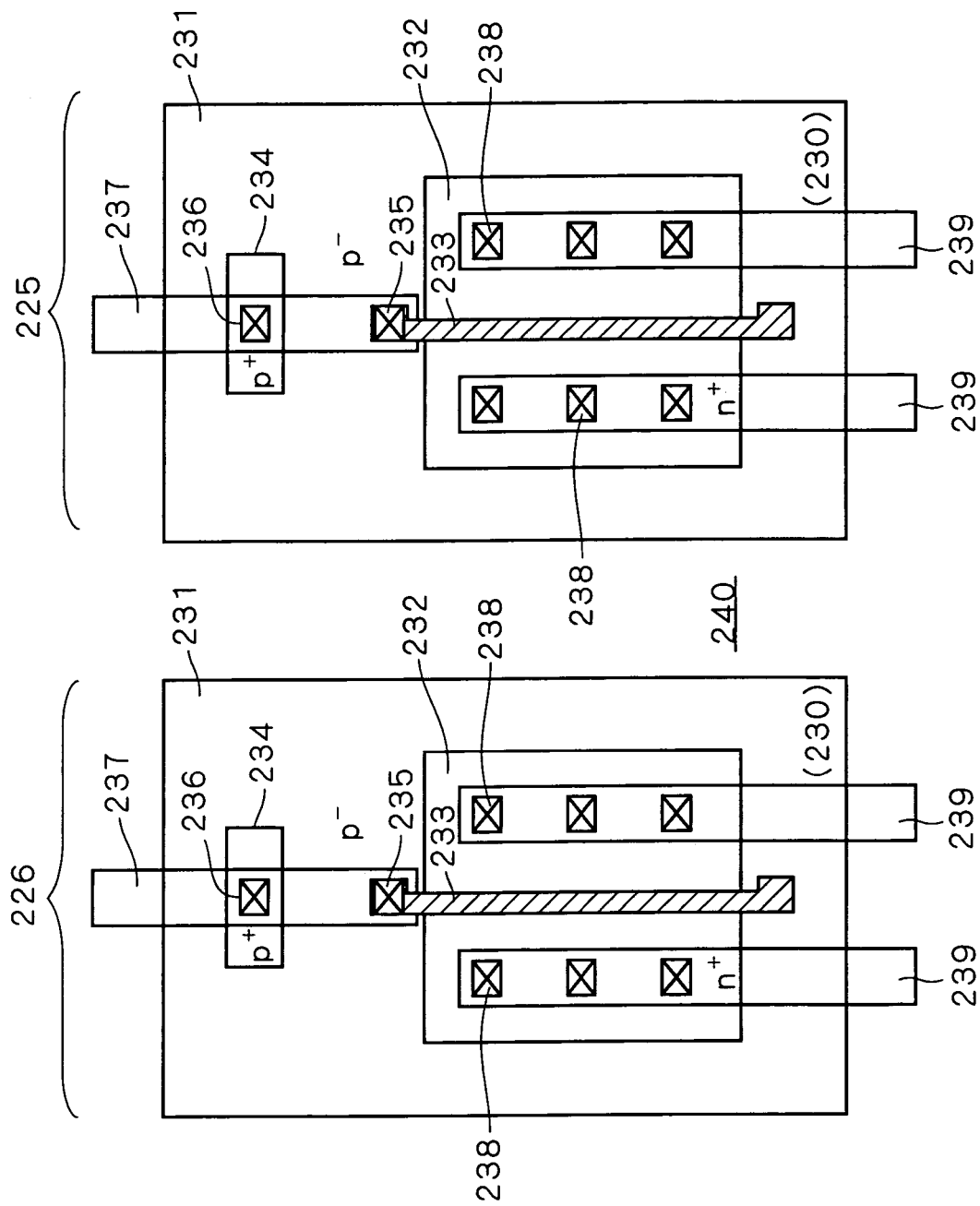
FIG. 93 is a plan view of a DT-MOS transistor of an eighteenth preferred embodiment according to the present invention.

FIG. 93 is a plan view of the semiconductor device having the SOI structure according to an eighteenth preferred embodiment of the present invention. As shown in FIG. 93, a complete isolation region 240 provides complete isolation between DT-MOS transistor regions 225 and 226. A DT-MOS transistor is a MOS transistor having a gate electrode and a body region (channel formation region) which are at the same potential.

Each of the DT-MOS transistor regions 225 and 226 includes an $n^+$ NMOS active region 232 and a $p^+$ body region 234 which are formed in a p well region 231 (a partial isolation region 230). The NMOS active region 232 is connected to interconnect layers 239 through contacts 238. A gate electrode 233 formed in a mid portion of the NMOS active region 232 is electrically connected to an interconnect layer 237 through a contact 235 (gate contact). The body region 234 is electrically connected to the interconnect layer 237 through a contact 236 (body contact).

The interconnect layer 237 is used to set the gate electrode 233 and the body region 234 at the same potential to decrease an on-state threshold voltage, increasing the operating speed of the semiconductor device.

Thus, according to the eighteenth preferred embodiment, the electric potential of the channel formation region is fixed through the body region 234 and the well region 231, and the complete isolation region 240 provides complete isolation between the DT-MOS transistor regions 225 and 226. Therefore, a high-performance DT-MOS transistor is formed relatively easily. The body contact and the gate contact may be replaced with a shared contact which is commonly connected to the gate electrode 233 and the body region 234.

Nineteenth Preferred Embodiment

Figure 94:
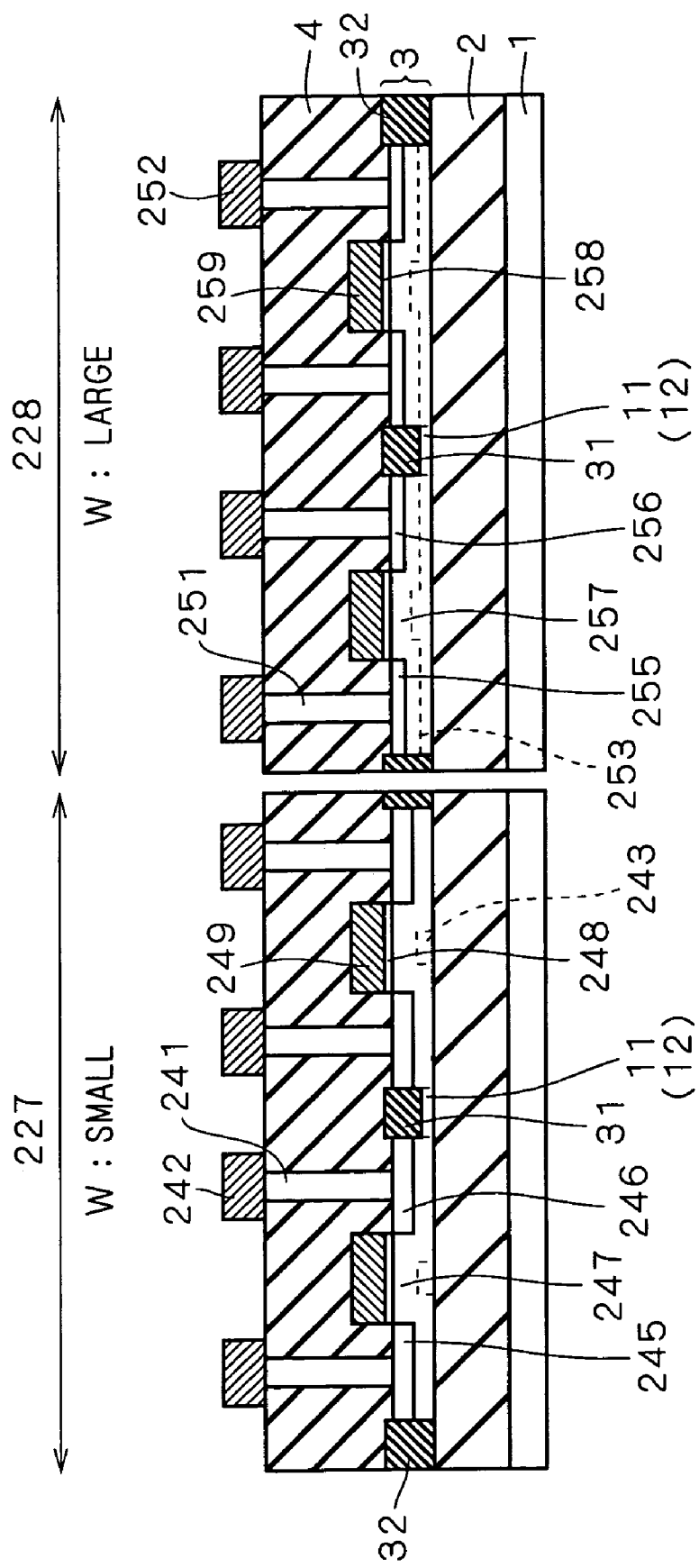
FIG. 94 is a cross-sectional view of a nineteenth preferred embodiment according to the present invention.

FIG. 94 is a cross-sectional view of the semiconductor device having the SOI structure according to a nineteenth preferred embodiment of the present invention.

As shown in FIG. 94, in a transistor formation region 227 in which a transistor having a relatively small gate width W is to be formed, MOS transistors are formed each comprising a drain region 245, a source region 246, a channel formation region 247, a gate oxide film 248 and a gate electrode 249. The partial oxide film 31 and the well region 11 (12) provide partial isolation between the MOS transistors. The full oxide film 32 completely isolates the MOS transistors from their surrounding regions.

The interlayer insulation film 4 is formed on the entire surface of the SOI layer 3 including the MOS transistors in the transistor formation region 227. An interconnect layer 242 is selectively formed on the interlayer insulation film 4. The interconnect layer 242 is electrically connected to the drain and source regions 245 and 246 through contact holes 241.

In a transistor formation region 228 in which a transistor having a relatively large gate width W is to be formed, MOS transistors are formed each comprising a drain region 255, a source region 256, a channel formation region 257, a gate oxide film 258 and a gate electrode 259. The partial oxide film 31 and the well region 11 (12) provide partial isolation between the MOS transistors. The full oxide film 32 completely isolates the MOS transistors from their surrounding regions.

The interlayer insulation film 4 is formed on the entire surface of the SOI layer 3 including the MOS transistors in the transistor formation region 228. An interconnect layer 252 is selectively formed on the interlayer insulation film 4. The interconnect layer 252 is electrically connected to the drain and source regions 255 and 256 through contact holes 251.

The depth of the drain and source regions 245 and 246 in the transistor formation region 227 having the relatively small gate width W is controlled so that at least part of a depletion layer 243 extending from the source/drain reaches the buried oxide film 2 in the built-in state, thereby reducing the junction capacitance. The depth of the drain and source regions 245 and 246 may be controlled to reach the buried oxide film 2.

On the other hand, the depth of the drain and source regions 255 and 256 in the transistor formation region 228 having the relatively large gate width W is controlled so that a depletion layer 253 extending from the source/drain does not reach the buried oxide film 2 in the built-in state, thereby ensuring the fixing of the electric potential of the channel formation region 257.

The two types of drain/source regions in the transistor formation regions 227 and 228 are manufactured by implanting impurities at different implant energies for source/drain formation or by implanting impurities at different doses for NUDC (non-uniformly doped channel) formation.

Alternatively, the process for manufacturing the two types of drain/source regions may comprise the steps of forming the source/drain regions having a depth which does not allow the depletion layer to reach the buried oxide film 2 in the built-in state, and thereafter additionally implanting impurities again so that only the source/drain regions in the transistor formation region 227 become deeper.

Twentieth Preferred Embodiment

<First Form>

Figure 95:
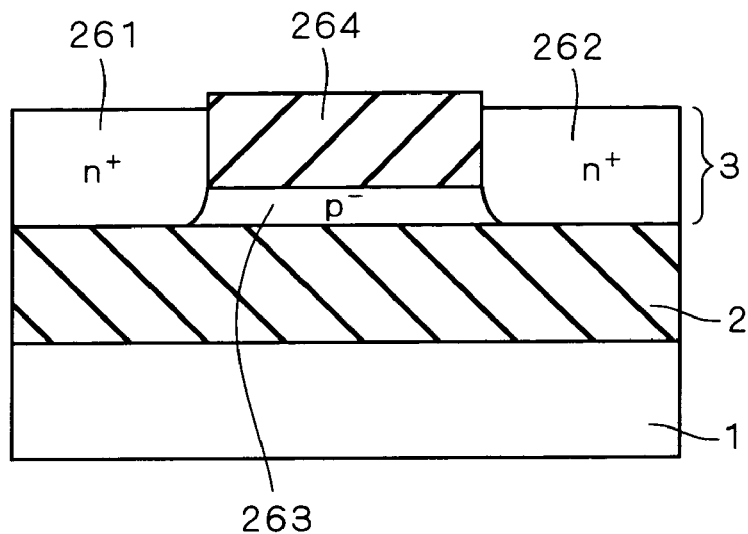
FIG. 95 is a cross-sectional view of a first form of a twentieth preferred embodiment according to the present invention.

FIG. 95 is a cross-sectional view of a first form of the semiconductor device having the SOI structure according to a twentieth preferred embodiment of the present invention. As shown in FIG. 95, $n^+$ regions 261 and 262 are selectively formed in the SOI layer 3 overlying the buried oxide film 2 on the silicon substrate 1. A partial isolation region including a $p^-$ region 263 and an oxide film 264 is provided between the $n^+$ regions 261 and 262. The $n^+$ regions 261, 262, the $p^-$ region 263 and the oxide film 264 constitute a field transistor. The field transistor has a structure such that a gate part (a gate oxide film and a gate electrode) of a MOS transistor is replaced with an oxide film.

In the first form of the twentieth preferred embodiment, the structure of the partial isolation region including the $p^-$ region 263 and the oxide film 264 is used to constitute the field transistor. The field transistor is applicable to a device for a protective circuit and the like.

The gate part of the field transistor according to the twentieth preferred embodiment is basically similar in construction to the partial isolation region. Therefore, the gate part and the partial isolation region may be constructed at the same time, whereby the field transistor is formed relatively easily.

Figure 96:
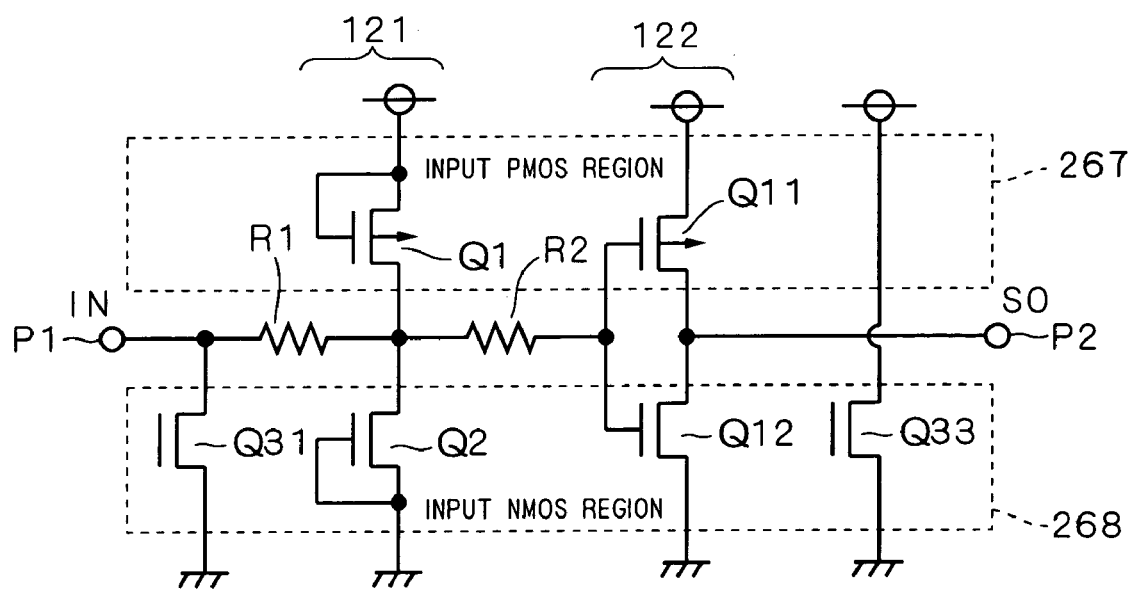
FIG. 96 is a circuit diagram of an input circuit to which field transistors are applied according to the twentieth preferred embodiment.

FIG. 96 is a circuit diagram of an input part of a circuit to which field transistors are applied. As illustrated in FIG. 96, a field transistor Q31 has a first electrode connected to the external input terminal P1 and a second electrode grounded. A field transistor Q33 is connected between a power supply and a ground. The remaining structure of FIG. 96 is similar to that shown in FIG. 66, and the description thereon will be omitted herein.

Thus, the field transistor Q31 serves as a protective circuit between the external input terminal P1 and the ground level, and the field transistor Q33 provides a parasitic diode path between the power supply and the ground level.

Figure 97:
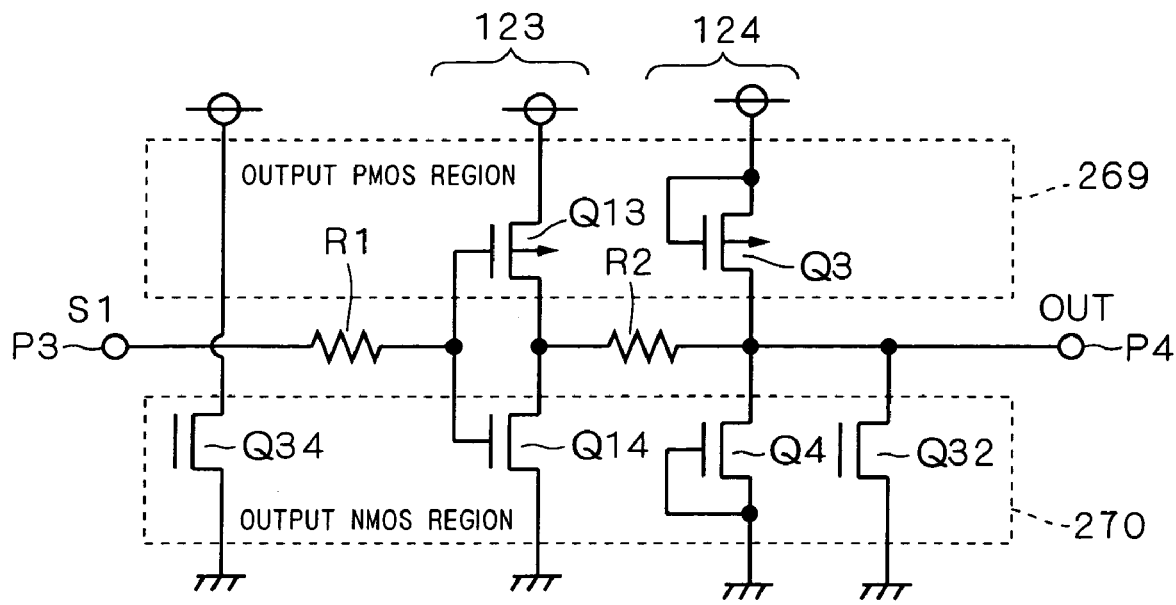
FIG. 97 is a circuit diagram of an output circuit to which the field transistors are applied according to the twentieth preferred embodiment.

FIG. 97 is a circuit diagram of an output part of a circuit to which field transistors are applied. As illustrated in FIG. 97, a field transistor Q32 has a first electrode connected to the external output terminal P4 and a second electrode grounded. A field transistor Q34 is connected between a power supply and a ground. The remaining structure of FIG. 97 is similar to that shown in FIG. 67, and the description thereon will be omitted herein.

Thus, the field transistor Q32 serves as a protective circuit between the external output terminal P4 and the ground level, and the field transistor Q34 provides a parasitic diode path between the power supply and the ground level.

The field transistors preferably have an NMOS-like structure as shown in FIG. 95 because of its high discharge capability, but a PMOS-like structure may be also used in which case a field transistor should be connected between a power supply and the external input terminal P1 in place of the field transistors Q31, Q32.

<Second Form>

Figure 98:
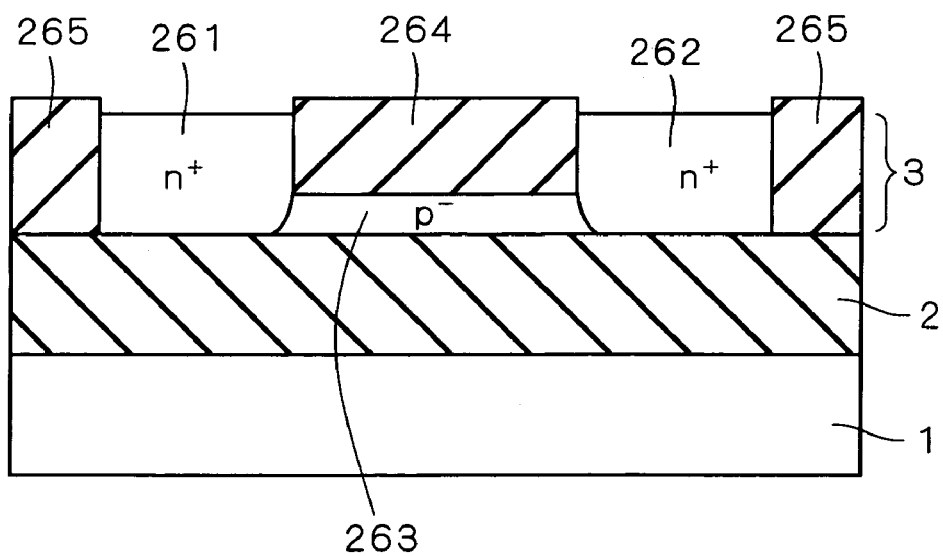
FIG. 98 is a cross-sectional view of a second form of the twentieth preferred embodiment.

FIG. 98 is a cross-sectional view of a second form of the semiconductor device having the SOI structure according to the twentieth preferred embodiment of the present invention. As shown in FIG. 98, a full oxide film 265 surrounds the $n^+$ regions 261 and 262 to completely isolate the $n^+$ regions 261 and 262 from their surrounding regions. The remaining structure of FIG. 98 is similar to that of the first form shown in FIG. 95, and the description thereon will be omitted herein.

The second form, in which the full oxide film 265 surrounds the entire field transistor, is expected to produce great effects in noise removal and the like. Further, when the field transistor is used as a protective circuit, the second form can reliably prevent a parasitic path of current to other constituents.

<Third Form>

Figure 99:
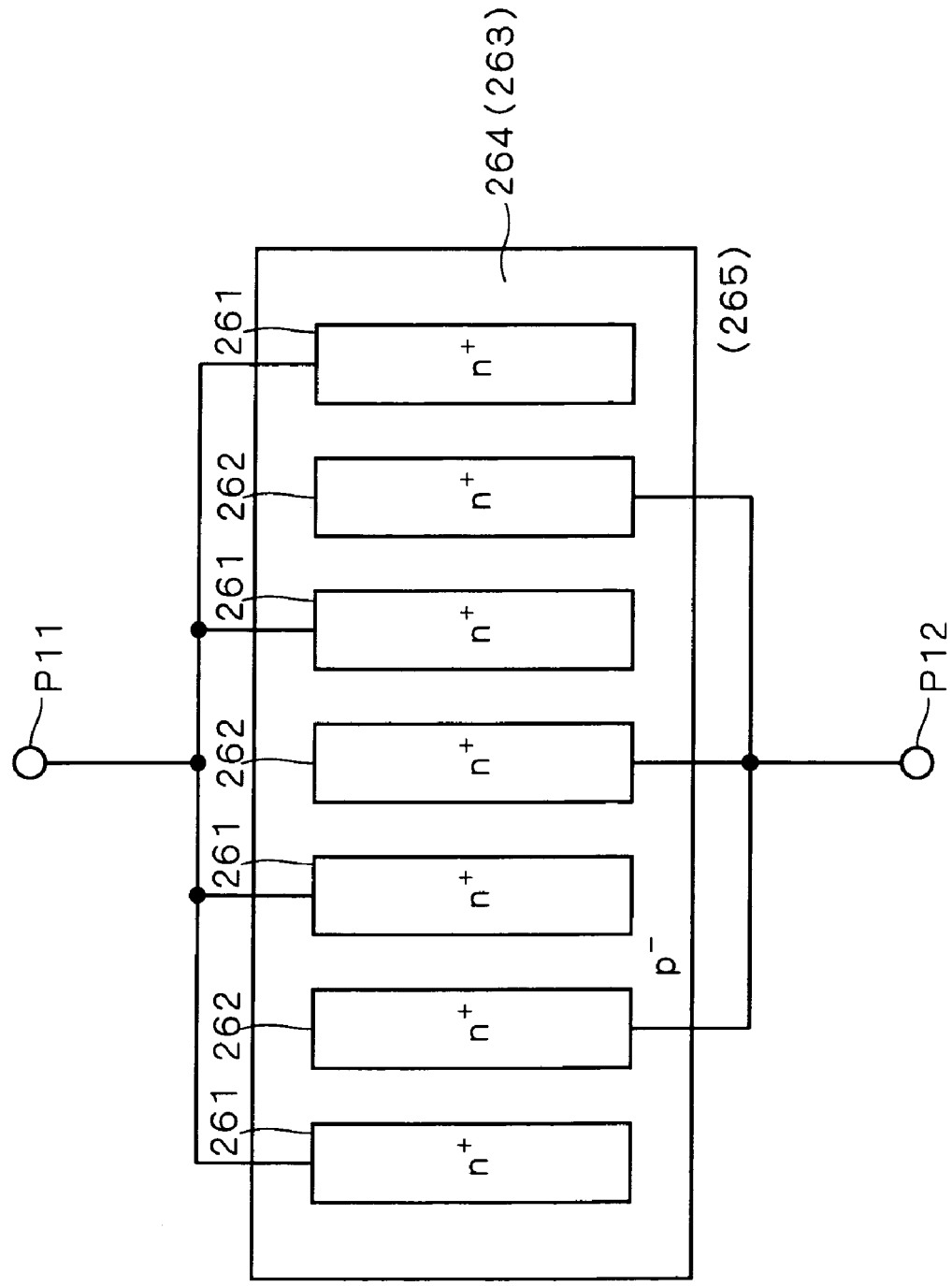
FIG. 99 is a plan view of a third form of the twentieth preferred embodiment.

FIG. 99 is a plan view of a third form of the semiconductor device having the SOI structure according to the twentieth preferred embodiment of the present invention. A plurality of $n^+$ regions 261 and 262 are arranged alternately. The oxide film 264 and the $p^-$ region 263 provide partial isolation between adjacent ones of the $n^+$ regions 261, 262, and the full oxide film 265 completely isolates the $n^+$ regions 261, 262 from their surrounding regions.

The plurality of $n^+$ regions 261 are commonly connected to a connecting terminal P11, and the plurality of $n^+$ regions 262 are commonly connected to a connecting terminal P12. Thus, the plurality of $n^+$ regions 261 and 262 arranged in a pectinate configuration are connected electrically in parallel to enhance the discharge capability thereof.

<Modification>

The depth of the source/drain regions ($n^+$ regions 261, 262) of the field transistor need not reach the buried oxide film 2 but may be controlled to allow the depletion layer to reach the buried oxide film 2.

<<Additional Modifications>>

The process for causing the source/drain regions to reach the buried oxide film may employ the conventional technique of implanting impurities sufficiently deep to form the source/drain regions or implanting impurities to provide a deep impurity concentration peak after implanting impurities to provide a shallow impurity concentration peak.

This process, however, fails to provide the impurity concentration peak at a shallow position in the source/drain regions and an impurity distribution deep enough to extend through the SOI layer 3 as in the first form of the fourteenth preferred embodiment shown in FIG. 85.

Figure 100:
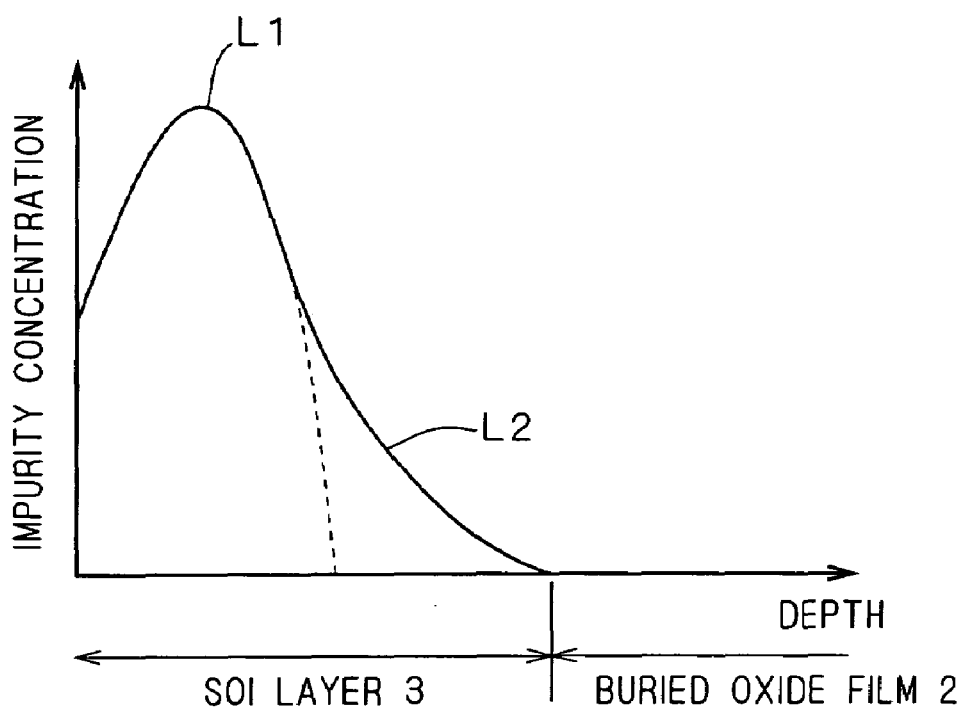
FIG. 100 illustrates an impurity distribution in a drain/source region.

Therefore, a method of implanting impurities at an angle close to zero degree and at a sufficiently low implant energy may be applied to provide an impurity concentration peak at a relatively shallow position in the SOI layer 3 as denoted by the reference character L1 of FIG. 100, whereas a tail profile resulting from channeling provides an impurity distribution as denoted by the reference character L2 of FIG. 100 in which the impurities extend through the SOI layer 3 to reach the buried oxide film 2.

While the invention has been described in detail, the foregoing description is in all aspects illustrative and not restrictive. It is understood that numerous other modifications and variations can be devised without departing from the scope of the invention.

What is claimed is:

1. A semiconductor device having an SOI structure including a semiconductor substrate, a buried insulation layer over said semiconductor substrate and an SOI layer over said buried insulation layer, comprising:

a PMOS transistor having a first gate electrode over a surface of said SOI layer, a p-type source region and a p-type drain region formed in said SOI layer at both sides of said first gate electrode, and an n-type channel forming region being between said p-type source region and said p-type drain region;

a first body region having p-type conductivity formed in said SOI layer;

a first connecting region having p-type conductivity being between said n-type channel forming region and said first body region;

a NMOS transistor having a second gate electrode over a surface of said SOI layer, an n-type source region and an n-type drain region formed in said SOI layer at both sides of said second gate electrode, and a p-type channel forming region being between said n-type source region and said n-type drain region;

a second body region having n-type conductivity formed in said SOI layer;

a second connecting region having n-type conductivity being between said p-type channel forming region and said second body region;

a first insulating film formed in said SOI layer and being between said PMOS transistor and said NMOS transistor;

a second insulating film formed in said SOI layer and being between said n-type channel forming region and said first body region, and said second insulating film formed over said first connecting region; and a third insulating film formed in said SOI layer and being between said p-type channel forming region and said second body region, and said third insulating film formed over said second connecting region, wherein said p-type source and p-type drain regions of said PMOS transistor and said n-type source and n-type drain regions of said NMOS transistor contact to said buried insulation layer, and said first insulating film contacts to said buried insulating layer.

2. A semiconductor device according to claim 1, wherein one of said p-type source region and said p-type drain region contacts to said first insulating film and one of said n-type source region and said n-type drain region contacts to said first insulating film.

3. A semiconductor device according to claim 1, wherein said first gate electrode extends over said second insulating film and said second gate electrode extends over said third insulating film.

4. A semiconductor device according to claim 3, wherein said first body region has a first impurity concentration which is higher than that of said first connection region, and said second body region has a second impurity concentration which is higher than that of said second connecting region.

5. A semiconductor device having an SOI structure including a substrate, an insulation layer over said substrate and a silicon layer over said insulation layer, comprising:

a first well region having n-type conductivity and a second well region having p-type conductivity both formed in said silicon layer;

a first insulating film formed in said silicon layer between said first well region and said second well region, and said first insulating film contacts to said first well region, said second well region and said insulation layer;

PMOS transistors each having a first gate electrode over a surface of said silicon layer, a p-type source region and a p-type drain region formed in said silicon layer at both sides of said first gate electrode, and an n-type channel forming region being between said p-type source region and said p-type drain region;

a second insulating film formed in said silicon layer and being between said PMOS transistors;

NMOS transistors each having a second gate electrode over a surface of said silicon layer, an n-type source region and an n-type drain region formed in said silicon layer at both sides of said second gate electrode, and a p-type channel forming region being between said n-type source region and said n-type drain region; and a third insulating film formed in said silicon layer and being between said NMOS transistors, wherein said p-type source and p-type drain regions of said PMOS transistors and said n-type source and n-type drain regions of said NMOS transistors contact to said insulation layer, and a part of said first well region is between said second insulating film and said insulation layer and a part of said second well region is between said third insulating film and said insulation layer.

6. A semiconductor device having an SOI structure including a substrate, an insulation layer over said substrate and a silicon layer over said insulation layer, comprising:

a first well region having n-type conductivity and a second well region having p-type conductivity both formed in said silicon layer;

a first insulating film formed in said silicon layer between said first well region end said second well region, and said first insulating film contacts to said first well region, said second well region and said insulation layer;

PMOS transistors formed in said first well region and each having a first gate electrode over a surface of said silicon layer, a p-type source region and a p-type drain region formed in said first well region at both sides of said first gate electrode, and an n-type channel forming region being between said p-type source region and said p-type drain region;

a second insulating film formed in said first well region and being between said PMOS transistors;

a first body region having n-type conductivity formed in said first well region;

a first connecting region having n-type conductivity being between said n-type channel forming region and said first body region;

a third insulating film formed in said first well region and being between said n-type channel forming region and said first body region, and said third insulating film formed over said first connecting region;

NMOS transistors formed in said second well region and each having a second gate electrode over a surface of said silicon layer, an n-type source region and an n-type drain region formed in said silicon layer at both sides of said second gate electrode, and a p-type channel forming region being between said n-type source region and said n-type drain region;

a fourth insulating film formed in said second well region and being between said NMOS translators;

a second body region having p-type conductivity formed in said second well region;

a second connecting region having p-type conductivity being between said p-type channel forming region and said second body region;

a fifth insulating film formed in said second well region and being between said p-type channel forming region and said second body region, and said fifth insulating film formed over said second connecting region;

wherein said p-type source and p-type drain regions of said PMOS transistors and said n-type source and n-type drain regions of said NMOS transistors contact to said insulation layer.

7. A semiconductor device according to claim 6, wherein said first gate electrode extends over said third insulating film and said second gate electrode extends over said fifth insulating film.

8. A semiconductor device according to claim 7, wherein said first body region has a first impurity concentration which is higher than that of said first connection region, and said second body region has a second impurity concentration which is higher than that of said second connecting region.

* * * * *